(12) United States Patent
Hatakeyama et al.

(10) Patent No.: US 8,105,764 B2
(45) Date of Patent: *Jan. 31, 2012

(54) PATTERNING PROCESS

(75) Inventors: Jun Hatakeyama, Joetsu (JP); Takao Yoshihara, Joetsu (JP); Toshinobu Ishihara, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 694 days.

This patent is subject to a terminal disclaimer.

(21) Appl. No.: 12/236,129

(22) Filed: Sep. 23, 2008

(65) Prior Publication Data

US 2009/0081595 A1 Mar. 26, 2009

(30) Foreign Application Priority Data

Sep. 25, 2007 (JP) ................................. 2007-247114
Feb. 7, 2008 (JP) ................................. 2008-27132

(51) Int. Cl.
G03F 7/00 (2006.01)
G03F 7/004 (2006.01)
G03F 7/40 (2006.01)

(52) U.S. Cl. .............. 430/323; 430/270.1; 430/271.1; 430/273.1; 430/325; 430/326; 430/328; 430/330; 430/331; 430/394

(58) Field of Classification Search ............... 430/323, 430/324, 325, 326, 270.1, 271.1, 273.1, 328, 430/330, 331, 394
See application file for complete search history.

(56) References Cited

U.S. PATENT DOCUMENTS

| 4,775,609 A | 10/1988 | McFarland |
| 4,889,789 A * | 12/1989 | Stahlhofen ................ 430/191 |
| 5,399,456 A | 3/1995 | Spak et al. |
| 5,620,918 A * | 4/1997 | Kondoh .................... 438/396 |
| 6,448,420 B1 | 9/2002 | Kinsho et al. |
| 7,358,025 B2 | 4/2008 | Hatakeyama |
| 2004/0265745 A1 | 12/2004 | Sho et al. |
| 2006/0246377 A1 | 11/2006 | Yamato et al. |
| 2007/0122740 A1 | 5/2007 | Hatakeyama et al. |
| 2009/0286188 A1* | 11/2009 | Hatakeyama et al. ........ 430/323 |

FOREIGN PATENT DOCUMENTS

| EP | 0 036907 A1 | 10/1981 |
| JP | 64-7525 A | 1/1989 |
| JP | 1-92741 A | 4/1989 |

(Continued)

OTHER PUBLICATIONS

B. J. Lin; "Semiconductor Foundry, Lithography, and Partners"; Micropatterning Division, TSMC, Inc., Proc. SPIE, vol. 4690—xxix, 2002.

(Continued)

*Primary Examiner* — Shean Wu
(74) *Attorney, Agent, or Firm* — Westerman, Hattori, Daniels & Adrian, LLP

(57) ABSTRACT

A pattern is formed through positive/negative reversal by coating a chemically amplified positive resist composition comprising an acid labile group-bearing resin, a photoacid generator, and an organic solvent onto a substrate, prebaking the resist composition, exposing the resist film to high-energy radiation, post-exposure heating, and developing the exposed resist film with an alkaline developer to form a positive pattern; irradiating or heating the positive pattern to facilitate elimination of acid labile groups and crosslinking for improving alkali solubility and imparting solvent resistance; coating a reversal film-forming composition thereon to form a reversal film; and applying an alkaline wet etchant thereto for dissolving away the positive pattern.

22 Claims, 6 Drawing Sheets

FOREIGN PATENT DOCUMENTS

| | | |
|---|---|---|
| JP | 1-191423 A | 8/1989 |
| JP | 2-154266 A | 6/1990 |
| JP | 6-27654 A | 2/1994 |
| JP | 2000-327633 A | 11/2000 |
| JP | 2001-92154 A | 4/2001 |
| JP | 2005-43420 A | 2/2005 |
| JP | 2006-259249 A | 9/2006 |
| JP | 2006-259482 A | 9/2006 |
| JP | 2006-285095 A | 10/2006 |
| JP | 2006-293298 A | 10/2006 |
| JP | 2007-171895 A | 7/2007 |
| JP | 2007-199653 A | 8/2007 |
| WO | 2004 074242 A2 | 9/2004 |

OTHER PUBLICATIONS

S. Owa et al.; "Immersion lithography; its potential performance and issues", Proc. SPIE, vol. 5040, p. 724, 2003.

M. Maenhoudt et al.; "Double Patterning scheme for sub-0.25 k1 single damascene structures at NA=0.75, λ=193 nm"; Proc. SPIE, vol. 5754, pp. 1508-1518, 2005.

M. Shibuya et al.; "Performance of Resolution Enhancement Technique Using Both Multiple Exposure and Nonlinear Resist", Jpn. J. Appl. Phys. vol. 33, Part 1, No. 12B, pp. 6874-6877, Dec. 1994.

H. Nakamura et al.; "Contact Hole Formation by Multiple Exposure Technique in Ultra-low k1 Lithography"; Proc. SPIE, vol. 5377, pp. 255-263, 2004.

* cited by examiner

COATING OF POSITIVE RESIST MATERIAL

EXPOSURE AND DEVELOPMENT OF RESIST FILM

DEPROTECTION AND CROSSLINKING OF PATTERN

COATING OF PATTERN REVERSAL FILM

PATTERN REVERSAL BY DEVELOPMENT

ETCHING OF PROCESSABLE SUBSTRATE

Y LINE MASK

X LINE MASK

EXPOSURE REGION EXPOSED THROUGH
OVERLAPPED Y AND X LINE MASKS

FORMATION OF PHOTORESIST FILM

EXPOSURE AND DEVELOPMENT OF PHOTORESIST FILM

ETCHING OF PROCESSABLE SUBSTRATE

FORMATION OF PHOTORESIST FILM

EXPOSURE AND HEATING OF PHOTORESIST FILM

FLOOD EXPOSURE

PATTERN REVERSAL BY DEVELOPMENT

ETCHING OF PROCESSABLE SUBSTRATE

FORMATION OF PHOTORESIST FILM

EXPOSURE AND DEVELOPMENT OF PHOTORESIST FILM

CROSSLINKING OF PHOTORESIST FILM

COATING OF SOG FILM

LIGHT ETCHING WITH CMP OR CF GAS

PATTERN REVERSAL BY OXYGEN/HYDROGEN GAS ETCHING

ETCHING OF PROCESSABLE SUBSTRATE

PATTERNING PROCESS

CROSS-REFERENCE TO RELATED APPLICATION

This non-provisional application claims priority under 35 U.S.C. §119(a) on Patent Application Nos. 2007-247114 and 2008-027132 filed in Japan on Sep. 25, 2007 and Feb. 7, 2008, respectively, the entire contents of which are hereby incorporated by reference.

TECHNICAL FIELD

This invention relates to a process for forming a pattern by way of positive/negative reversal involving the steps of forming a positive pattern through exposure and development, acid-generating and heating treatment for converting the positive pattern to be alkali soluble, coating thereon a reversal film which is slightly alkali soluble, and effecting alkaline development to dissolve away a surface portion of the reversal film and the positive pattern to form a negative pattern.

BACKGROUND ART

In the recent drive for higher integration and operating speeds in LSI devices, the pattern rule is made drastically finer. The photolithography which is currently on widespread use in the art is approaching the essential limit of resolution determined by the wavelength of a light source. As the light source used in the lithography for resist pattern formation, g-line (436 nm) or i-line (365 nm) from a mercury lamp was widely used in 1980's. Reducing the wavelength of exposure light was believed effective as the means for further reducing the feature size. For the mass production process of 64 MB dynamic random access memories (DRAM, processing feature size 0.25 µm or less) in 1990's and later ones, the exposure light source of i-line (365 nm) was replaced by a KrF excimer laser having a shorter wavelength of 248 nm. However, for the fabrication of DRAM with a degree of integration of 256 MB and 1 GB or more requiring a finer patterning technology (processing feature size 0.2 µm or less), a shorter wavelength light source was required. Over a decade, photolithography using ArF excimer laser light (193 nm) has been under active investigation. It was expected at the initial that the ArF lithography would be applied to the fabrication of 180-nm node devices. However, the KrF excimer lithography survived to the mass-scale fabrication of 130-nm node devices. So, the full application of ArF lithography started from the 90-nm node. The ArF lithography combined with a lens having an increased numerical aperture (NA) of 0.9 is considered to comply with 65-nm node devices. For the next 45-nm node devices which required an advancement to reduce the wavelength of exposure light, the $F_2$ lithography of 157 nm wavelength became a candidate. However, for the reasons that the projection lens uses a large amount of expensive $CaF_2$ single crystal, the scanner thus becomes expensive, hard pellicles are introduced due to the extremely low durability of soft pellicles, the optical system must be accordingly altered, and the etch resistance of resist is low; the postponement of $F_2$ lithography and the early introduction of ArF immersion lithography were advocated (see Proc. SPIE Vol. 4690 xxix).

In the ArF immersion lithography, the space between the projection lens and the wafer is filled with water. Since water has a refractive index of 1.44 at 193 nm, pattern formation is possible even using a lens having a numerical aperture (NA) of 1.0 or greater. Theoretically, it is possible to increase the NA to nearly 1.44. It was initially recognized that the resolution could be degraded and the focus be shifted by a variation of water's refractive index with a temperature change. The problem of refractive index variation could be solved by controlling the water temperature within a tolerance of 1/100° C. while it was recognized that the impact of heat from the resist film upon light exposure drew little concern. There was a likelihood that micro-bubbles in water could be transferred to the pattern. It was found that the risk of bubble generation is obviated by thorough deaeration of water and the risk of bubble generation from the resist film upon light exposure is substantially nil. At the initial phase in 1980's of the immersion lithography, a method of immersing an overall stage in water was proposed. Later proposed was a partial-fill method of using a water feed/drain nozzle for introducing water only between the projection lens and the wafer so as to comply with the operation of a high-speed scanner. In principle, the immersion technique using water enabled lens design to a NA of 1 or greater. In optical systems based on traditional refractive index materials, this leads to giant lenses, which would deform by their own weight. For the design of more compact lenses, a catadioptric system was proposed, accelerating the lens design to a NA of 1.0 or greater. A combination of a lens having NA of 1.2 or greater with strong resolution enhancement technology suggests a way to the 45-nm node (see Proc. SPIE, Vol. 5040, p 724). Efforts have also been made to develop lenses of NA 1.35.

One candidate for the 32-nm node lithography is lithography using extreme ultraviolet (EUV) radiation with wavelength 13.5 nm. The EUV lithography has many accumulative problems to be overcome, including increased laser output, increased sensitivity, increased resolution and minimized line-edge roughness (LWR) of resist coating, defect-free MoSi laminate mask, reduced aberration of reflection mirror, and the like.

The water immersion lithography using a NA 1.35 lens achieves an ultimate resolution of 40 to 38 nm at the maximum NA, but cannot reach 32 nm. Efforts have been made to develop higher refractive index materials in order to further increase NA. It is the minimum refractive index among projection lens, liquid, and resist film that determines the NA limit of lenses. In the case of water immersion, the refractive index of water is the lowest in comparison with the projection lens (refractive index 1.5 for synthetic quartz) and the resist film (refractive index 1.7 for prior art methacrylate-based film). Thus the NA of projection lens is determined by the refractive index of water. Recent efforts succeeded in developing a highly transparent liquid having a refractive index of 1.65. In this situation, the refractive index of projection lens made of synthetic quartz is the lowest, suggesting a need to develop a projection lens material with a higher refractive index. LuAG (lutetium aluminum garnet $Lu_3Al_5O_{12}$) having a refractive index of at least 2 is the most promising material, but has the problems of birefringence and noticeable absorption. Even if a projection lens material with a refractive index of 1.8 or greater is developed, the liquid with a refractive index of 1.65 limits the NA to 1.55 at most, failing in resolution of 32 nm despite successful resolution of 35 nm. For resolution of 32 nm, a liquid with a refractive index of 1.8 or greater and resist and protective films with a refractive index of 1.8 or greater are necessary. Among the materials with a refractive index of 1.8 or greater, the high refractive index liquid seems least available. Such a liquid material has not been discovered because a tradeoff between absorption and refractive index is recognized in the art. In the case of alkane compounds, bridged cyclic compounds are preferred to linear ones in order to increase the refractive index, but the cyclic compounds undesirably have too high a viscosity to follow high-speed scanning on the exposure tool stage. If a liquid with a refractive index of 1.8 is developed, then the component having the lowest refractive index is the resist film, suggesting a need to increase the refractive index of a resist film to 1.8 or higher.

The process that now draws attention under the above-discussed circumstances is a double patterning process involving a first set of exposure and development to form a first pattern and a second set of exposure and development to form a pattern between the first pattern portions. See Proc. SPIE, Vol. 5754, p 1508 (2005). A number of double patterning processes are proposed. One exemplary process involves a first set of exposure and development to form a photoresist pattern having lines and spaces at intervals of 1:3, processing the underlying layer of hard mask by dry etching, applying another layer of hard mask thereon, a second set of exposure and development of a photoresist film to form a line pattern in the spaces of the first exposure, and processing the hard mask by dry etching, thereby forming a line-and-space pattern at a half pitch of the first pattern. An alternative process involves a first set of exposure and development to form a photoresist pattern having spaces and lines at intervals of 1:3, processing the underlying layer of hard mask by dry etching, applying a photoresist layer thereon, a second set of exposure and development to form a second space pattern on the remaining hard mask portion, and processing the hard mask by dry etching. In either process, the hard mask is processed by two dry etchings.

While the former process requires two applications of hard mask, the latter process uses only one layer of hard mask, but requires to form a trench pattern which is difficult to resolve as compared with the line pattern. The latter process includes the use of a negative resist material in forming the trench pattern. This allows for use of high contrast light as in the formation of lines as a positive pattern. However, since the negative resist material has a lower dissolution contrast than the positive resist material, a comparison of the formation of lines from the positive resist material with the formation of a trench pattern of the same size from the negative resist material reveals that the resolution achieved with the negative resist material is lower. After a wide trench pattern is formed from the positive resist material by the latter process, there may be applied a thermal flow method of heating the substrate for shrinkage of the trench pattern, or a RELACS method of coating a water-soluble film on the trench pattern as developed and heating to induce crosslinking at the resist film surface for achieving shrinkage of the trench pattern. These have the drawbacks that the proximity bias is degraded and the process is further complicated, leading to reduced throughputs.

Both the former and latter processes require two etchings for substrate processing, leaving the issues of a reduced throughput and deformation and misregistration of the pattern by two etchings.

One method that proceeds with a single etching is by using a negative resist material in a first exposure and a positive resist material in a second exposure. Another method is by using a positive resist material in a first exposure and a negative resist material in a higher alcohol of 3 or more carbon atoms, in which the positive resist material is not dissolvable, in a second exposure. However, these methods using negative resist materials with low resolution entail degradation of resolution.

A method which does not involve post-exposure bake (PEB) and development between first and second exposures is the simplest method with high throughputs. This method involves first exposure, replacement by a mask having a shifted pattern drawn, second exposure, PEB, development and dry etching. However, the optical energy of second exposure offsets the optical energy of first exposure so that the contrast becomes zero, leading to a failure of pattern formation. If an acid generator capable of two photon absorption or a contrast enhancement layer (CEL) is used to provide non-linear acid generation, then the energy offset is relatively reduced even when second exposure is performed at a half-pitch shifted position. Thus a pattern having a half pitch corresponding to the shift can be formed, though at a low contrast. See Jpn. J. Appl. Phy. Vol. 33 (1994) p 6874-6877, Part 1, No. 12B, December 1994. In this regard, if the mask is replaced on every exposure, the throughput is substantially reduced. Then first exposure is performed on a certain number of wafers before second exposure is performed. Due to acid diffusion during the standing time between the first and second exposures, there can occur dimensional variations which are of concern.

The critical issue associated with double patterning is an overlay accuracy between first and second patterns. Since the magnitude of misregistration is reflected by a variation of line size, an attempt to form 32-nm lines at an accuracy of 10%, for example, requires an overlay accuracy within 3.2 nm. Since currently available scanners have an overlay accuracy of the order of 8 nm, a significant improvement in accuracy is necessary.

In addition to the double patterning technique, the technology for forming a fine space pattern or hole pattern includes use of negative resist, thermal flow, and RELACS. The negative resist suffers from the problem that the resist itself has a low resolution. The thermal flow and RELACS methods suffer from a likelihood of variation during dimensional shrinkage by heat.

Referring to FIG. 4, a process for forming a hole pattern using a positive photoresist material. In FIG. 4A, a photoresist material is coated onto a processable substrate 101 on a substrate 100 to form a photoresist film 102. In FIG. 4B, the photoresist film 102 is exposed to light through a photomask having the desired pattern and developed to form a photoresist pattern 102a. In FIG. 4C, the processable substrate 101 is etched while using the photoresist pattern 102a as a mask.

The method of forming a negative pattern by reversal of a positive pattern is well known from the past. For example, JP-A 2-154266 and JP-A 6-27654 disclose naphthoquinone resists capable of pattern reversal. JP-A 64-7525 describes exposure of selected portions of a film to focused ion beam (FIB) for curing and flood exposure whereby the cured portions are left behind. JP-A 1-191423 and JP-A 1-92741 describe exposure of a photosensitive agent of naphthoquinone diazide to form an indene carboxylic acid, heat treatment in the presence of a base into an indene which is alkali insoluble, and flood exposure to effect positive/negative reversal. FIG. 5 illustrates this positive/negative reversal method. In FIG. 5A, a photoresist material is coated onto a processable substrate 101 on a substrate 100 to form a photoresist film 102. In FIG. 5B, the photoresist film 102 is exposed to light through a photomask having the desired pattern and heated. In FIG. 5C, the photoresist film 102 is subjected to flood exposure. FIG. 5D illustrates pattern reversal by development to form a reversed pattern film 103. In FIG. 5E, the processable substrate 101 is etched while using the reversed pattern film 103 as a mask.

As to the positive/negative reversal method including exchange of developers, attempts were made to form negative patterns by development in an organic solvent of hydroxystyrene partially protected with tert-butoxycarbonyl (t-BOC) groups, and by development with super-critical carbon dioxide.

As to the positive/negative reversal method utilizing silicon-containing materials, it is proposed to form a fine hole pattern by covering a space portion of a positive resist pattern with a silicon-containing film, effecting oxygen gas etching for etching away the positive pattern portion, thus achieving positive/negative reversal to leave a silicon-containing film pattern. See JP-A 2001-92154 and JP-A 2005-43420. FIG. 6 illustrates this positive/negative reversal method. In FIG. 6A, a photoresist material is coated onto an undercoat film 104 on a processable substrate 101 on a substrate 100 to form a photoresist film 102. In FIG. 6B, the photoresist film 102 is exposed to light through a photomask having the desired pattern and developed to form a photoresist pattern 102a. In FIG. 6C, the photoresist pattern 102a is crosslinked. In FIG. 6D, a spin-on-glass (SOG) film 105 is formed on the undercoat film 104 and so as to cover the crosslinked photoresist pattern 102a. FIG. 6E illustrates light etching with CMP or CF gas until the crosslinked photoresist pattern 102a is exposed. FIG. 6F illustrates pattern reversal by oxygen or hydrogen gas etching. In FIG. 6G, the processable substrate 101 is etched while using the patterned SOG film 105a as a mask.

As compared with the line pattern, the hole pattern is difficult to reduce the feature size. In order for the prior art method to form fine holes, an attempt is made to form fine holes by under-exposure of a positive resist film combined with a hole pattern mask, resulting in the exposure margin being extremely narrowed. It is then proposed to form holes of greater size, followed by thermal flow or RELACS method to shrink the holes as developed. However, there is a problem that control accuracy becomes lower as the pattern size after development and the size after shrinkage are greater and the quantity of shrinkage is greater. It is then proposed in Proc. SPIE, Vol. 5377, p 255 (2004) that a line pattern in X direction is formed using a positive resist film and dipole illumination, the resist pattern is cured, another resist material is coated thereon again, and a line pattern in Y direction is formed in the other resist using dipole illumination, leaving a grid line pattern, spaces of which provide a hole pattern. Although a hole pattern can be formed at a wide margin by combining λ and Y lines and using dipole illumination featuring a high contrast, it is difficult to etch vertically staged line patterns at a high dimensional accuracy.

DISCLOSURE OF THE INVENTION

When it is desired to form a very fine space pattern, the use of a negative resist film raises problems such as a failure to form a fine pattern due to low resolution and a bridge between spaces. The thermal flow and RELACS methods suffer from a likelihood of variation during dimensional shrinkage by heat. On the other hand, if it is possible to form a positive pattern with a high resolution, followed by reversal into a negative pattern, the problems associated with the use of a negative resist film can be overcome.

As discussed above, a variety of methods were reported for reversal into a negative pattern of a positive image obtained from a positive resist film featuring a high resolution capability. In particular, the above-cited JP-A 2005-43420 refers to an organic solvent-based composition as the silicone-based burying material for positive/negative reversal. The previous method using a water-soluble silicon resin as the reversal film-forming material has the problem that if an organic solvent-based reversal film-forming material composition is coated onto a substrate having a positive pattern formed thereon, the positive pattern can be disrupted by the organic solvent used for coating. If the resist pattern-forming resin is insolubilized against organic solvents by curing the resist resin with EB or the like to induce crosslinking between molecules of the resist resin, then an organic solvent-based reversal film-forming material composition may be utilized, enabling a choice from a wider range of materials. Where this treatment is done, however, the removal of the resist pattern at the final stage for reversal cannot resort to removal by dissolution because the positive pattern has been insolubilized. The state-of-the-art technology relies on no other means than removal by reactive dry etching. Then a selectively dry etchable material containing silicon, titanium or the like must be selected as the reversal film-forming material. In addition, if a silicon-based material is used as the burying material, the additional step of transferring once more the silicon-based material pattern to an organic material pattern becomes essential during processing of an inorganic substrate.

On the other hand, the above-cited JP-A 2001-92154 discloses advantageous removal of a positive pattern by wet etching. This is done by the method in which once a positive pattern is provided, an organic solvent solution of an organosilicon compound is directly (without any special treatment) coated to form a reversal film of organosilicon. The patent does not refer to the damage to the positive pattern by intermixing. The patent describes that for the preparation of an organosilicon composition, high polarity solvents (e.g., hydroxyl-bearing compounds such as propylene glycol monomethyl ether and lactic esters, esters such as propylene glycol monomethyl ether acetate, and ketones such as acetone) may be utilized as well as low polarity solvents (e.g., toluene and cumene), although only toluene and cumene are used in Examples. The inventors made a follow-up test by using a solvent containing a high polarity solvent such as propylene glycol monomethyl ether acetate, ethyl lactate, propylene glycol monomethyl ether or cyclohexanone as the solvent for reversal film, and coating an organosilicon solution in such a solvent onto a positive pattern having being subjected to no particular treatment. Then the pattern became dissolved in the coating solvent, and the test failed to achieve positive/negative reversal at the required accuracy level. Then, this method can adopt only a reversal film-forming material exhibiting a high solubility in low polarity solvents, but not reversal film-forming materials having a high concentration of polar groups featuring substrate adhesion, such as novolac resins, polyhydroxystyrene polymers, and alicyclic polymers having a high content of hydroxy groups or lactone.

An object of the invention, which is made to achieve an improvement under the above-described circumstances, is to provide a process for forming a pattern by way of positive/negative reversal, in which an initial positive pattern is endowed with a necessary minimal level of resistance to an organic solvent to be used in a reversal film-forming composition while maintaining a solubility in an alkaline etchant, and the final step of forming a negative image is by wet etching with an alkaline etchant. With this technology, not only silicon-based materials, but also reversal film-forming materials based on organic non-silicone resins such as aromatic resins and polycyclic compound resins are applicable. With this technology, high polarity solvents such as hydroxyl-bearing compounds, esters and ketones may be utilized for the preparation of the reversal film-forming material composition. A further object is to provide a process for forming a pattern by way of positive/negative reversal, in which an extremely fine space pattern and hole pattern which are otherwise incompatible with a high optical contrast can be formed at a wide bridge margin.

The inventors have found that by subjecting a resin in a chemically amplified positive resist composition of which a positive resist pattern is composed to partial crosslinking treatment, crosslinking may occur to such an extent to provide the necessary organic solvent resistance, while dissolution in an alkaline wet etchant is still possible; if the above step is incorporated in the process of forming a negative pattern by way of positive/negative reversal, then not only prior art silicon-based materials, but also reversal film-forming materials based on organic non-silicone resins such as aromatic resins and polycyclic compound resins are applicable as the reversal film-forming material. The invention is predicated on this finding.

Accordingly, in a first aspect (Claim 1), the invention provides a process for forming a pattern by way of positive/negative reversal, comprising the steps of:

coating a chemically amplified positive resist composition onto a processable substrate, said resist composition comprising a resin comprising recurring units having acid labile groups which are eliminatable with acid, the resin turning to be soluble in an alkaline developer as a result of elimination of the acid labile groups, a photoacid generator capable of generating an acid upon exposure to high-energy radiation and optionally, a thermal acid generator capable of generating an acid upon heating, and an organic solvent, prebaking the resist composition to remove the unnecessary solvent to form a resist film, exposing the resist film to high-energy radiation in a pattern of exposed and unexposed areas, post-exposure heating for causing the acid generated by the acid generator upon exposure to act on the acid labile groups on the resin whereby the acid labile groups on the resin in the exposed area undergo elimination reaction, and developing the exposed resist film with an alkaline developer to form a positive pattern, exposing to radiation or heating the positive pattern so that acid or heat acts to eliminate the acid labile groups on the resin in the positive pattern for thereby improving the alkali solubility of the resin, and to induce crosslinking in the resin to such an extent that the resin may not lose a solubility in an alkaline wet etchant, for thereby endowing the positive pattern with resistance to an organic solvent to be used in a reversal film-forming composition, coating a reversal film-forming composition thereon to form a reversal film, and applying an alkaline wet etchant thereto for dissolving away the crosslinked positive pattern.

The inventors have found that partial crosslinking between molecules of the resin of which the positive pattern is composed has a level that meets a solubility in an alkaline wet etchant resulting from elimination of acid labile groups and resistance to an organic solvent at the same time. This permits removal of the positive pattern portion in the final step of positive/negative reversal to be implemented by alkaline wet etching, enabling significant simplification of the process.

In a preferred embodiment (Claim 2), in the step for endowing the positive resist pattern with resistance to an organic solvent to be used in a reversal film-forming composition, the crosslinked positive pattern has a dissolution rate in the alkaline wet etchant corresponding to an etching rate in excess of 2 nm/sec when etched with a 2.38 wt % aqueous solution of tetramethylammonium hydroxide (TMAH); the reversal film-forming composition comprises an organic solvent selected from propylene glycol monomethyl ether acetate, cyclohexanone, ethyl lactate, propylene glycol monomethyl ether, heptanone, and a mixture of two or more of the foregoing; and the resistance of the crosslinked positive pattern to the organic solvent used in the reversal film-forming composition is such that the crosslinked positive pattern experiences a thickness reduction of not more than 10 nm when the pattern is kept in contact with the organic solvent for 30 seconds. By selecting a composition and crosslinking reaction conditions that meet these parameters, the process for forming a pattern by way of positive/negative reversal is readily feasible.

In a preferred embodiment (Claim 3), the step of exposing to radiation or heating the positive pattern includes heat treatment at a higher temperature than in both the prebaking and post-exposure heating steps. Although crosslinking reaction is possible solely with controlled light exposure, crosslinking reaction may be induced by heat treatment to impart resistance to an organic solvent to be used in the reversal film-forming composition. It is then easy to suppress the crosslinking reaction from proceeding to such an excessive extent that solubility in the alkaline etchant is lost, because available reaction sites are limited as compared with the light exposure. To turn the positive pattern itself to be soluble in an alkaline etchant, acid-catalyzed reaction utilizing the acid generator present in the pattern may be utilized, and acid-catalyzed, thermally induced crosslinking reaction may preferably be utilized to this end.

In a preferred embodiment (Claim 4), the reversal film formed from the reversal film-forming composition is selectively etchable relative to metallic silicon and silicon oxide. The most important feature of the invention is that the positive pattern is selectively removed using the alkaline etchant. Any reversal film may be utilized as long as selective dissolution in alkaline etchant is possible between the reversal film and the positive pattern. The feature that the positive pattern is removed using the alkaline etchant permits use of a material not having resistance to oxygen dry etching unlike the prior art processes. This permits a choice of an etching mask material for direct processing of a material to be dry etched with fluorine or chlorine. Such a film may be chosen by examining whether it is selectively etchable relative to metallic silicon and silicon oxide.

In a preferred embodiment (Claim 5), the reversal film-forming composition comprises a resin comprising monomeric units of aromatic or alicyclic structure. The resin comprising monomeric units of aromatic or alicyclic structure is a material having resistance to dry etching with fluorine or chlorine. Particularly when it is desired to impart a certain degree of alkaline solubility to the resin, those well-known resins comprising monomeric units having a phenol structure or a structure having an alcohol that exhibits acidity due to fluorine substitution at adjacent positions are advantageously utilized.

In a preferred embodiment (Claim 6), the pattern forming process further comprises between the step of coating a reversal film-forming composition to form a reversal film and the step of applying an alkaline wet etchant for dissolving away the crosslinked positive pattern, the step of removing a portion of the reversal film overlying the crosslinked positive pattern. Although it is possible to coat the reversal film-forming composition so as not to overlie the positive pattern, the composition is generally coated so as to deposit on the positive pattern at a certain thickness in order to completely fill spaces in the pattern in a simple manner. Then, where the reversal film is deposited on the positive pattern as well, the overlying portion of the reversal film must be removed before removal of the positive pattern can be commenced by wet etching.

In a preferred embodiment (Claim 7), the step of removing a portion of the reversal film overlying the crosslinked positive pattern includes wet etching. While either wet etching with a solvent capable of dissolving the reversal film or dry etching matching with the reversal film may be used for this removal purpose, the wet etching can be performed with a very simple device as long as the step is to remove only the surface portion.

In an embodiment leading to the simplest process (Claim 8), when an alkaline wet etchant is applied to the reversal film, the reversal film is dissolvable therein, but has a slower dissolution rate than the crosslinked positive pattern; and the wet etching in the step of removing a portion of the reversal film overlying the crosslinked positive pattern uses an alkaline wet etchant, so that the step of removing a portion of the reversal film overlying the crosslinked positive pattern and the step of applying an alkaline wet etchant for dissolving away the crosslinked positive pattern are simultaneously carried out. Since the portion of the reversal film overlying the positive pattern is not so thick, a choice of a material exhibiting a certain dissolution rate within the range that provides a difference from the dissolution rate of the positive pattern ensures that where the positive pattern exists, the overlying reversal film and the underlying positive pattern are continuously etched away, and the majority of the reversal film buried in spaces in the positive pattern is kept, with only a surface layer thereof being lost. As a result, the reversal film pattern is left.

In a preferred embodiment (Claim 9), the measure of solubility of the reversal film that ensures selective removal between the reversal film and the positive pattern with the alkaline wet etchant is that the reversal film has a dissolution rate of 0.02 nm/sec to 2 nm/sec when etched with a 2.38 wt % aqueous solution of tetramethylammonium hydroxide (TMAH). If the reversal film has a dissolution rate of less than 0.02 nm/sec, removal of the portion of reversal film overlying the positive pattern may require a longer time. If the reversal film has a dissolution rate in excess of 2 nm/sec, it may be difficult to restrain side etching of the reversal film at the top.

In a preferred embodiment (Claim 10), the chemically amplified positive resist composition comprises a component capable of generating an acid in response to the heat in the step of exposing to radiation or heating the positive pattern. As mentioned above, the step of controlled crosslinking in the resin for endowing the positive pattern with resistance to an organic solvent while maintaining alkali solubility is advantageously acid-catalyzed heat reaction. Crosslink formation advantageously takes place when the acid for eliminating acid labile groups is present in a higher concentration rather than in a larger quantity. Then the resist composition in which a photoacid generator capable of generating acid by the heat in this step is selected or a thermal acid generator capable of generating acid upon heating is added is preferably used.

In a preferred embodiment (Claim 11), the component capable of generating an acid in response to the heat is the thermal acid generator added separately from the photoacid generator. Since the acid generator has a significant impact on the resolution characteristics such as the light transmittance of a resist film and diffusion of anion component, it is sometimes difficult to select an optimum acid generator for this step. Thus, when heat reaction conditions of this step are optimized, it is advantageous to use a thermal acid generator having a low photo-induced acid generating ability and free of a photo-absorptive group.

In a preferred embodiment (Claim 12), the thermal acid generator has the general formula (P1a-2).

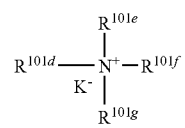

(P1a-2)

Herein K⁻ is a sulfonate having at least one α-position fluorinated, perfluoroalkylimidate or perfluoroalkylmethidate acid $R^{101d}$, $R^{101e}$, $R^{101f}$, and $R^{101g}$ are each independently hydrogen, a straight, branched or cyclic alkyl, alkenyl, oxoalkyl or oxoalkenyl group of 1 to 12 carbon atoms, an aryl group of 6 to 20 carbon atoms, or an aralkyl or aryloxoalkyl group of 7 to 12 carbon atoms, in which some or all hydrogen atoms may be substituted by alkoxy groups, or $R^{101d}$ and $R^{101e}$, or $R^{101d}$, $R^{101e}$ and $R^{101f}$ may bond together to form a ring with the nitrogen atom to which they are attached, and each of $R^{101d}$ and $R^{101e}$, or $R^{101d}$, $R^{101e}$ and $R^{101f}$ is an alkylene group of 3 to 10 carbon atoms or a group forming a hetero-aromatic ring having the nitrogen atom therein when they form a ring.

In a preferred embodiment (Claim 13), the chemically amplified positive resist composition comprises a resin comprising recurring units having an electrophilicity structure such as an ester group or a cyclic ether and recurring units having an acid labile group which is eliminatable with acid.

In a further preferred embodiment (Claim 14) for implementing the pattern forming process, the chemically amplified positive resist composition comprises a resin comprising recurring units having a lactone ring and recurring units of alicyclic structure having an acid labile group which is eliminatable with acid. While the lactone ring structure is known to impart adhesion to the resist film, the resin comprising such units is advantageously used in crosslink formation in the step of endowing the resin with organic solvent resistance.

In a preferred embodiment (Claim 15), the positive resist composition comprises a resin comprising recurring units having a 7-oxanorbornane ring and recurring units having an acid labile group which is eliminatable with acid, and the step of exposing to radiation or heating the positive pattern includes acid generation in and heat application to the positive pattern whereby elimination of acid labile groups and crosslinking of the resin simultaneously take place. The 7-oxanorbornane ring advantageously serves to impart organic solvent resistance.

In a preferred embodiment (Claim 16), the recurring units having a 7-oxanorbornane ring are recurring units (a) having the general formula (1).

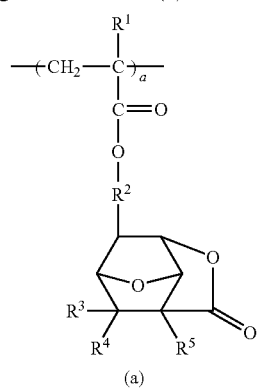

(a)

(1)

Herein $R^1$ is hydrogen or methyl, $R^2$ is a single bond or a straight, branched or cyclic $C_1$-$C_6$ alkylene group which may have an ether or ester group, and which has a primary or secondary carbon atom through which it is linked to the ester group in the formula, $R^3$, $R^4$, and $R^5$ are each independently hydrogen or a straight, branched or cyclic $C_1$-$C_6$ alkyl group, and "a" is a number in the range: $0<a<1.0$.

In a preferred embodiment (Claim 17), the recurring units having an acid labile group which is eliminatable with acid are recurring units (b) having the general formula (b).

(b)

Herein $R^{12}$ is hydrogen or methyl, $R^{13}$ is an acid labile group, and b is a number in the range: $0<b\leqq0.8$. The inclusion of units of the illustrated structure enables that the dissolution rate be readily increased by reaction with acid, establishing selective dissolution between the positive pattern and the reversal film during wet etching with the alkaline wet etchant.

In a preferred embodiment (Claim 18), the acid labile group of $R^{13}$ is an acid labile group of alicyclic structure which is eliminatable with acid.

In a preferred embodiment (Claim 19) to which the invention is most advantageously applied, the positive pattern comprises a dot pattern, and the pattern resulting from positive/negative reversal comprises a hole pattern. As mentioned above, formation of a hole pattern directly from a positive resist composition is disadvantageous owing to optical contrast, and formation of a hole pattern directly from a negative resist composition is disadvantageous owing to resist performance. With the process of the invention, a pattern with a size which has been impossible to reach without reversal can be formed.

Typically, ArF immersion lithography is used in the pattern forming process of the invention. In the ArF immersion lithography, water is generally used as the liquid, and it is a common practice to use a protective coating for preventing the acid from being leached out in water.

A pattern forming process using a protective coating is also contemplated herein. A further embodiment of the invention (Claim 20) is a process for forming a pattern by way of positive/negative reversal, comprising the steps of:

coating a chemically amplified positive resist composition onto a processable substrate, said resist composition comprising a resin comprising recurring units having acid labile groups which are eliminatable with acid, a photoacid generator capable of generating an acid upon exposure to high-energy radiation and a solvent, and heat drying to form a resist film, coating a protective film-forming composition onto the resist film, and heating to remove an unnecessary solvent to form a protective film, exposing the resist film to high-energy radiation in a pattern of exposed and unexposed areas from a projection lens, while water or a transparent liquid having a refractive index of at least 1 intervenes between the resist film and the projection lens, post-exposure heating for causing the acid generated by the acid generator upon exposure to act on the acid labile groups on the resin whereby the acid labile groups on the resin in the exposed area undergo elimination reaction, and developing the exposed resist film with an alkaline developer to form a positive pattern, treating the positive pattern so as to eliminate the acid labile groups on the resin in the positive pattern resulting from the previous step, and to induce crosslinking in the resin to such an extent that the resin may not lose a solubility in an alkaline wet etchant, for thereby endowing the positive pattern with resistance to an organic solvent to be used in a reversal film-forming composition, coating a reversal film-forming composition thereon to form a reversal film, and applying an alkaline wet etchant thereto for dissolving away the positive pattern.

By incorporating an amine component in the protective film, the resist pattern after development is improved in rectangularity. In a preferred embodiment (Claim 21), the amine component is incorporated by using a copolymer comprising amino-containing recurring units as the base polymer in the protective film-forming composition. In an alternative embodiment (Claim 22), the protective film-forming composition further comprises an amine compound.

FIG. 7 is a diagram showing the optical contrasts of hole, dot and line patterns with 90 nm pitch and 45 nm size when illuminated through a lens with NA 1.3. The masks used are binary masks with a Cr light-shielding band. The line pattern is subject to dipole illumination with σ0.98 and radius σ0.2+s-polarized illumination. The dot pattern is subject to ¾ annular illumination with σ0.98/0.735+azimuthally polarized illumination. The hole pattern is subject to ¾ annular illumination with a 0.98/0.735+azimuthally polarized illumination.

The gradient of a curve at the mask edge represents an image contrast. A greater gradient is more advantageous to pattern formation. The sequence of high to low contrast is in the order of line, dot and hole patterns. Since the contrast of the hole pattern is extremely low, pattern formation is difficult even with a very high contrast resist film. The dot pattern provides a somewhat higher contrast than the hole pattern. The line pattern exhibits a high contrast under the dipole illumination, which is a more intense oblique incidence illumination, plus intense s-polarized illumination, achieving a higher maximum resolution than the dot and hole patterns which are two-dimensional patterns incompatible with intense modified illumination. This indicates that formation of a fine hole pattern is one of the challenges of the lithography technology. It is also indicated that more advanced miniaturization is achievable if a hole pattern is formed by reversal of a dot pattern. A dot pattern can be formed by the double dipole method involving exposure of a X-direction line pattern, exposure of a Y-direction line pattern, and development. The dot pattern formed by this method has finer features than the ordinary methods using a dot patterned mask.

BENEFITS OF THE INVENTION

According to the invention, when a reversal film is formed on a positive pattern by coating a reversal film-forming composition using a solvent containing a hydroxy-bearing solvent or a highly polar solvent such as an ester or ketone, the reversal film-forming composition can be buried in spaces in the positive pattern without any damage to the positive pattern; and the positive pattern resulting from a positive resist composition can be removed by wet etching. Thus, positive/negative reversal at a high accuracy can be performed by a simple procedure. Moreover, an organic material which fails to establish a selectivity between it and the resist pattern upon oxygen dry etching which is a prior art resist pattern removal method can be used in the reversal film. Moreover, a material which is difficult to dissolve unless a hydroxy-bearing solvent or a highly polar solvent such as an ester or ketone is used, like a resin material which is improved in adhesion by incorporating polar groups such as hydroxy groups, especially phenolic hydroxy groups or lactone structures, can also be used in the reversal film. In this case, to process a silicon oxide film by a prior art method, the reversed pattern must be transferred to an organic film before the silicon oxide film can be processed. With the inventive process, the reversed pattern allows for direct processing.

Also, when a reversal film having an appropriate alkali dissolution rate is used as the reversal film, the step of removing the portion of the reversal film overlying the positive pattern and the step of wet etching the positive pattern may be performed simultaneously, achieving a significantly simplified process.

Image reversal from a positive pattern to a negative pattern by this method ensures that using a first fine line pattern, a fine space pattern of the same size can be reversal-formed. In the case of a trench pattern, a line pattern having a capability to form a finer feature size is formed through exposure, and this is converted into a trench pattern by the image reversal technology described above, whereby an ultra-fine trench pattern can be formed. By reversal of a dot pattern, a hole pattern can also be formed. Moreover, once a line pattern is formed as a first pattern, a second line pattern extending perpendicular thereto is exposed and developed to form a dot pattern, and a film having an appropriate alkaline dissolution rate is coated and developed for image reversal to form a hole pattern. In this way, a hole pattern which is finer than the prior art hole pattern can be formed.

BRIEF DESCRIPTION OF THE DRAWINGS

FIG. 1 schematically illustrates in cross-sectional views the pattern forming process of the invention.

FIG. 4 schematically illustrates in cross-sectional views a prior art process for forming a hole pattern through exposure of a positive photoresist material.

FIG. 5 schematically illustrates in cross-sectional views a prior art image reversal process using a positive i or g-line resist material based on a quinonediazide-novolac resin.

FIG. 6 schematically illustrates in cross-sectional views a prior art image reversal process involving hardening of a developed resist film and burying of SOG film.

DESCRIPTION OF THE PREFERRED EMBODIMENTS

Figure 1A:
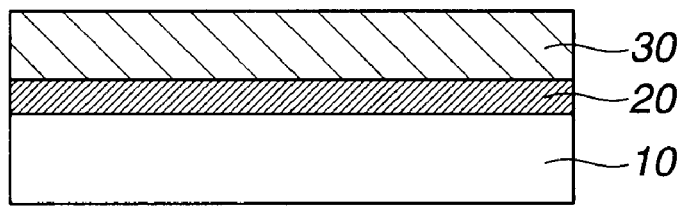
FIG. 1A shows that a processable substrate and a resist film are disposed on a substrate.

The terms "a" and "an" herein do not denote a limitation of quantity, but rather denote the presence of at least one of the referenced item.

As used herein, the notation ($C_n$-$C_m$) means a group containing from n to m carbon atoms per group.

The abbreviation "phr" refers to parts by weight per 100 parts by weight of resin.

As discussed above, several attempts have already been made to form a pattern, which is optically disadvantageous to form from a positive resist material as such, using a positive resist material featuring a high resolution capability and positive/negative reversal. There were many problems to be overcome in the course of development works. In the situation where a reversal film is formed on a once formed positive pattern, how to deposit a new coating without disrupting the underlying pattern is one of such problems. The initial approach addressing this problem is to use an aqueous composition in which the positive pattern is not dissolvable, as the reversal film-forming composition. The reversal film material which can be used is limited to a narrow range of water-soluble materials. Then JP-A 2005-43420 proposes that by EB curing, a positive pattern is crosslinked to be insoluble in solvents and developers, before a reversal film is formed. Another problem is how to selectively remove the positive pattern relative to the reversal film. Selective removal is achieved using SOG and organic silicone materials having resistance to oxygen dry etching as the reversal film as taught in JP-A 2005-43420.

On the other hand, the fact that a resist film as shown in JP-A 2005-43420 is crosslinked and insolubilized upon exposure to high-energy radiation was known at the initial phase of research and development of chemically amplified resist materials as a phenomenon that occurs when a chemically amplified resist film is exposed to radiation of too high energy. That is, it is a phenomenon that when polyhydroxystyrene units of which a chemically amplified resist polymer is composed are exposed to high intensity light, a hydrogen radical is eliminated from the methine to which the phenyl group is bonded, and the resulting radical acts to form crosslinks between resin molecules whereby the resin is insolubilized. It is believed that this radical creation capable of inducing crosslink formation can occur not only on the styrene structure, but also on the polyacrylic acid structure. It is further believed that similar crosslink formation occurs on methylene bonded to a heteroatom. However, the inventors observed that when light exposure is made stepwise, insolubilization of a resist film by crosslink formation does not instantly occur, but past consecutive points of time when the dissolution rate is slightly reduced, and attempted to utilize this phenomenon. More particularly, the initially observed reductions of dissolution rate are results of crosslinks forming within or between molecules within a limited range. As long as crosslinking is within the limited range, there is a possibility that resistance to organic solvents such as the coating solvent is obtainable without completely losing a dissolution rate in alkaline developer. Then, studying to form a pattern having resistance to organic solvents commonly used in film-forming compositions without completely losing a dissolution rate in alkaline developer, the inventors have found that such a pattern is feasible.

If the method of endowing a positive pattern with resistance to organic solvents without completely losing solubility in alkaline developer as mentioned above is incorporated in the process of forming a resist pattern through positive/negative reversal, a pattern forming process involving reversal of a positive pattern to a negative pattern becomes possible as described below. Namely, in accordance with the ordinary positive pattern forming method, first a chemically amplified positive resist composition is coated and prebaked to form a resist film. Then pattern exposure is performed, and post-exposure heating or baking is performed to eliminate acid labile groups from the resin in the exposed area, for thereby turning the exposed area soluble in alkaline developer. This is followed by development with an alkaline developer, yielding a positive pattern. Next, the resulting positive pattern is subjected to the step of endowing the positive pattern with resistance to an organic solvent to be used in a reversal film-forming composition without completely losing solubility in the alkaline developer. Next, on the substrate having the positive pattern endowed with resistance to an organic solvent to be used in a reversal film-forming composition, the reversal film-forming composition in the form of a solution in that organic solvent is coated to form a reversal film. At this point, the reversal film is coated so as to completely bury or fill spaces in the positive pattern, although the reversal film may be coated so as to form a layer over the positive pattern as well. In such an event, as described in JP-A 2001-92154 and JP-A 2005-43420, after the reversal film is formed, the portion of the reversal film deposited on the positive resist is removed and the positive pattern is then removed using an alkaline wet etchant. Then only the portion of the reversal film where the positive pattern is absent is left, that is, a reversal film pattern reflecting positive/negative reversal is obtained. It is noted that the alkaline wet etchant serves to dissolve the positive pattern, and the developer for forming the positive pattern may be used as the etchant while its concentration may be adjusted if necessary.

The resist pattern forming process relying on positive/negative reversal according to the invention achieves significant simplification of operation because the removal of the positive pattern does not need conventional oxygen dry etching. Further, the reversal film which can be used in the process may be any of conventional organic films including antireflective coatings (ARC) of aromatic organic polymers and organic undercoat films used in the multilayer resist process, specifically organic films comprising resins containing a majority of aromatic structure-bearing units well-known in the art, for example, novolac resins (see JP-A 2007-171895), polystyrene resins, vinyl ether or acrylic resins containing anthracene or naphthalene rings, and multi-branched resins (also known as aliphatic polycyclic structure resins) as used in the ArF resist (see JP-A 2006-293298). Of course, these reversal films may be either films which are insolubilized in organic solvents through crosslink formation during deposition like the ARC or films which are not insolubilized in such a manner as long as a difference in dissolution rate enough to provide an etching selectivity with respect to the alkaline wet etchant is available between the reversal film and the positive pattern. If these organic material films are used, reversal film patterns resulting from reversal can be directly used as the etching mask for processing metallic silicon and silicon oxide substrates, like the conventional organic resist patterns. Furthermore, as is well known in the art, when organic reversal films as described above are used, films and substrates of silicon nitride, silicon oxynitride, titanium oxide, titanium nitride, germanium oxide and hafnium oxide may be processed as well as the metallic silicon and silicon oxide substrates.

Furthermore, if the reversal film used is a film having a scarce alkaline solubility as will be described later, the step of removing the reversal film deposited on the positive resist pattern may resort to the step of dissolving away in an alkaline wet etchant rather than conventional dry etching and organic solvent stripping techniques. When removal is made by this technique, the reversal film deposited on the resist pattern and the resist pattern can be simultaneously removed by a single operation, achieving a significant step saving to the overall process.

The important feature of the invention is that the positive pattern is endowed with resistance to an organic solvent to be used in the reversal film-forming composition without completely losing solubility in alkaline wet etchant, thereby preventing the positive pattern from being dissolved and hence deformed or disrupted during coating and formation of the reversal film. This can be achieved by irradiation of high-energy radiation of an appropriate energy level, as discussed above. Recognizing that the crosslink formation by light or irradiation is sometimes difficult to control owing to the tolerance of irradiation dose and the uniformity of irradiation, the inventors sought for another crosslink forming technique and discovered that a limited degree of crosslinking just to impart the desired organic solvent resistance can be achieved by heat. Particularly when a positive pattern obtained from a resist material having units having a crosslinking capability under strong reaction conditions such as lactone structure is used, the desired control is relatively easily achievable by heat in the presence of acid.

The step of heating the positive pattern for endowing the positive pattern with resistance to an organic solvent to be used in a reversal film-forming composition without losing a solubility in an alkaline wet etchant differs in the amount of acid to be generated and the optimum temperature to be reached by heating depending on a particular material used. Nevertheless, the resist pattern forming process of the invention may be readily implemented by setting conditions for this step in accordance with the following measures. Namely, acid is generated within the resist film by irradiating light or high-energy radiation such as electron beam (EB) in an appropriate range to the resist film and then heating, or solely by heating, whereupon the acid is used to eliminate acid labile groups in the resin to impart a solubility in alkaline solution to the resin. At the same time as this treatment, partial crosslinks are formed by light or heat, whereby the resin is endowed with resistance to an organic solvent to be used in a reversal film-forming composition. Preferably, the measure of solubility of the resist film to be achieved by this step is that the resist film has an etching rate in excess of 2 nm/sec when etched with a 2.38 wt % aqueous solution of tetramethylammonium hydroxide (TMAH) commonly used in the alkaline development of resist films. Also, the resistance to an organic solvent to be used in a reversal film-forming composition is of such order that the resist pattern after the resistance-endowing (or crosslinking) treatment experiences a thickness reduction of up to 10 nm when contacted with a solvent to be used in a reversal film-forming composition for 30 seconds and more preferably for 60 seconds, and the solvent resistance of such order prevents the occurrence of the problem that the pattern of the positive resist film is fatally damaged when the reversal film-forming composition is coated thereon, and hence, a reversed (negative) pattern of the desired configuration is not obtainable. It is noted that in determining the treatment conditions, if a bulk film is used which has passed the above-described sequence of steps including resist coating, prebaking, and post-exposure baking, but excluding only pattern exposure for positive pattern formation, and has further been subjected to a set of conditions constituting a candidate step of endowing the positive pattern with resistance to an organic solvent to be used in a reversal film-forming composition without losing a solubility in an alkaline wet etchant, then the two dissolution rates described above are readily determined.

The organic solvent used in the reversal film-forming composition which allows for advantageous use of the invention may encompass those solvents in which organic polymers having adhesive groups are well soluble, and which offer good coating properties, for example, the above-described hydroxy-bearing solvents, esters, ketones and the like. Specifically, the solvent is selected from among propylene glycol monomethyl ether acetate, cyclohexanone, ethyl lactate, propylene glycol monomethyl ether, and heptanone, which may be used alone or in admixture of two or more. Then as to the measure of endowing resistance to the organic solvent used in the reversal film-forming composition, the resist pattern which has been treated to have such a degree of solvent resistance as to experience a thickness reduction of up to 10 nm when contacted with a single solvent or a mixture of solvents selected from the above-mentioned group for 30 seconds and more preferably for 60 seconds is particularly preferred because of versatile use.

When partial crosslinks are induced by irradiation of high-energy radiation, the heating treatment may be heating to the post-exposure heating temperature used in forming the positive pattern or somewhat lower temperature, because the only reaction to be induced by heating is decomposition of acid labile groups. However, when high-energy radiation is not used, or when the main purpose of high-energy radiation is to generate acid, that is, when an energy amount equivalent to that of pattern exposure in the previous step is used and crosslinks are formed mainly by thermally induced reaction, it is preferable to select a higher temperature than the prebaking temperature used in formation of the resist film or the post-exposure heating temperature. In the case of a material for which this temperature is set lower than the heating of the previous step, there is a risk of the positive resist film decreasing its resolution.

The positive/negative reversal process is advantageously utilized in the following case. As for the positive pattern, a finer size pattern can be formed with an over-exposure dose. Then, although it is technically quite difficult to form isolated spaces (trench pattern) below the exposure limit, for example, a very fine trench pattern can be formed by utilizing over-dose exposure to form a finer size pattern below the ordinary exposure limit and reversing the resulting pattern in accordance with the inventive process. Moreover, although formation of a fine hole pattern encounters more technical difficulty than the trench pattern, holes of a very small size can be formed by utilizing over-dose exposure to form a fine dot pattern and reversing the resulting pattern in accordance with the inventive process.

Now referring to one typical embodiment of the invention wherein a material having a scarce solubility in an alkaline wet etchant is used as the reversal film, the invention is described in further detail. As used herein, the term "alkaline wet etchant" is substantially equivalent to an alkaline developer used in the development of resist patterns and thus often referred to as "alkaline developer" as well.

In the most preferred embodiment of the invention, the pattern forming process comprises the steps of coating a positive resist composition onto a substrate, said resist composition comprising a polymer (or base resin) comprising recurring units having acid labile groups which are eliminatable with acid, preferably of alicyclic structure, the polymer turning, as a result of elimination of acid labile groups and crosslinking, into a crosslinked polymer having a dissolution rate in excess of 2 nm/sec in an alkaline developer, prebaking the resist composition to form a resist film, exposing a selected portion of the resist film to high-energy radiation, post-exposure heating, and developing the exposed resist film with the alkaline developer to form a positive pattern. Thereafter, the positive pattern is treated so as to generate acid and heated, thereby eliminating acid labile groups from the polymer and inducing crosslinking in the polymer in the positive pattern. Then, a reversal film having a dissolution rate of 0.01 nm/sec to 2 nm/sec in the alkaline developer is formed on the substrate to cover the resist pattern. The alkaline developer is then applied thereon to dissolve a surface layer of the reversal film and dissolve away the resist pattern, providing the reversal film with a pattern which is a reversal of the resist pattern.

In this embodiment, a hole pattern can be formed by forming a dot pattern as the resist pattern, followed by reversal.

The crosslinking may preferably be formed from an electrophilicity structure such as an ester group or a cyclic ether. The crosslinking reaction can proceed by ester exchange, opening of a lactone ring followed by esterification and etherification, or opening of a cyclic ether followed by etherification and esterification.

The base resin in the positive resist composition used in the pattern forming process is advantageously a polymer comprising recurring units having a lactone ring and recurring units having an acid labile group which is eliminatable with acid. The former recurring units having a lactone ring are especially recurring units having a 7-oxanorbornane ring and preferably recurring units (a) having the general formula (1). The units containing an ester group and a cyclic ether at the same time can give a high reactivity of the crosslinking reaction. These units are used as adhesive units. The process is advantageously applicable with this polymer without adding a further component(s) to the base resin.

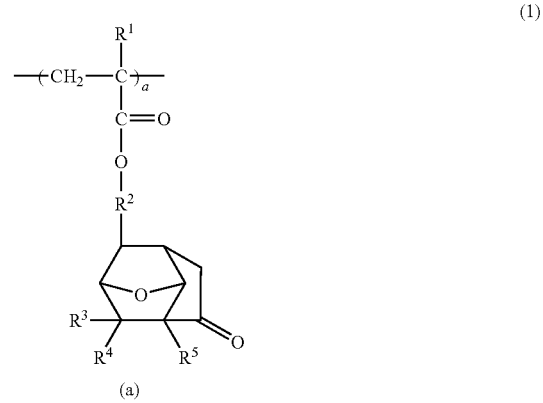

(1)

(a)

Herein $R^1$ is hydrogen or methyl, $R^2$ is a single bond or a straight, branched or cyclic $C_1$-$C_6$ alkylene group which may have an ether or ester group, and which has a primary or secondary carbon atom through which it is linked to the ester group in the formula, $R^3$, $R^4$, and $R^5$ are each independently hydrogen or a straight, branched or cyclic $C_1$-$C_6$ alkyl group, and "a" is a number in the range: 0<a<1.0.

Examples of the $C_1$-$C_6$ alkylene group include methylene, ethylene, n-propylene, isopropylene, n-butylene, isobutylene, sec-butylene, n-pentylene, isopentylene, cyclopentylene, n-hexylene, and cyclohexylene.

Examples of the $C_1$-$C_6$ alkyl group include methyl, ethyl, n-propyl, isopropyl, n-butyl, isobutyl, sec-butyl, n-pentyl, isopentyl, cyclopentyl, n-hexyl, and cyclohexyl.

The monomers from which recurring units of formula (1) are derived are monomers Ma of the general formula (2) wherein $R^1$ to $R^5$ are as defined above.

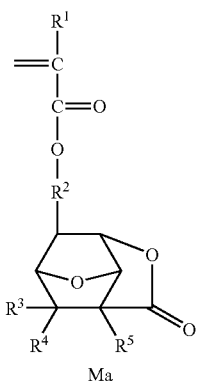

(2)

Examples of monomers Ma are shown below.

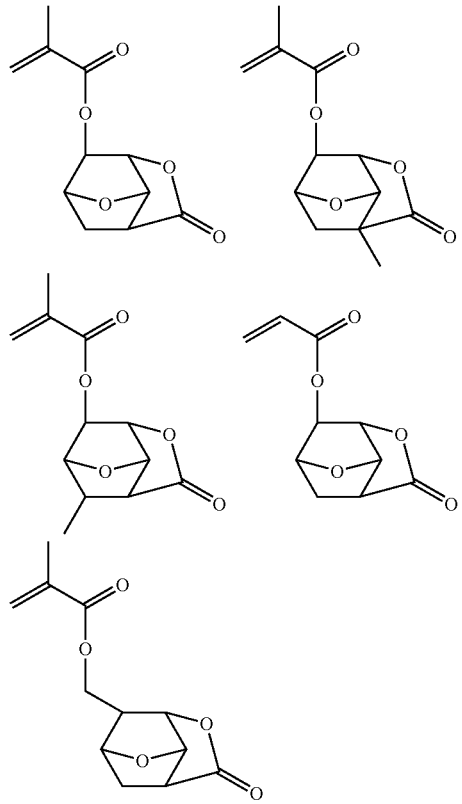

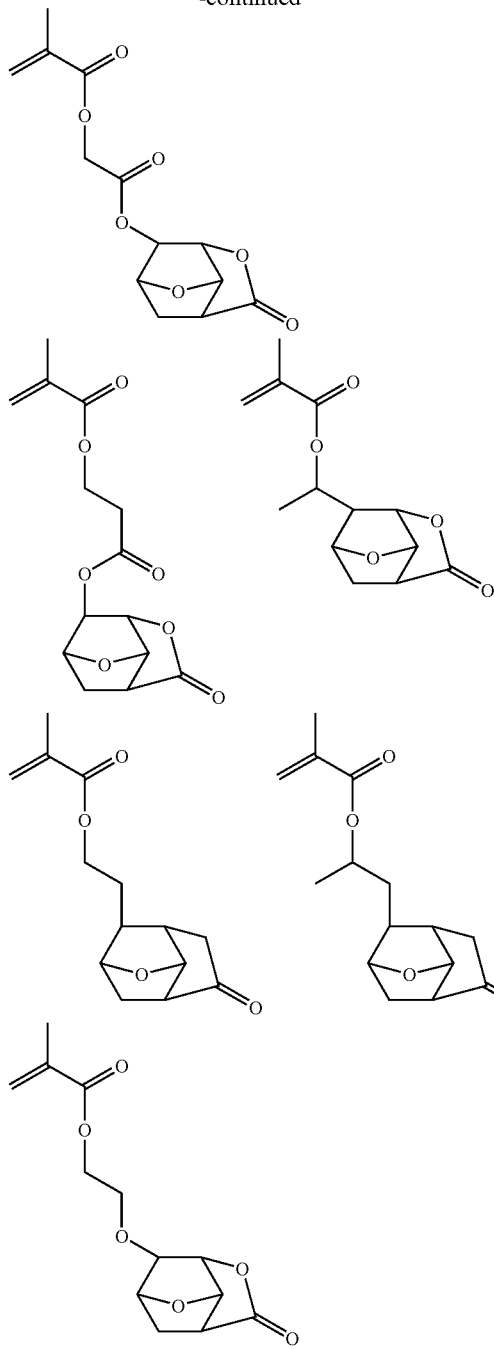

In the embodiment of the process, once a (positive) resist pattern is formed through exposure and development, deprotection of acid labile groups and crosslinking are brought about under the action of acid and heat. A film (or reversal film) having an adequate alkaline solubility is coated thereon and alkali developed.

More specifically, the resist pattern based on the polymer comprising recurring units having 7-oxanorbornane rings and recurring units having acid labile groups is converted into a film which is alkali soluble as a result of deprotection of acid labile groups and which is insoluble in a solvent (i.e., solvent in a reversal film-forming composition) as a result of crosslinking of 7-oxanorbornane ring. Therefore, even when a solution of reversal film-forming material in an organic solvent is coated on the resist pattern, no intermixing occurs between the resist pattern and the reversal film-forming material.

During subsequent treatment with an alkaline developer, a surface layer of the reversal film is dissolved down to the level of the resist pattern, after which dissolution of the resist pattern is commenced, whereby image reversal is accomplished.

If a polymer comprising oxirane or oxetane-bearing recurring units is used as the resist base resin, it fails to function as the desired positive resist material in the inventive process, because the oxirane or oxetane ring has so high a rate of acid-catalyzed cleavage reaction that crosslinking takes place at the resist processing temperature, for example, a post-exposure baking (PEB) temperature of about 90 to 130° C., whereby the polymer becomes alkali insoluble. In contrast, the inventive polymer undergoes no crosslinking at the heating temperature range of PEB because the 1,4-epoxy bond of 7-oxanorbornane ring is low reactive in the acid-catalyzed cleavage reaction as compared with the oxirane or oxetane ring. The recurring units having 7-oxanorbornane ring are stable relative to acid during the process until development, and serve as hydrophilic groups to exert the function of improving adhesion and alkali solubility. However, under the action of acid generated upon flood exposure or heating of the pattern after development and heating at or above 170° C., the 1,4-epoxy bond of 7-oxanorbornane ring is cleaved so that crosslinking reaction takes place whereby the polymer becomes insoluble in the solvent and at the same time, the acid and heat cause deprotection of acid labile groups from the acid labile group-containing recurring units whereby alkali solubility is increased. For the purpose of generating the acid, a thermal acid generator may be added to the resist material, or UV of wavelength equal to or less than 400 nm may be irradiated over the entire surface of the pattern as developed.

The base resin in the positive resist composition used in the pattern forming process is advantageously a polymer comprising crosslinkable recurring units represented by the general formula (a) and recurring units having an acid labile group represented by the following general formula (b).

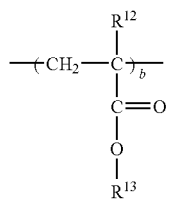
(b)

Herein $R^{12}$ is hydrogen or methyl, $R^{13}$ is an acid labile group, and b is a number in the range: $0 < b \leq 0.8$.

The monomers from which recurring units of formula (b) are derived are monomers Mb of the following general formula wherein $R^{12}$ and $R^{13}$ are as defined above.

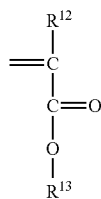
Mb

The acid labile group represented by $R^{13}$ in formula (b) may be selected from a variety of such groups, specifically groups of the following formulae (AL-10) and (AL-11), tertiary alkyl groups of the following formula (AL-12), and oxoalkyl groups of 4 to 20 carbon atoms, but not limited thereto.

(AL-10)

(AL-11)

(AL-12)

In formulae (AL-10) and (AL-11), $R^{51}$ and $R^{54}$ each are a monovalent hydrocarbon group, typically a straight, branched or cyclic alkyl group of 1 to 40 carbon atoms, more specifically 1 to 20 carbon atoms, which may contain a heteroatom such as oxygen, sulfur, nitrogen or fluorine. The subscript "a5" is an integer of 0 to 10, and especially 1 to 5. $R^{52}$ and $R^{53}$ each are hydrogen or a monovalent hydrocarbon group, typically a straight, branched or cyclic $C_1$-$C_{20}$ alkyl group, which may contain a heteroatom such as oxygen, sulfur, nitrogen or fluorine. Alternatively, a pair of $R^{52}$ and $R^{53}$, $R^{52}$ and $R^{54}$, or $R^{53}$ and $R^{54}$, taken together, may form a ring, specifically aliphatic ring, with the carbon atom or the carbon and oxygen atoms to which they are attached, the ring having 3 to 20 carbon atoms, especially 4 to 16 carbon atoms.

In formula (AL-12), $R^{55}$, $R^{56}$ and $R^{57}$ each are a monovalent hydrocarbon group, typically a straight, branched or cyclic $C_1$-$C_{20}$ alkyl group, which may contain a heteroatom such as oxygen, sulfur, nitrogen or fluorine. Alternatively, a pair of $R^{55}$ and $R^{56}$, $R^{55}$ and $R^{57}$, or $R^{56}$ and $R^{57}$, taken together, may form a ring, specifically aliphatic ring, with the carbon atom to which they are attached, the ring having 3 to 20 carbon atoms, especially 4 to 16 carbon atoms.

Illustrative examples of the groups of formula (AL-10) include tert-butoxycarbonyl, tert-butoxycarbonylmethyl, tert-amyloxycarbonyl, tert-amyloxycarbonylmethyl, 1-ethoxyethoxycarbonylmethyl, 2-tetrahydropyranyloxycarbonylmethyl and 2-tetrahydrofuranyloxycarbonylmethyl as well as substituent groups of the following formulae (AL-10)-1 to (AL-10)-10.

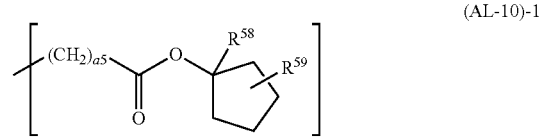
(AL-10)-1

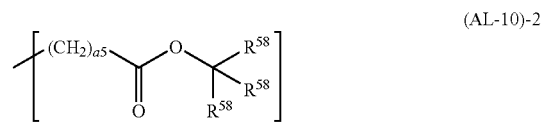
(AL-10)-2

-continued (AL-10)-3

(AL-10)-4

(AL-10)-5

(AL-10)-6

(AL-10)-7

(AL-10)-8

(AL-10)-9

(AL-10)-10

In formulae (AL-10)-1 to (AL-10)-10, $R^{58}$ is independently a straight, branched or cyclic $C_1$-$C_8$ alkyl group, $C_6$-$C_{20}$ aryl group or $C_7$-$C_{20}$ aralkyl group; $R^{59}$ is hydrogen or a straight, branched or cyclic $C_1$-$C_{20}$ alkyl group; $R^{60}$ is a $C_6$-$C_{20}$ aryl group or $C_7$-$C_{20}$ aralkyl group; and "a5" is an integer of 0 to 10.

Illustrative examples of the acetal group of formula (AL-11) include those of the following formulae (AL-11)-1 to (AL-11)-34.

—CH₂—O—CH₃ (AL-11)-1

—CH₂—O—CH₂—CH₃ (AL-11)-2

—CH₂—O—(CH₂)₂—CH₃ (AL-11)-3

—CH₂—O—(CH₂)₃—CH₃ (AL-11)-4

(AL-11)-5

(AL-11)-6

(AL-11)-7

(AL-11)-8

(AL-11)-9

(AL-11)-10

(AL-11)-11

(AL-11)-12

(AL-11)-13

(AL-11)-14

(AL-11)-15

(AL-11)-16

(AL-11)-17

(AL-11)-18

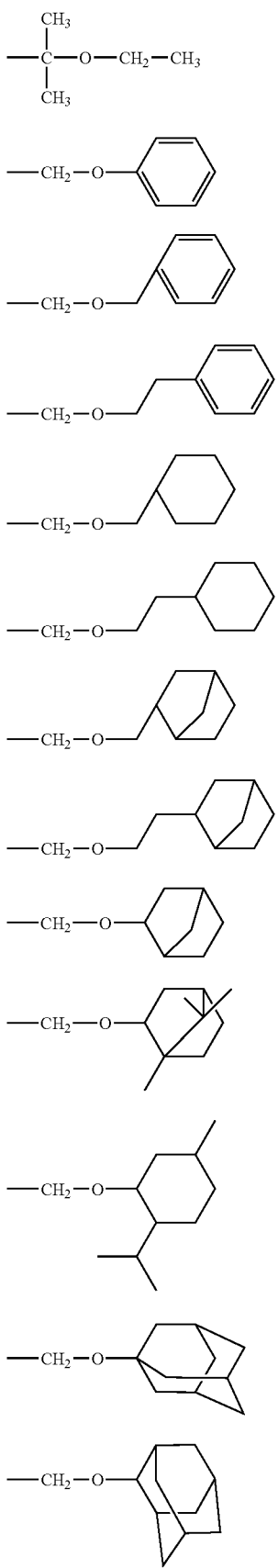

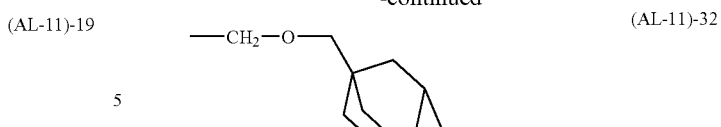
(AL-11)-32

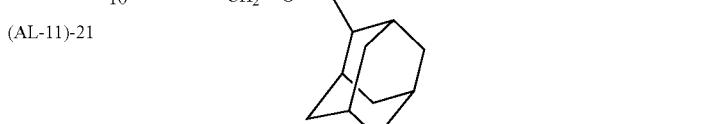
(AL-11)-33

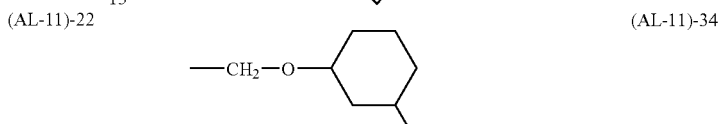
(AL-11)-34

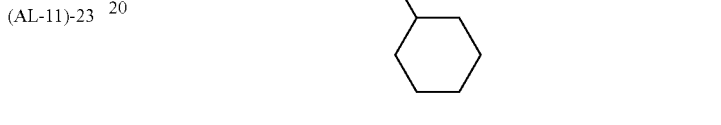

Other examples of acid labile groups include those of the following formula (AL-11a) or (AL-11b) while the polymer may be crosslinked within the molecule or between molecules with these acid labile groups.

(AL-11a)

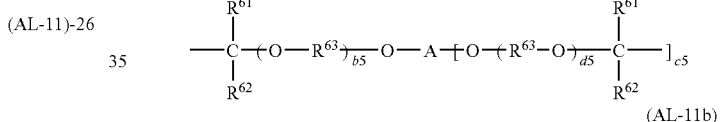
(AL-11b)

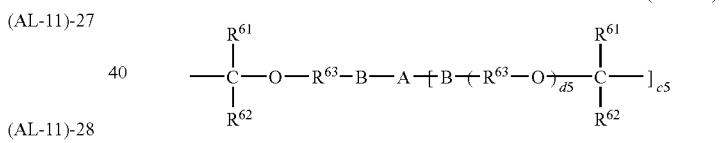

Herein $R^{61}$ and $R^{62}$ each are hydrogen or a straight, branched or cyclic $C_1$-$C_8$ alkyl group, or $R^{61}$ and $R^{62}$, taken together, may form a ring with the carbon atom to which they are attached, and $R^{61}$ and $R^{62}$ are straight or branched $C_1$-$C_8$ alkylene groups when they form a ring. $R^{63}$ is a straight, branched or cyclic $C_1$-$C_{10}$ alkylene group. Each of b5 and d5 is 0 or an integer of 1 to 10, preferably 0 or an integer of 1 to 5, and c5 is an integer of 1 to 7. "A" is a (c5+1)-valent aliphatic or alicyclic saturated hydrocarbon group, aromatic hydrocarbon group or heterocyclic group having 1 to 50 carbon atoms, which may be separated by a heteroatom such as oxygen, sulfur or nitrogen or in which some of the hydrogen atoms attached to carbon atoms may be substituted by hydroxyl, carboxyl, carbonyl groups or fluorine atoms. "B" is —CO—O—, —NHCO—O— or —NHCONH—.

Preferably, "A" is selected from divalent to tetravalent, straight, branched or cyclic $C_1$-$C_{20}$ alkylene, alkanetriyl and alkanetetrayl groups, and $C_6$-$C_{30}$ arylene groups, which may be separated by a heteroatom such as oxygen, sulfur or nitrogen or in which some of the hydrogen atoms attached to carbon atoms may be substituted by hydroxyl, carboxyl, acyl groups or halogen atoms. The subscript c5 is preferably an integer of 1 to 3.

The crosslinking acetal groups of formulae (AL-11a) and (AL-11b) are exemplified by the following formulae (AL-11)-35 through (AL-11)-42.
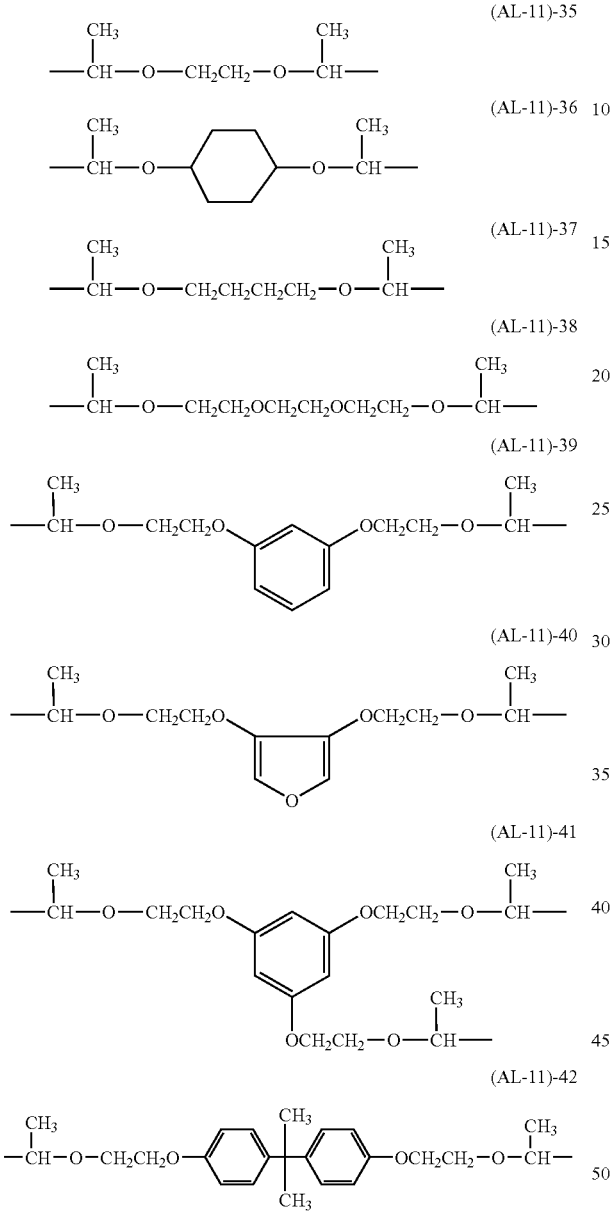
Illustrative examples of the tertiary alkyl of formula (AL-12) include tert-butyl, triethylcarbyl, 1-ethylnorbornyl, 1-methylcyclohexyl, 1-ethylcyclopentyl, and tert-amyl groups as well as those of (AL-12)-1 to (AL-12)-16.
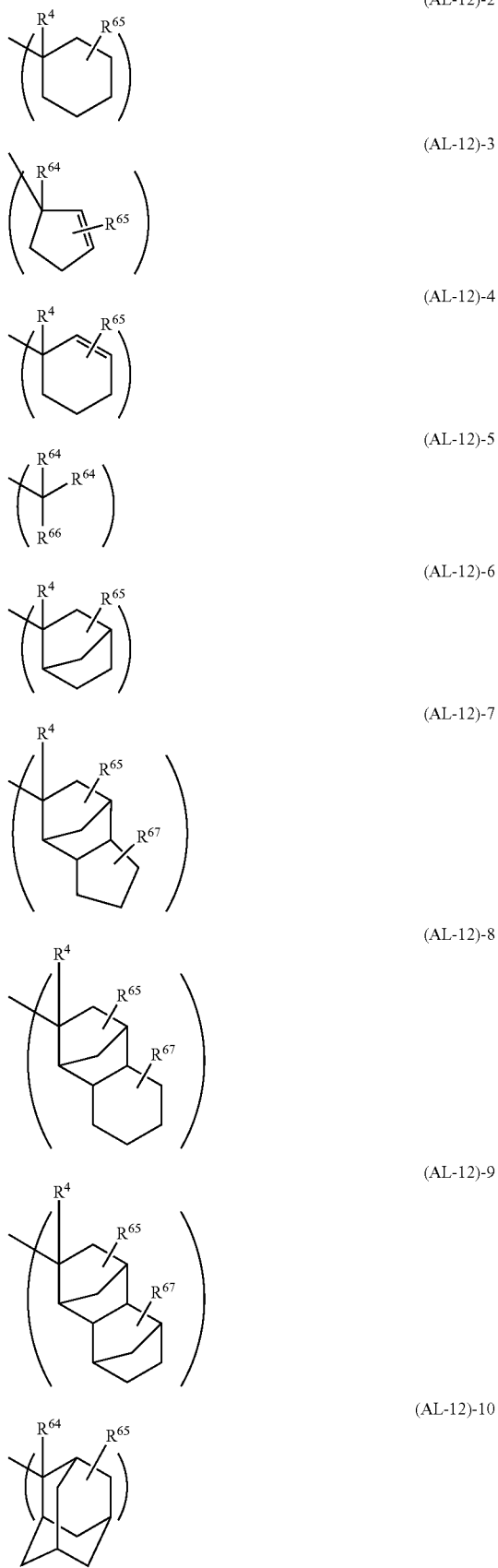

-continued (AL-12)-11
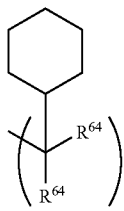

(AL-12)-12
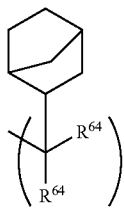

(AL-12)-13
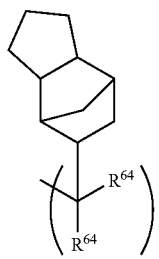

(AL-12)-14
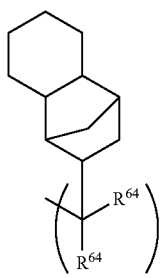

(AL-12)-15
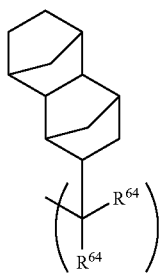

(AL-12)-16
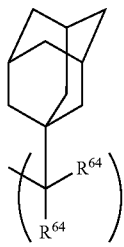

Herein $R^{64}$ is independently a straight, branched or cyclic $C_1$-$C_8$ alkyl group, $C_6$-$C_{20}$ aryl group or $C_7$-$C_{20}$ aralkyl group; $R^{65}$ and $R^{67}$ each are hydrogen or a straight, branched or cyclic $C_1$-$C_{20}$ alkyl group; and $R^{66}$ is a $C_6$-$C_{20}$ aryl group or $C_7$-$C_{20}$ aralkyl group.

With $R^{68}$ representative of a di- or more valent alkylene or arylene group included as shown in formulae (AL-12)-17 and (AL-12)-18, the polymer may be crosslinked within the molecule or between molecules. In formulae (AL-12)-17 and (AL-12)-18, $R^{64}$ is as defined above; $R^{68}$ is a straight, branched or cyclic $C_1$-$C_{20}$ alkylene group or arylene group, which may contain a heteroatom such as oxygen, sulfur or nitrogen; and b6 is an integer of 1 to 3.

(AL-12)-17
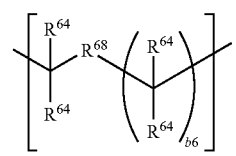

(AL-12)-18
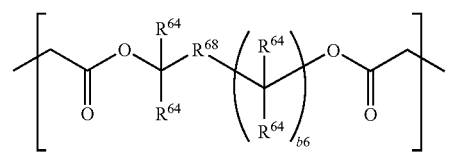

The groups represented by $R^{64}$, $R^{65}$, $R^{66}$ and $R^{67}$ may contain a heteroatom such as oxygen, nitrogen or sulfur. Such groups are exemplified by those of the following formulae (AL-13)-1 to (AL-13)-7.

(AL-13)-1  —(CH$_2$)$_4$OH (AL-13)-2  —(CH$_2$)$_2$O(CH$_2$)$_3$CH$_3$ (AL-13)-3  —CH$_2$—⌬—CH$_2$OH (AL-13)-4  —(CH$_2$)$_2$O(CH$_2$)$_2$OH (AL-13)-5  —(CH$_2$)$_6$OH (AL-13)-6  
—CH$_2$—[cyclic carbonate]

(AL-13)-7  
—CH$_2$—[γ-butyrolactone]

Of the acid labile groups of formula (AL-12), recurring units having an exo-form structure represented by the formula (AL-12)-19 are preferred.

(AL-12)-19
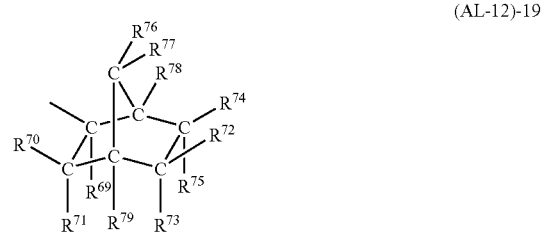

Herein, $R^{69}$ is a straight, branched or cyclic $C_1$-$C_8$ alkyl group or a substituted or unsubstituted $C_6$-$C_{20}$ aryl group; $R^{70}$ to $R^{75}$, $R^{78}$ and $R^{79}$ are each independently hydrogen or a monovalent hydrocarbon group, typically alkyl, of 1 to 15 carbon atoms which may contain a heteroatom; and $R^{76}$ and $R^{77}$ are hydrogen. Alternatively, a pair of $R^{70}$ and $R^{71}$, $R^{72}$ and $R^{74}$, $R^{72}$ and $R^{75}$, $R^{73}$ and $R^{75}$, $R^{73}$ and $R^{79}$, $R^{74}$ and $R^{78}$, $R^{76}$ and $R^{77}$ or $R^{77}$ and $R^{78}$, taken together, may form a ring, specifically aliphatic ring, and in this case, each R is a divalent hydrocarbon group, typically alkylene, of 1 to 15 carbon atoms which may contain a heteroatom. Also, a pair of $R^{70}$ and $R^{79}$, $R^{76}$ and $R^{79}$, or $R^{72}$ and $R^{74}$ which are attached to vicinal carbon atoms may bond together directly to form a double bond. The formula also represents an enantiomer.

The ester form monomers from which recurring units having an exo-form structure represented by the formula (AL-12)-19:

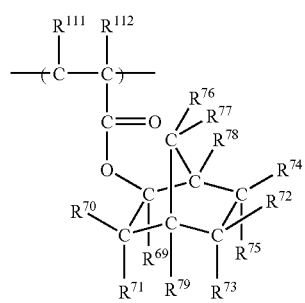

are derived are described in U.S. Pat. No. 6,448,420 (JP-A 2000-327633). It is noted that $R^{111}$ and $R^{112}$ are each independently hydrogen, methyl, —COOCH$_3$, —CH$_2$COOCH$_3$ or the like. Illustrative non-limiting examples of suitable monomers are given below.

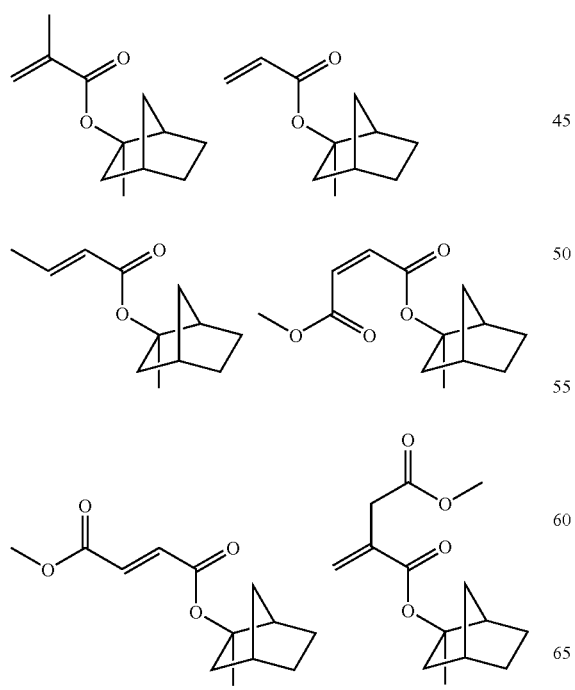

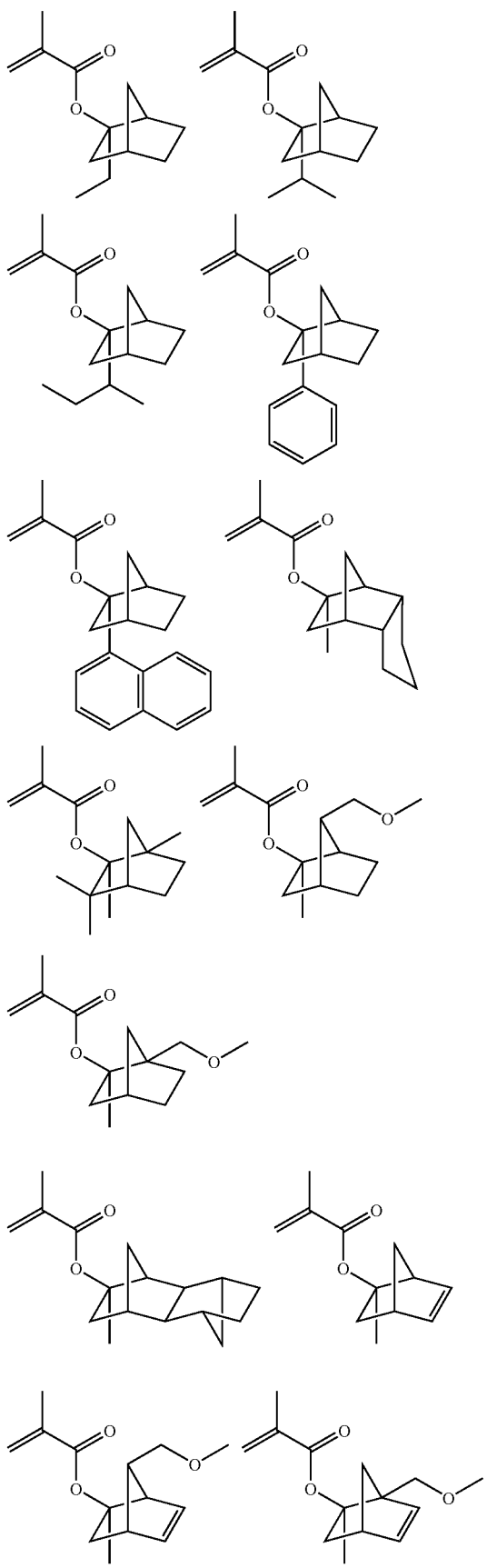

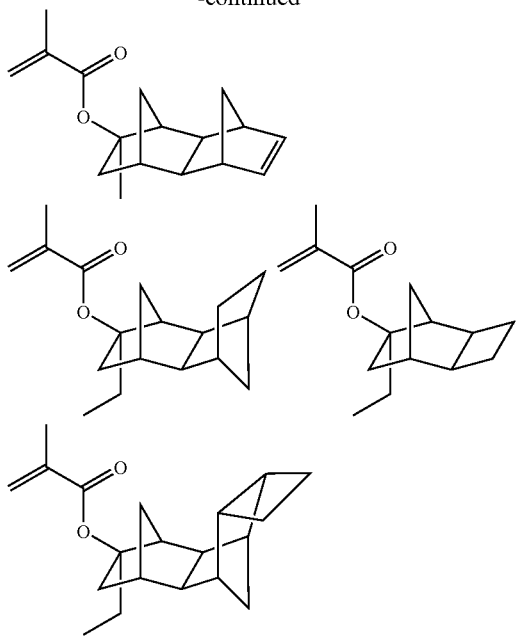

Also included in the acid labile groups of formula (AL-12) are acid labile groups having furandiyl, tetrahydrofurandiyl or oxanorbornanediyl as represented by the following formula (AL-12)-20.

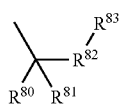
(AL-12)-20

Herein, $R^{80}$ and $R^{81}$ are each independently a monovalent hydrocarbon group, typically a straight, branched or cyclic $C_1$-$C_{10}$ alkyl. $R^{80}$ and $R^{81}$, taken together, may form an aliphatic hydrocarbon ring of 3 to 20 carbon atoms with the carbon atom to which they are attached. $R^{82}$ is a divalent group selected from furandiyl, tetrahydrofurandiyl and oxanorbornanediyl. $R^{83}$ is hydrogen or a monovalent hydrocarbon group, typically a straight, branched or cyclic $C_1$-$C_{10}$ alkyl, which may contain a heteroatom.

Examples of the monomers from which the recurring units substituted with acid labile groups having furandiyl, tetrahydrofurandiyl and oxanorbornanediyl as represented by the formula:

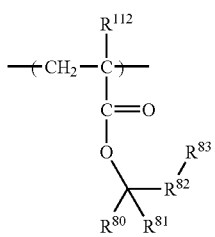

(wherein $R^{80}$ to $R^{83}$, and $R^{112}$ are as defined above) are derived are shown below. Note that Me is methyl and Ac is acetyl.

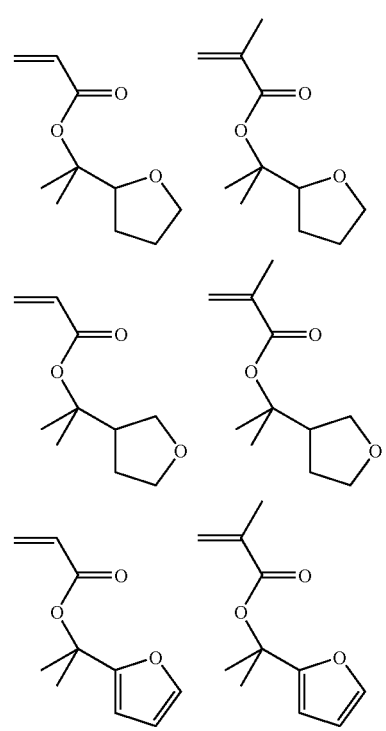

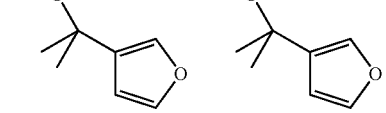

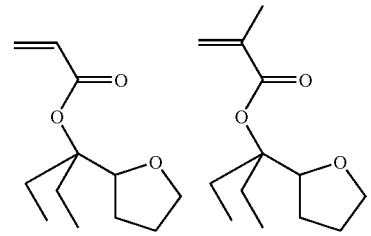

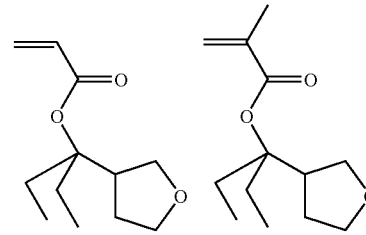

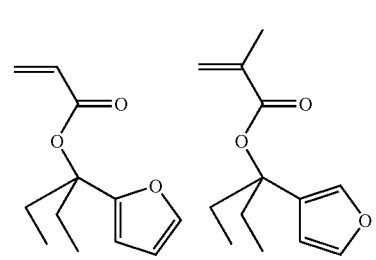

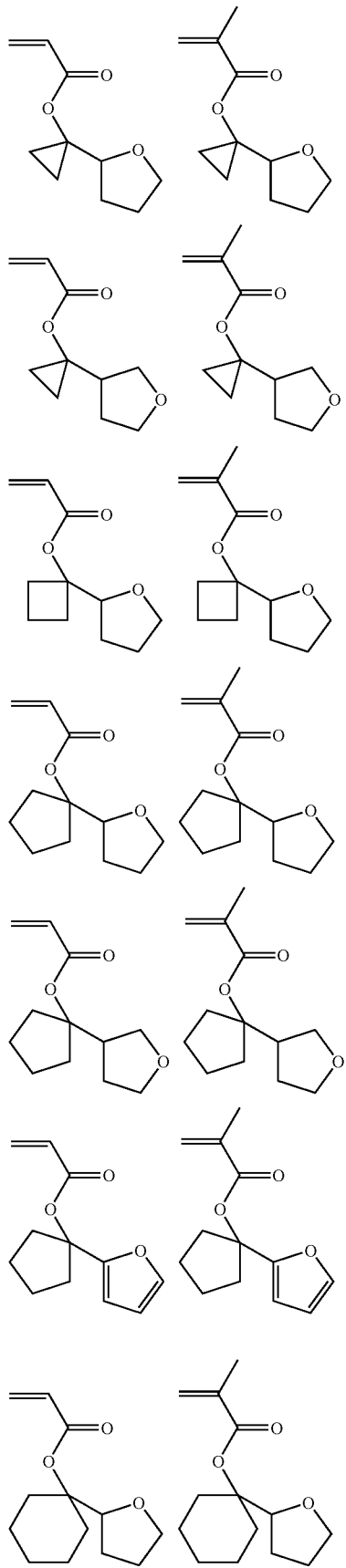
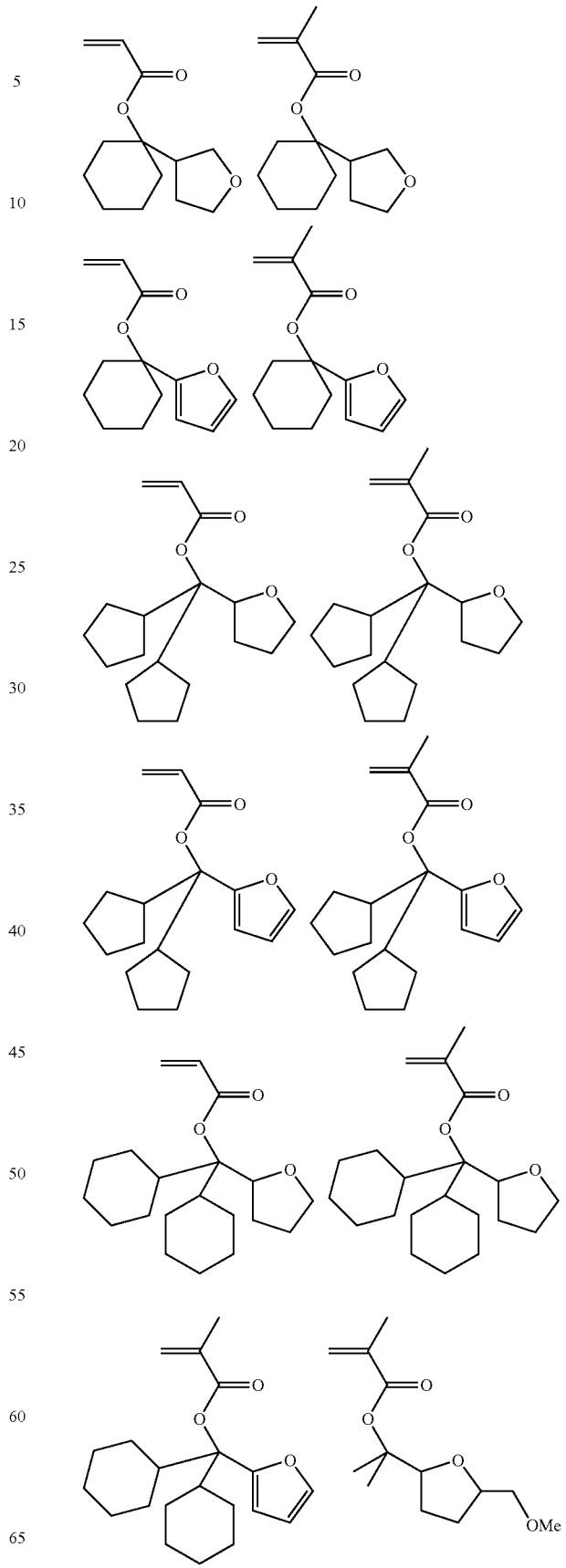

-continued

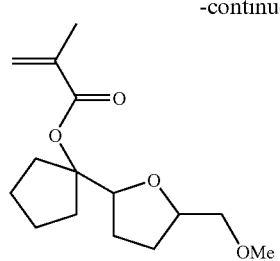
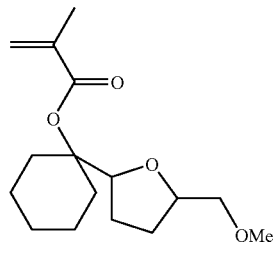
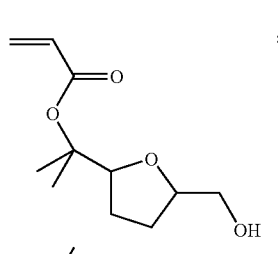
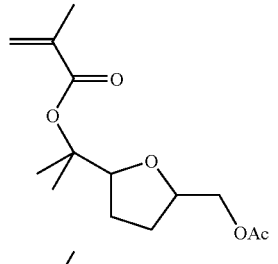
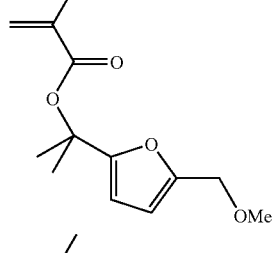
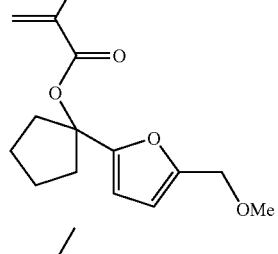
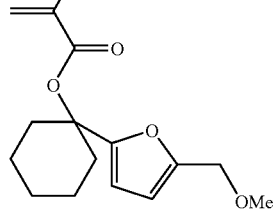

-continued

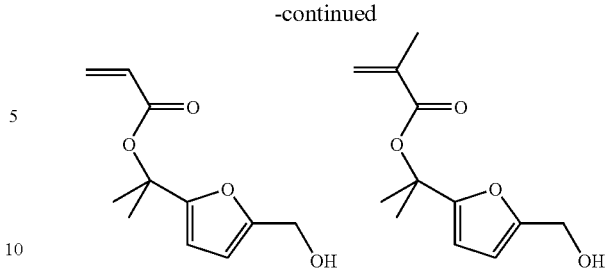
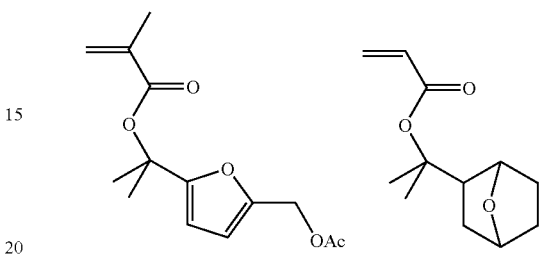
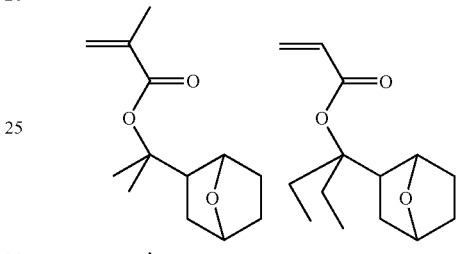
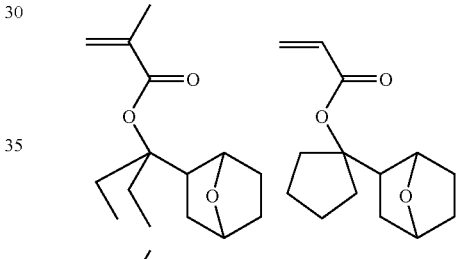
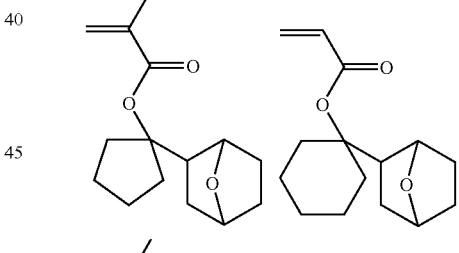
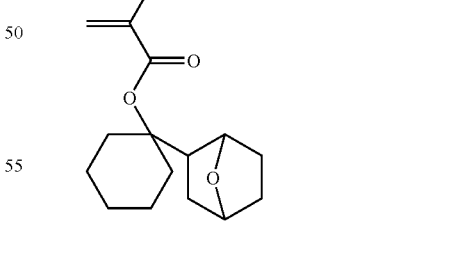
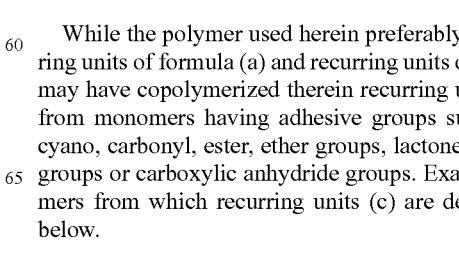

While the polymer used herein preferably includes recurring units of formula (a) and recurring units of formula (b), it may have copolymerized therein recurring units (c) derived from monomers having adhesive groups such as hydroxy, cyano, carbonyl, ester, ether groups, lactone rings, carbonyl groups or carboxylic anhydride groups. Examples of monomers from which recurring units (c) are derived are given below.

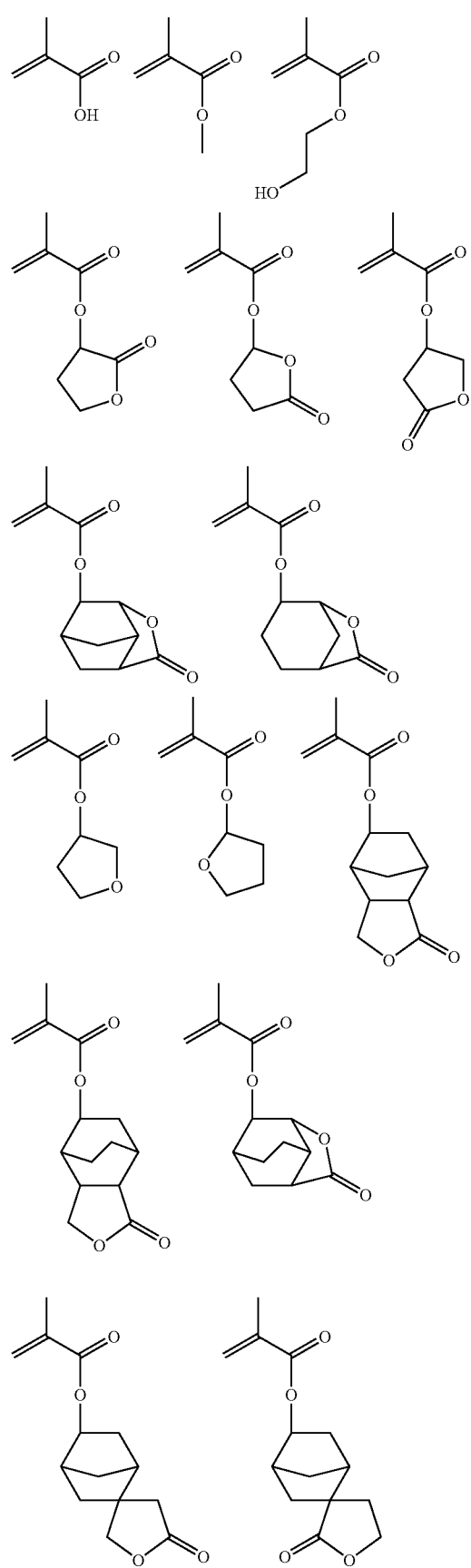
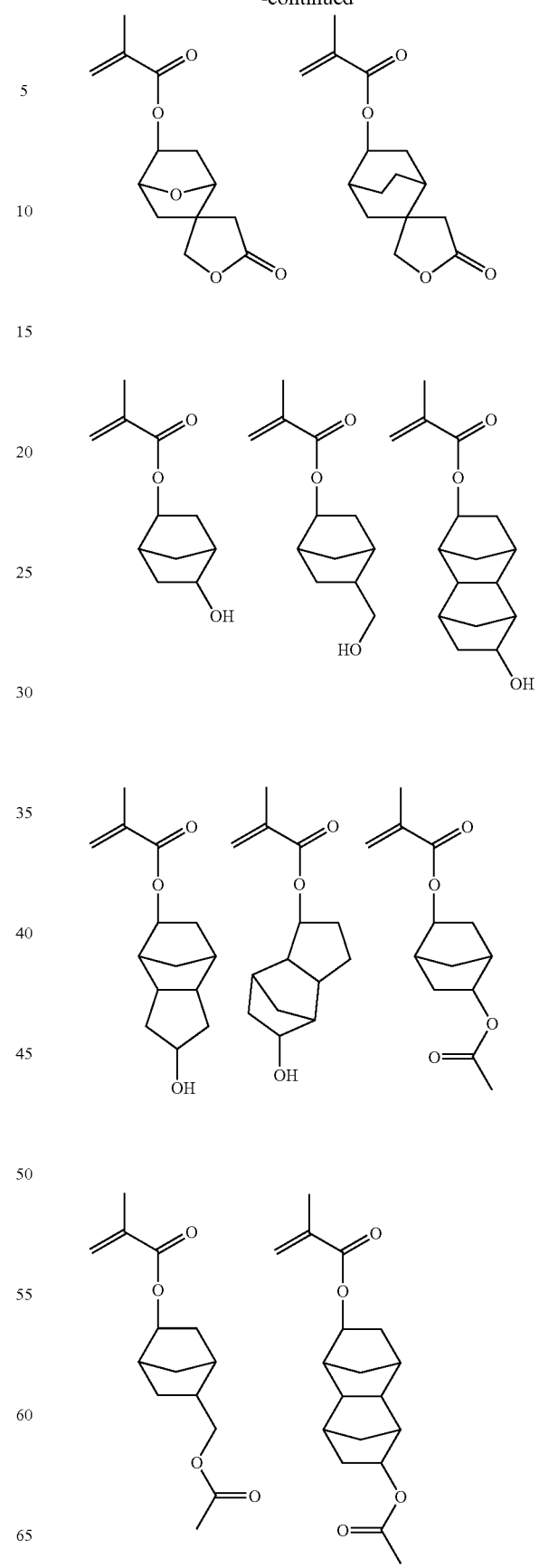

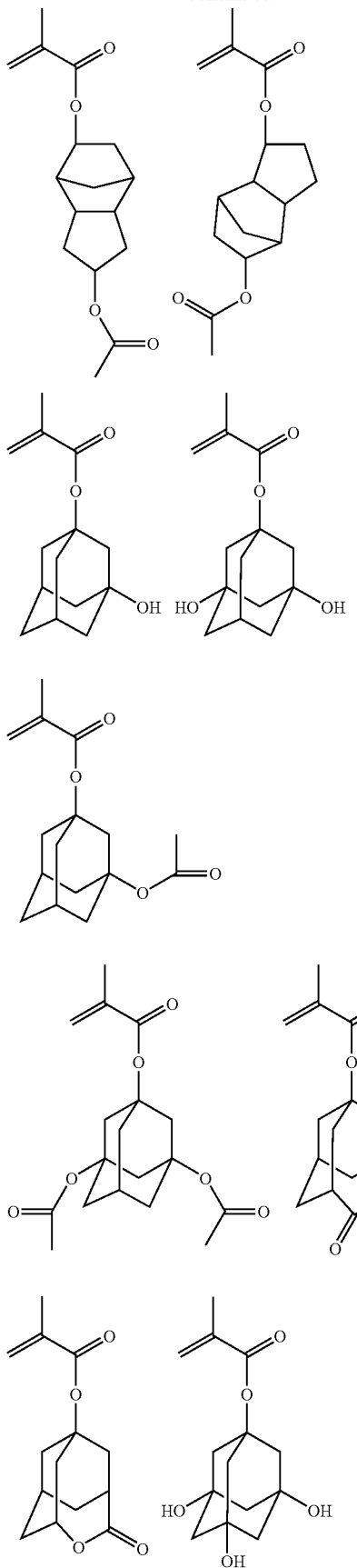
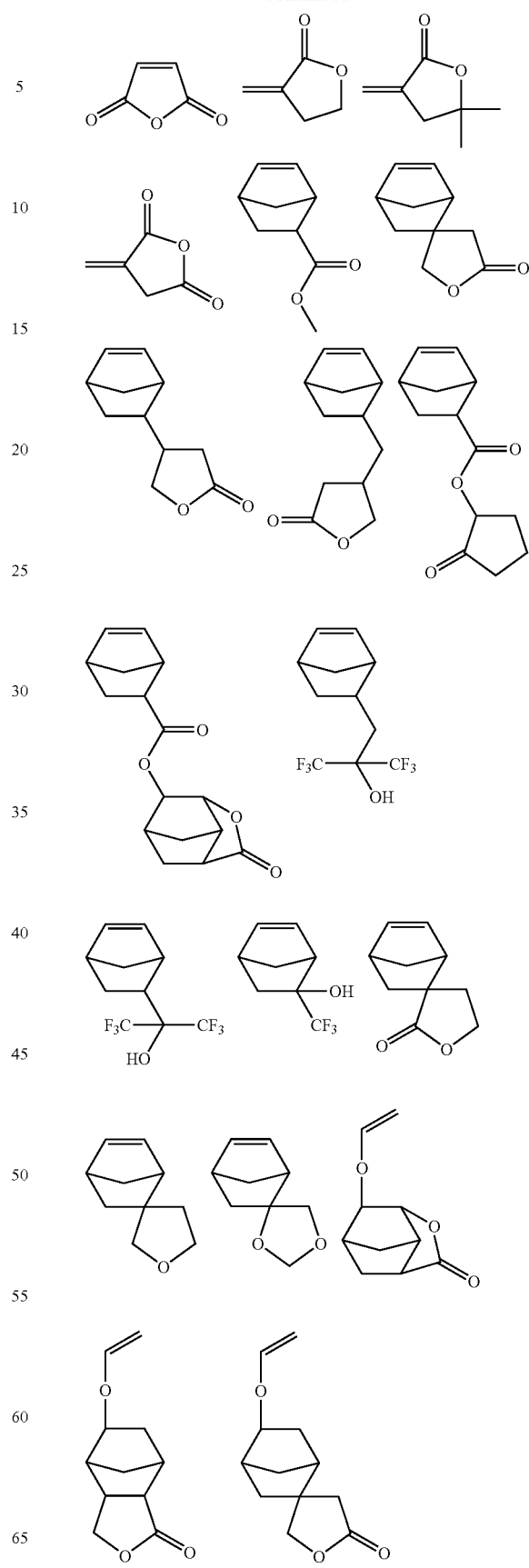

-continued
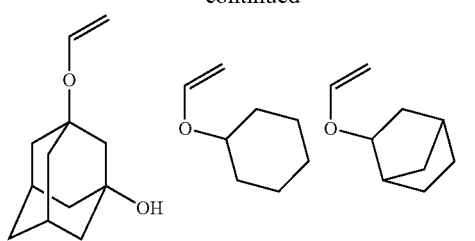
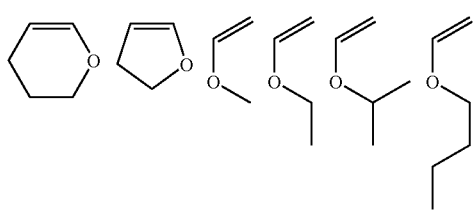
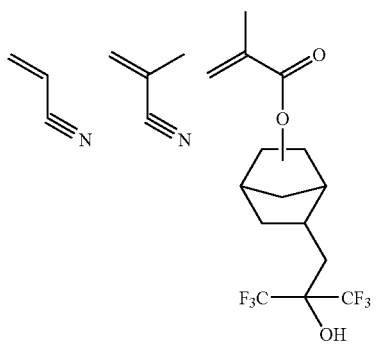
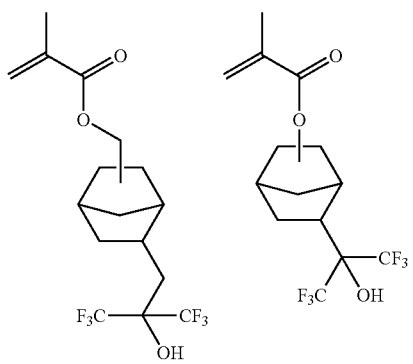
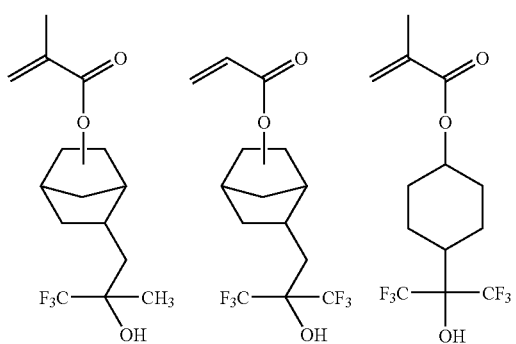
-continued
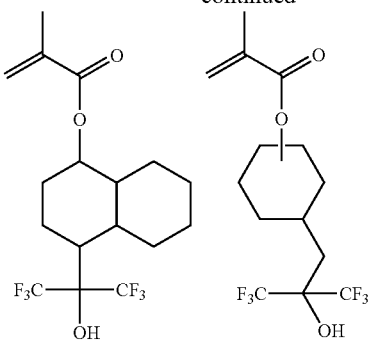
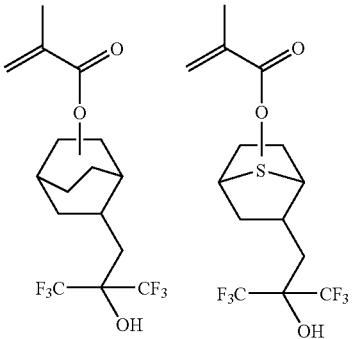
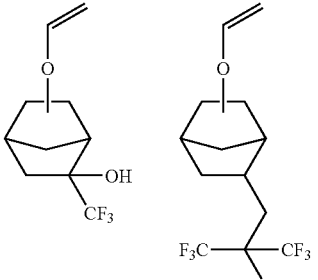
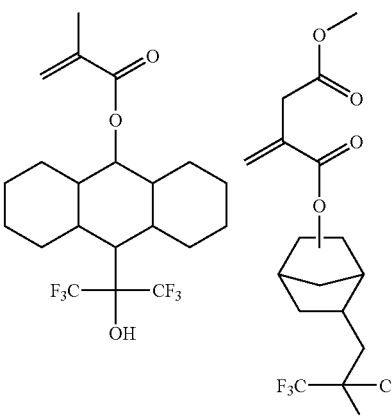
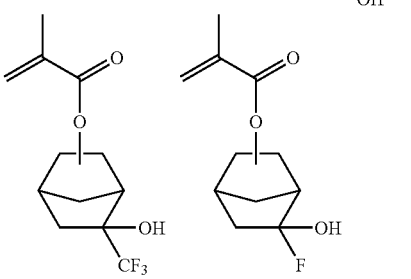

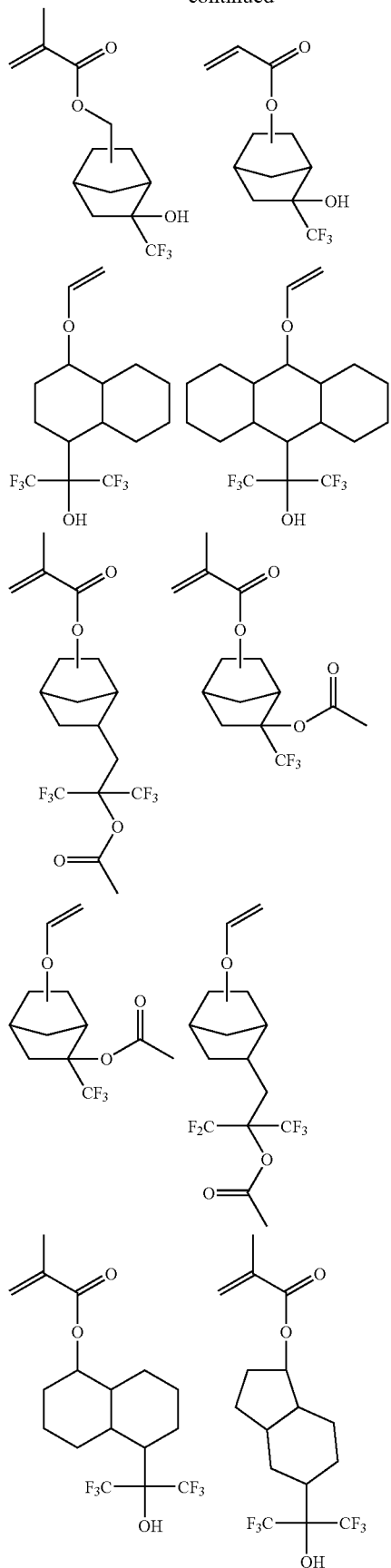
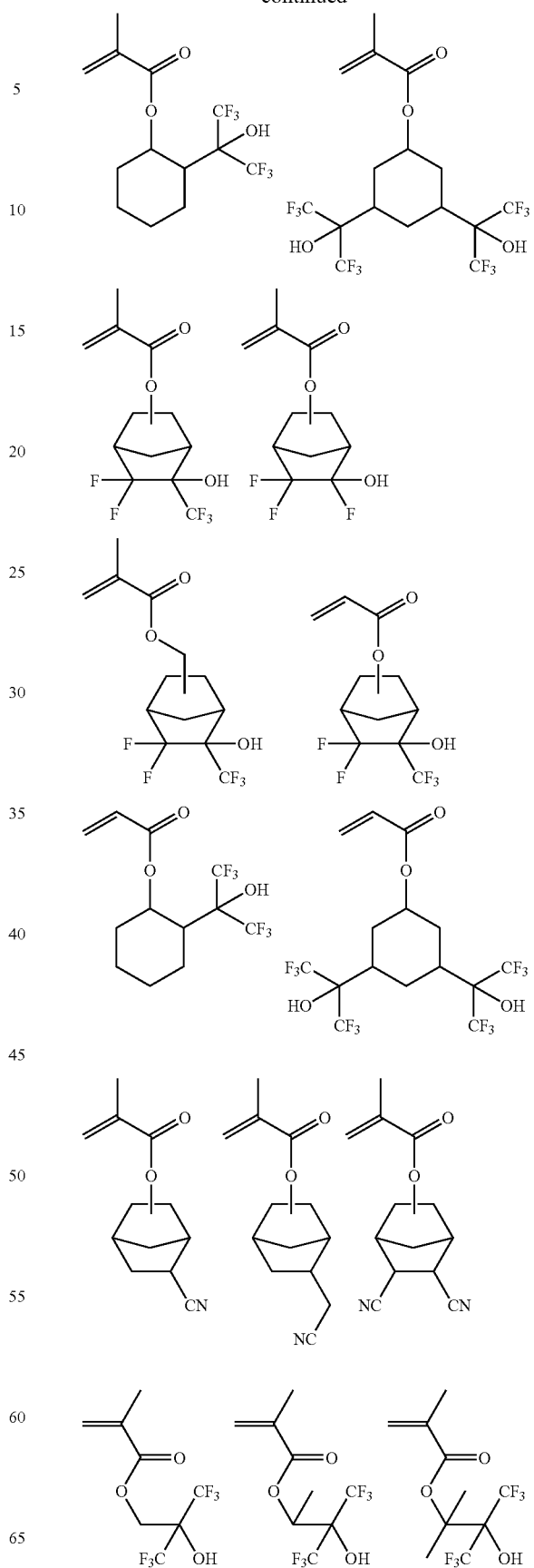

47
-continued
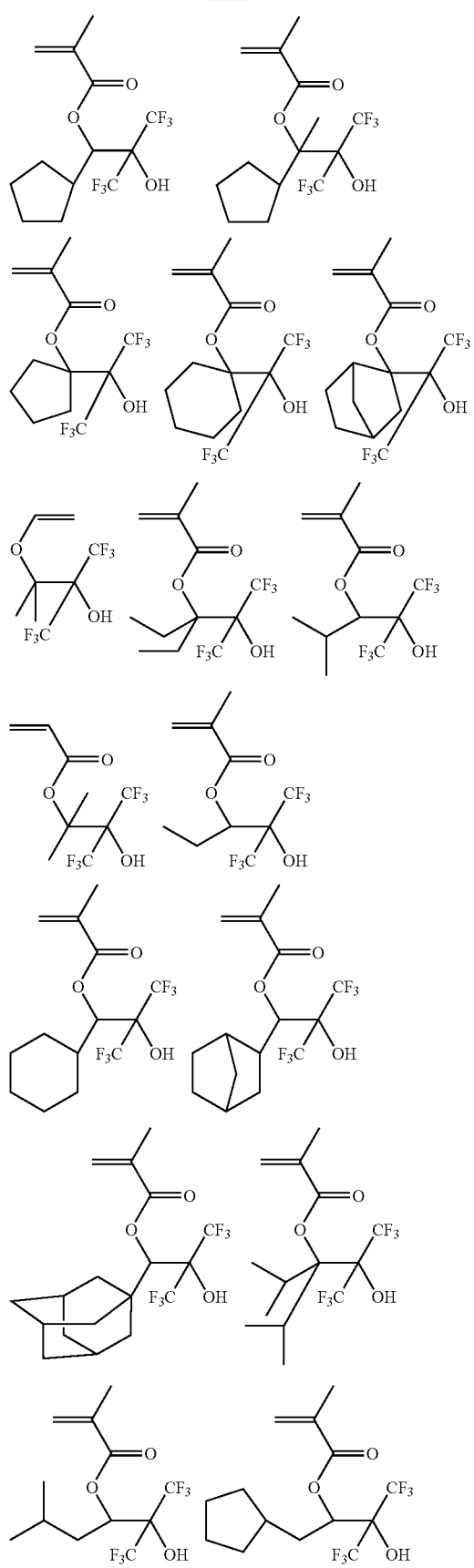
48
-continued
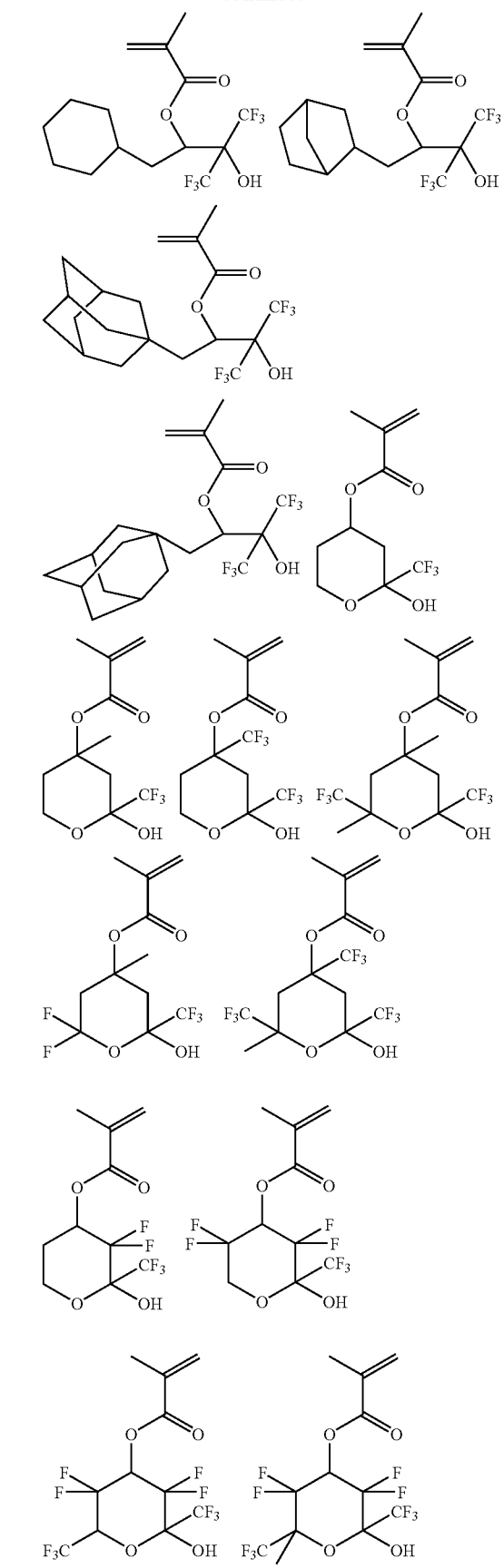

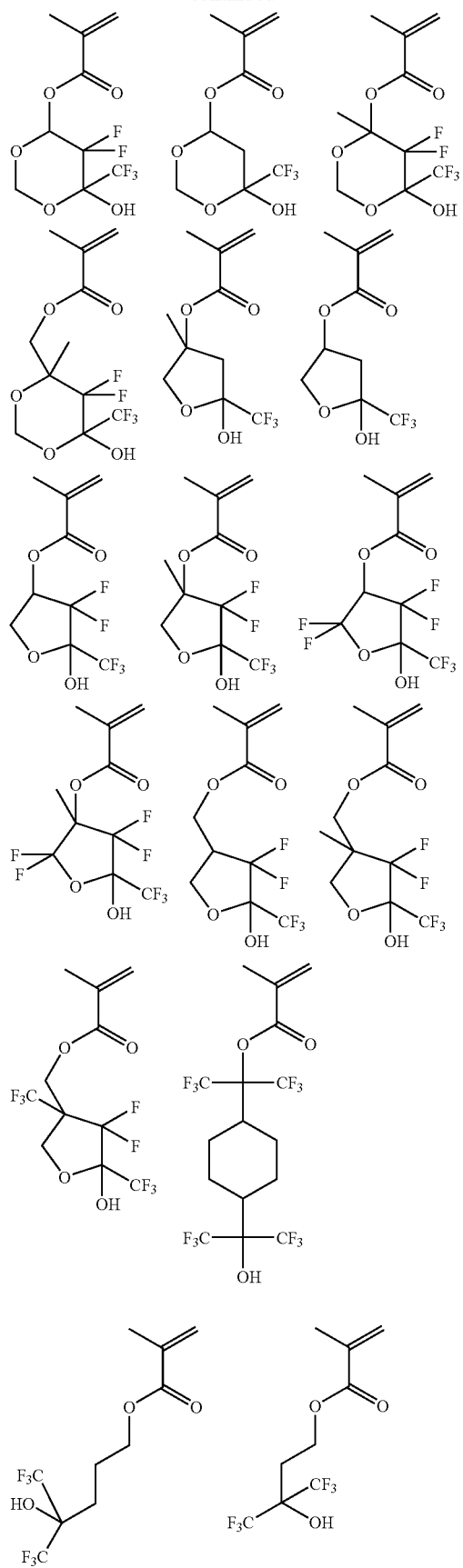
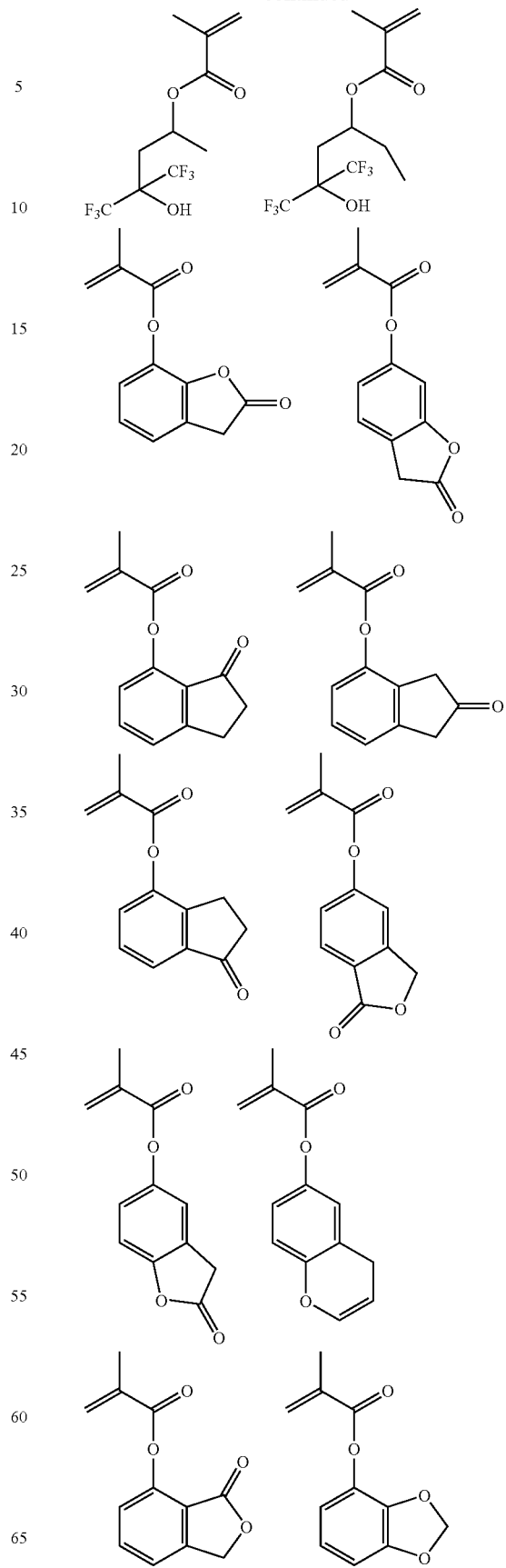

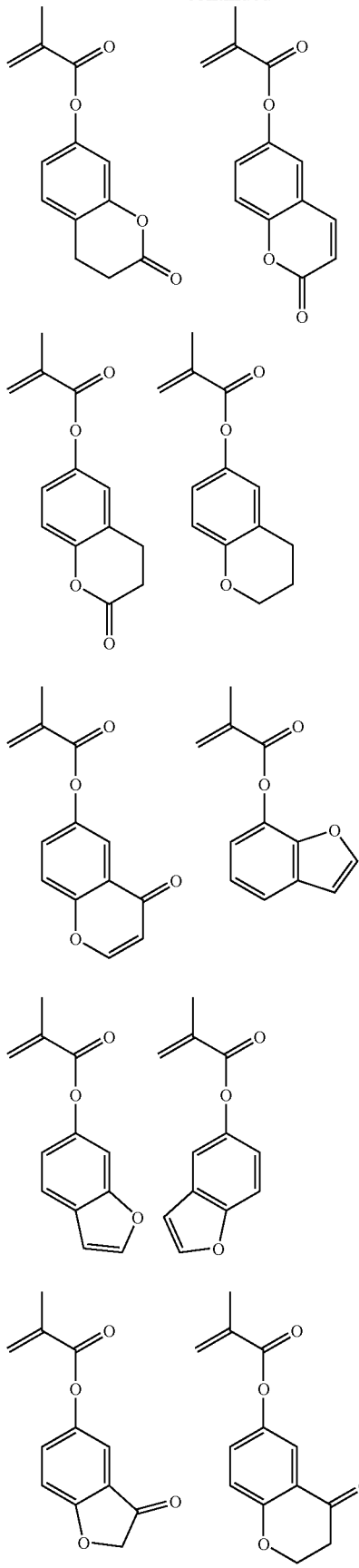
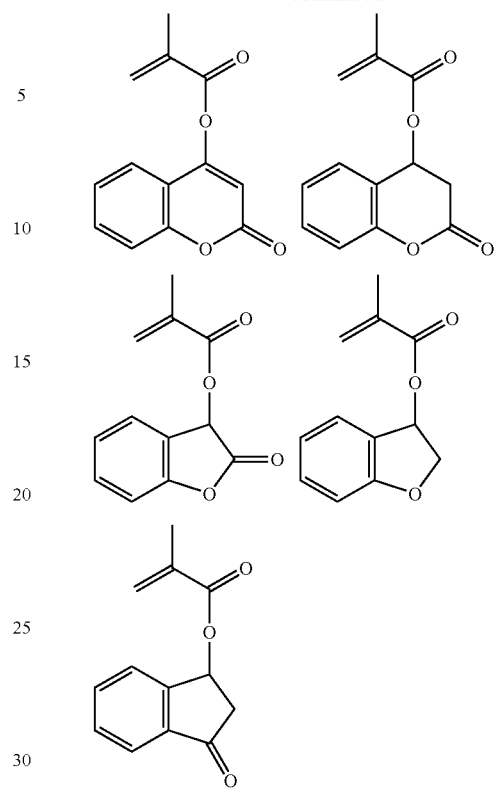
Of the recurring units (c), those having an α-trifluoromethyl alcohol group or carboxyl group are preferably incorporated in copolymers because they improve the alkali dissolution rate of the developed pattern after heating. Examples of recurring units having a carboxyl group are given below.
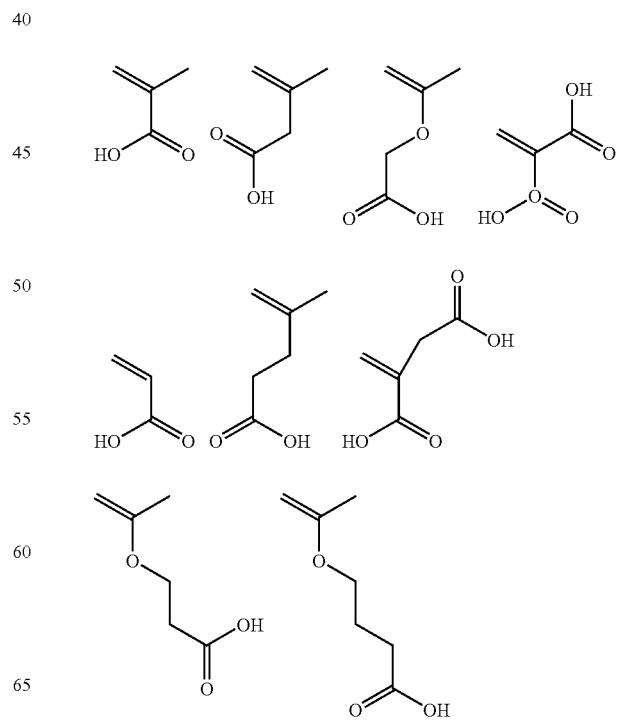

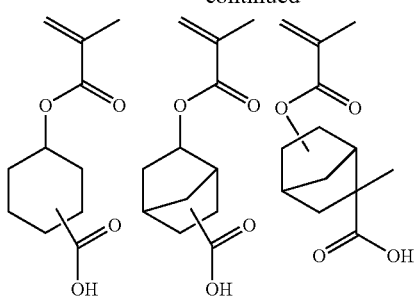
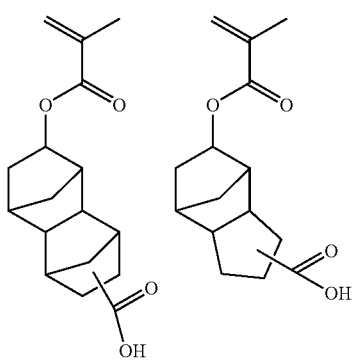
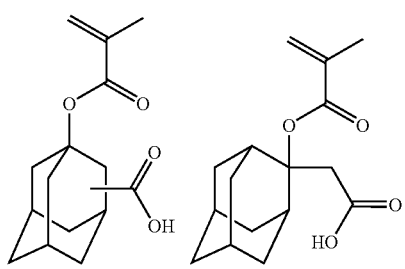
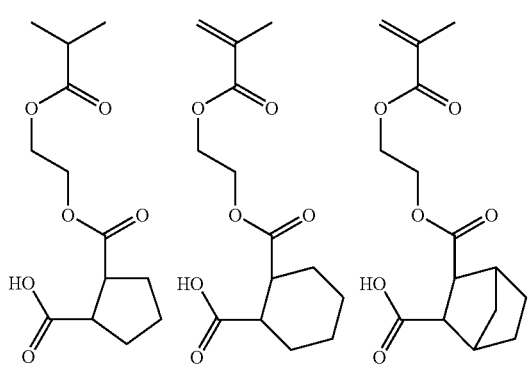
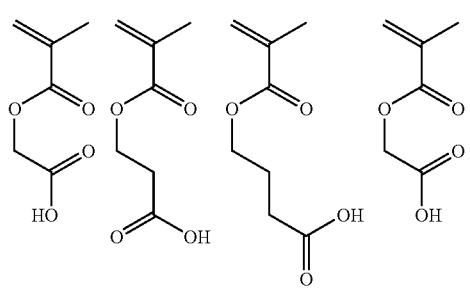
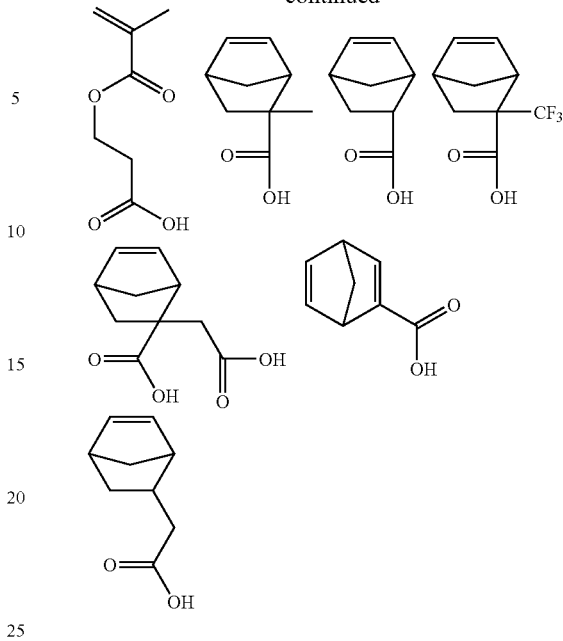

In the polymer of the invention, the recurring units (a), (b) and (c) are present in proportions a, b, and c, respectively, which satisfy the range: $0 \leq a < 1.0$, $0 < b \leq 0.8$, $0.1 \leq a+b \leq 1.0$, $0 \leq c < 1.0$, and preferably the range: $0.1 \leq a \leq 0.9$, $0.1 \leq b \leq 0.7$, $0.2 \leq a+b \leq 1.0$, and $0 \leq c \leq 0.9$, provided that $a+b+c=1$.

It is noted that the meaning of $a+b=1$ is that in a polymer comprising recurring units (a) and (b), the sum of recurring units (a) and (b) is 100 mol % based on the total amount of entire recurring units. The meaning of $a+b<1$ is that the sum of recurring units (a) and (b) is less than 100 mol % based on the total amount of entire recurring units, indicating the inclusion of other recurring units, for example, units (c).

The polymer serving as the base resin in the resist material used in the pattern forming process of the invention should preferably have a weight average molecular weight (Mw) in the range of 1,000 to 500,000, and more preferably 2,000 to 30,000, as measured by gel permeation chromatography (GPC) using polystyrene standards. With too low a Mw, the efficiency of thermal crosslinking in the resist material after development may become low. With too high a Mw, the polymer may lose alkali solubility and give rise to a footing phenomenon after pattern formation.

If a polymer has a wide molecular weight distribution or dispersity (Mw/Mn), which indicates the presence of lower and higher molecular weight polymer fractions, there is a possibility that foreign matter is left on the pattern or the pattern profile is degraded. The influences of molecular weight and dispersity become stronger as the pattern rule becomes finer. Therefore, the multi-component copolymer should preferably have a narrow dispersity (Mw/Mn) of 1.0 to 2.0, especially 1.0 to 1.5, in order to provide a resist composition suitable for micropatterning to a small feature size.

It is understood that a blend of two or more polymers which differ in compositional ratio, molecular weight or dispersity is acceptable.

The polymer as used herein may be synthesized by any desired method, for example, by dissolving unsaturated bond-containing monomers corresponding to the respective units (a), (b) and (c) in an organic solvent, adding a radical initiator thereto, and effecting heat polymerization. Examples of the organic solvent which can be used for polymerization include toluene, benzene, tetrahydrofuran, diethyl ether and dioxane. Examples of the polymerization initiator used herein include 2,2'-azobisisobutyronitrile (AIBN), 2,2'-azobis(2,4-dimethylvaleronitrile), dimethyl 2,2-azobis(2-methylpropionate), benzoyl peroxide, and lauroyl peroxide. Preferably the system is heated at 50 to 80° C. for polymerization to take place. The reaction time is 2 to 100 hours, preferably 5 to 20 hours. The acid labile group that has been incorporated in the monomers may be kept as such, or the acid labile group may be once removed with an acid catalyst and thereafter protected or partially protected.

As described previously, the pattern forming process of the invention comprises the steps of coating the positive resist composition described above onto a substrate, prebaking the resist composition to form a resist film, exposing a selected portion of the resist film to high-energy radiation, post-exposure heating, and developing the resist film with an alkaline developer to dissolve the exposed area thereof to form a resist pattern such as a dot pattern. Thereafter, the resist pattern (area unexposed to high-energy radiation) is treated so as to generate acid, thereby eliminating acid labile groups from the polymer (i.e., deprotection) and inducing crosslinking in the polymer. In this deprotected and crosslinked state, the polymer has a dissolution rate in excess of 2 nm/sec, preferably of 3 to 5,000 nm/sec, and more preferably 4 to 4,000 nm/sec in an alkaline developer. It is preferred in attaining the objects of the invention that the dissolution rate of the polymer is higher than the dissolution rate of the reversal film in the same alkaline developer by a factor of 2 to 250,000, and especially 5 to 10,000.

In order that the polymer have a desired dissolution rate in the deprotected and crosslinked state, the polymer formulation is preferably designed such that the acid labile group-bearing recurring units of formula (b) account for 10 mol % to 90 mol %, and more preferably 12 mol % to 80 mol % of the entire recurring units.

Resist Composition

The resist composition, specifically chemically amplified positive resist composition, used in the pattern forming process of the invention may comprise an organic solvent, a compound capable of generating an acid in response to high-energy radiation (known as "acid generator"), and optionally, a dissolution inhibitor, a basic compound, a surfactant, and other components.

Solvent

The organic solvent used herein may be any organic solvent in which the base resin, acid generator, and other components are soluble. Illustrative, non-limiting, examples of the organic solvent include ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone. These solvents may be used alone or in combinations of two or more thereof. Of the above organic solvents, diethylene glycol dimethyl ether, 1-ethoxy-2-propanol and propylene glycol monomethyl ether acetate, and mixtures thereof are preferred because the acid generator is most soluble therein.

The organic solvent is preferably used in an amount of about 200 to 3,000 parts by weight, more preferably about 400 to 2,000 parts by weight per 100 parts by weight of the base resin.

Acid Generator

The acid generators used herein include the following:
(i) onium salts of the formula (P1a-1), (P1a-2), (P1a-3) or (P1b),
(ii) diazomethane derivatives of the formula (P2),
(iii) glyoxime derivatives of the formula (P3),
(iv) bissulfone derivatives of the formula (P4),
(v) sulfonic acid esters of N-hydroxyimide compounds of the formula (P5),
(vi) β-ketosulfonic acid derivatives,
(vii) disulfone derivatives,
(viii) nitrobenzylsulfonate derivatives, and
(ix) sulfonate derivatives.

These acid generators are described in detail.
(i) Onium Salts of Formula (P1a-1), (P1a-2) and (P1a-3):

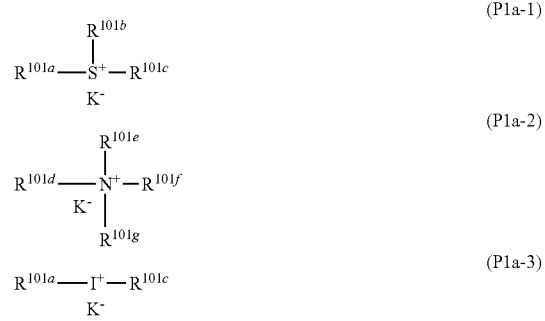

Herein, $R^{101a}$, $R^{101b}$, and $R^{101c}$ independently represent straight, branched or cyclic alkyl, alkenyl, oxoalkyl or oxoalkenyl groups of 1 to 12 carbon atoms, aryl groups of 6 to 20 carbon atoms, or aralkyl or aryloxoalkyl groups of 7 to 12 carbon atoms, wherein some or all of the hydrogen atoms may be replaced by alkoxy or other groups. Also, $R^{101b}$ and $R^{101c}$, taken together, may form a ring with the sulfur or iodine atom to which they are attached. $R^{101b}$ and $R^{101c}$ each are alkylene groups of 1 to 6 carbon atoms when they form a ring. $K^-$ is a sulfonate in which at least one alpha-position is fluorinated, or a perfluoroalkylimidate or perfluoroalkylmethidate. $R^{101d}$, $R^{101e}$, $R^{101f}$, and $R^{101g}$ stand for hydrogen atoms, straight, branched or cyclic alkyl, alkenyl, oxoalkyl or oxoalkenyl groups of 1 to 12 carbon atoms, aryl groups of 6 to 20 carbon atoms, or aralkyl or aryloxoalkyl groups of 7 to 12 carbon atoms, wherein some or all of the hydrogen atoms may be replaced by alkoxy groups. A pair of $R^{101d}$ and $R^{101e}$ or a combination of $R^{101d}$, $R^{101e}$ and $R^{101f}$ may form a ring with the nitrogen atom to which they are attached, and each of $R^{101d}$ and $R^{101e}$ or each of $R^{101d}$, $R^{101e}$ and $R^{101f}$ is an alkylene group of 3 to 10 carbon atoms or a hetero-aromatic ring having the nitrogen atom (in the formula) incorporated therein, when they form a ring.

Of the onium salts having formulae (P1a-1), (P1a-2) and (P1a-3), those of formula (P1a-1) function as a photoacid generator, those of formula (P1a-2) function as a thermal acid generator, and those of formula (P1a-3) have both the functions of a photoacid generator and a thermal acid generator. In a system having (P1a-1) combined with (P1a-2), generator (P1-a) generates an acid upon exposure, with which pattern formation is performed, and generator (P1a-2) generates an acid when heated at high temperature after development, with which crosslinking is efficiently performed.

Examples of K⁻ include perfluoroalkanesulfonates such as triflate and nonaflate; imidates such as bis(trifluoromethylsulfonyl)imide, bis(perfluoroethylsulfonyl)imide, and bis(perfluorobutylsulfonyl)imide; methidates such as tris(trifluoromethylsulfonyl)methide and tris(perfluoroethylsulfonyl)methide; sulfonates having fluorine substituted at α-position as represented by of the general formula (K-1) and sulfonates having fluorine substituted at α-position as represented by of the general formula (K-2).

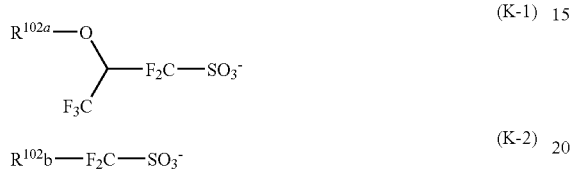

In formula (K-1), $R^{102a}$ is a hydrogen atom, or a straight, branched or cyclic $C_1$-$C_{20}$ alkyl or acyl group, $C_2$-$C_{20}$ alkenyl group, or $C_6$-$C_{20}$ aryl or aryloxy group, which may have an ether group, ester group, carbonyl group or lactone ring, or in which some or all hydrogen atoms may be substituted by fluorine atoms. In formula (K-2), $R^{102b}$ is a hydrogen atom, or a straight, branched or cyclic $C_1$-$C_{20}$ alkyl group, $C_2$-$C_{20}$ alkenyl group, or $C_6$-$C_{20}$ aryl group.

$R^{101a}$, $R^{101b}$, and $R^{101c}$ may be the same or different and are illustrated below. Exemplary alkyl groups include methyl, ethyl, propyl, isopropyl, n-butyl, sec-butyl, tert-butyl, pentyl, hexyl, heptyl, octyl, cyclopentyl, cyclohexyl, cycloheptyl, cyclopropylmethyl, 4-methylcyclohexyl, cyclohexylmethyl, norbornyl, and adamantyl. Exemplary alkenyl groups include vinyl, allyl, propenyl, butenyl, hexenyl, and cyclohexenyl. Exemplary oxoalkyl groups include 2-oxocyclopentyl and 2-oxocyclohexyl as well as 2-oxopropyl, 2-cyclopentyl-2-oxoethyl, 2-cyclohexyl-2-oxoethyl, and 2-(4-methylcyclohexyl)-2-oxoethyl. Exemplary oxoalkenyl groups include 2-oxo-4-cyclohexenyl and 2-oxo-4-propenyl. Exemplary aryl groups include phenyl and naphthyl; alkoxyphenyl groups such as p-methoxyphenyl, m-methoxyphenyl, o-methoxyphenyl, ethoxyphenyl, p-tert-butoxyphenyl, and m-tert-butoxyphenyl; alkylphenyl groups such as 2-methylphenyl, 3-methylphenyl, 4-methylphenyl, ethylphenyl, 4-tert-butylphenyl, 4-butylphenyl, and dimethylphenyl; alkylnaphthyl groups such as methylnaphthyl and ethylnaphthyl; alkoxynaphthyl groups such as methoxynaphthyl and ethoxynaphthyl; dialkylnaphthyl groups such as dimethylnaphthyl and diethylnaphthyl; and dialkoxynaphthyl groups such as dimethoxynaphthyl and diethoxynaphthyl. Exemplary aralkyl groups include benzyl, phenylethyl, and phenethyl. Exemplary aryloxoalkyl groups are 2-aryl-2-oxoethyl groups such as 2-phenyl-2-oxoethyl, 2-(1-naphthyl)-2-oxoethyl, and 2-(2-naphthyl)-2-oxoethyl.

Examples of the non-nucleophilic counter ion represented by K⁻ include halide ions such as chloride and bromide ions; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, 1,2,3,4,5-pentafluorobenzenesulfonate; and alkylsulfonate ions such as mesylate and butanesulfonate.

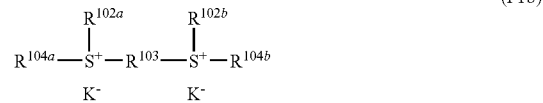

Herein, $R^{102a}$ and $R^{102b}$ independently represent straight, branched or cyclic alkyl groups of 1 to 8 carbon atoms. $R^{103}$ represents a straight, branched or cyclic alkylene group of 1 to 10 carbon atoms. $R^{104a}$ and $R^{104b}$ independently represent 2-oxoalkyl groups of 3 to 7 carbon atoms. K⁻ is a non-nucleophilic counter ion.

Illustrative of the groups represented by $R^{102a}$ and $R^{102b}$ are methyl, ethyl, propyl, isopropyl, n-butyl, sec-butyl, tert-butyl, pentyl, hexyl, heptyl, octyl, cyclopentyl, cyclohexyl, cyclopropylmethyl, 4-methylcyclohexyl, and cyclohexylmethyl. Illustrative of the groups represented by $R^{103}$ are methylene, ethylene, propylene, butylene, pentylene, hexylene, heptylene, octylene, nonylene, 1,4-cyclohexylene, 1,2-cyclohexylene, 1,3-cyclopentylene, 1,4-cyclooctylene, and 1,4-cyclohexanedimethylene. Illustrative of the groups represented by $R^{104a}$ and $R^{104b}$ are 2-oxopropyl, 2-oxocyclopentyl, 2-oxocyclohexyl, and 2-oxocycloheptyl. Illustrative examples of the counter ion represented by K⁻ are the same as exemplified for formulae (P1a-1) and (P1a-2).

(ii) Diazomethane Derivatives of Formula (P2)

Herein, $R^{105}$ and $R^{106}$ independently represent straight, branched or cyclic alkyl or halogenated alkyl groups of 1 to 12 carbon atoms, aryl or halogenated aryl groups of 6 to 20 carbon atoms, or aralkyl groups of 7 to 12 carbon atoms.

Of the groups represented by $R^{105}$ and $R^{106}$, exemplary alkyl groups include methyl, ethyl, propyl, isopropyl, n-butyl, sec-butyl, tert-butyl, pentyl, hexyl, heptyl, octyl, amyl, cyclopentyl, cyclohexyl, cycloheptyl, norbornyl, and adamantyl. Exemplary halogenated alkyl groups include trifluoromethyl, 1,1,1-trifluoroethyl, 1,1,1-trichloroethyl, and nonafluorobutyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary halogenated aryl groups include fluorophenyl, chlorophenyl, and 1,2,3,4,5-pentafluorophenyl. Exemplary aralkyl groups include benzyl and phenethyl.

(iii) Glyoxime Derivatives of Formula (P3)

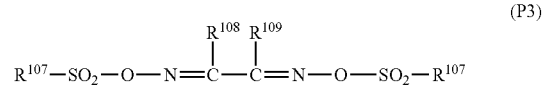

Herein, $R^{107}$, $R^{108}$, and $R^{109}$ independently represent straight, branched or cyclic alkyl or halogenated alkyl groups of 1 to 12 carbon atoms, aryl or halogenated aryl groups of 6 to 20 carbon atoms, or aralkyl groups of 7 to 12 carbon atoms. Also, $R^{108}$ and $R^{109}$, taken together, may form a cyclic structure. $R^{108}$ and $R^{109}$ each are a straight or branched alkylene group of 1 to 6 carbon atoms when they form a cyclic structure. $R^{105}$ is as defined in formula (P2).

Illustrative examples of the alkyl, halogenated alkyl, aryl, halogenated aryl, and aralkyl groups represented by $R^{107}$, $R^{108}$, and $R^{109}$ are the same as exemplified for $R^{105}$ and $R^{106}$. Examples of the alkylene groups represented by $R^{108}$ and $R^{109}$ include methylene, ethylene, propylene, butylene, and hexylene.

(iv) Bissulfone Derivatives of Formula (P4)

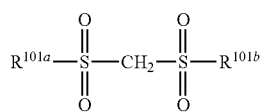

(P4)

Herein, $R^{101a}$ and $R^{101b}$ are as defined above.

(v) Sulfonic Acid Esters of N-hydroxyimide Compounds of Formula (P5)

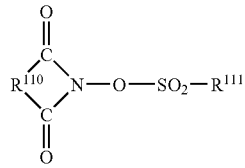

(P5)

Herein, $R^{110}$ is an arylene group of 6 to 10 carbon atoms, alkylene group of 1 to 6 carbon atoms, or alkenylene group of 2 to 6 carbon atoms wherein some or all of the hydrogen atoms may be replaced by straight or branched alkyl or alkoxy groups of 1 to 4 carbon atoms, nitro, acetyl, or phenyl groups. $R^{111}$ is a straight, branched or cyclic alkyl group of 1 to 8 carbon atoms, alkenyl, alkoxyalkyl, phenyl or naphthyl group wherein some or all of the hydrogen atoms may be replaced by alkyl or alkoxy groups of 1 to 4 carbon atoms, phenyl groups (which may have substituted thereon an alkyl or alkoxy of 1 to 4 carbon atoms, nitro, or acetyl group), hetero-aromatic groups of 3 to 5 carbon atoms, or chlorine or fluorine atoms.

Of the groups represented by $R^{110}$, exemplary arylene groups include 1,2-phenylene and 1,8-naphthylene; exemplary alkylene groups include methylene, ethylene, trimethylene, tetramethylene, phenylethylene, and norbornane-2,3-diyl; and exemplary alkenylene groups include 1,2-vinylene, 1-phenyl-1,2-vinylene, and 5-norbornene-2,3-diyl. Of the groups represented by $R^{111}$, exemplary alkyl groups are as exemplified for $R^{101a}$ to $R^{101c}$; exemplary alkenyl groups include vinyl, 1-propenyl, allyl, 1-butenyl, 3-butenyl, isoprenyl, 1-pentenyl, 3-pentenyl, 4-pentenyl, dimethylallyl, 1-hexenyl, 3-hexenyl, 5-hexenyl, 1-heptenyl, 3-heptenyl, 6-heptenyl, and 7-octenyl; and exemplary alkoxyalkyl groups include methoxymethyl, ethoxymethyl, propoxymethyl, butoxymethyl, pentyloxymethyl, hexyloxymethyl, heptyloxymethyl, methoxyethyl, ethoxyethyl, propoxyethyl, butoxyethyl, pentyloxyethyl, hexyloxyethyl, methoxypropyl, ethoxypropyl, propoxypropyl, butoxypropyl, methoxybutyl, ethoxybutyl, propoxybutyl, methoxypentyl, ethoxypentyl, methoxyhexyl, and methoxyheptyl.

Of the substituents on these groups, the alkyl groups of 1 to 4 carbon atoms include methyl, ethyl, propyl, isopropyl, n-butyl, isobutyl and tert-butyl; and the alkoxy groups of 1 to 4 carbon atoms include methoxy, ethoxy, propoxy, isopropoxy, n-butoxy, isobutoxy, and tert-butoxy. The phenyl groups which may have substituted thereon an alkyl or alkoxy of 1 to 4 carbon atoms, nitro, or acetyl group include phenyl, tolyl, p-tert-butoxyphenyl, p-acetylphenyl and p-nitrophenyl. The hetero-aromatic groups of 3 to 5 carbon atoms include pyridyl and furyl.

Illustrative examples of the acid generator include:
onium salts such as
diphenyliodonium trifluoromethanesulfonate,
(p-tert-butoxyphenyl)phenyliodonium trifluoromethanesulfonate,
diphenyliodonium p-toluenesulfonate,
(p-tert-butoxyphenyl)phenyliodonium p-toluenesulfonate,
triphenylsulfonium trifluoromethanesulfonate,
(p-tert-butoxyphenyl)diphenylsulfonium trifluoromethanesulfonate,
bis(p-tert-butoxyphenyl)phenylsulfonium trifluoromethanesulfonate,
tris(p-tert-butoxyphenyl)sulfonium trifluoromethanesulfonate,
triphenylsulfonium p-toluenesulfonate,
(p-tert-butoxyphenyl)diphenylsulfonium p-toluenesulfonate,
bis(p-tert-butoxyphenyl)phenylsulfonium p-toluenesulfonate,
tris(p-tert-butoxyphenyl)sulfonium p-toluenesulfonate,
triphenylsulfonium nonafluorobutanesulfonate,
triphenylsulfonium butanesulfonate,
trimethylsulfonium trifluoromethanesulfonate,
trimethylsulfonium p-toluenesulfonate,
cyclohexylmethyl(2-oxocyclohexyl)sulfonium trifluoromethane-sulfonate,
cyclohexylmethyl(2-oxocyclohexyl)sulfonium p-toluenesulfonate, dimethylphenylsulfonium trifluoromethanesulfonate,
dimethylphenylsulfonium p-toluenesulfonate,
dicyclohexylphenylsulfonium trifluoromethanesulfonate,
dicyclohexylphenylsulfonium p-toluenesulfonate,
trinaphthylsulfonium trifluoromethanesulfonate,
(2-norbornyl)methyl(2-oxocyclohexyl)sulfonium trifluoromethanesulfonate,
ethylenebis[methyl(2-oxocyclopentyl)sulfonium trifluoromethanesulfonate], and
1,2'-naphthylcarbonylmethyltetrahydrothiophenium triflate;
diazomethane derivatives such as
bis(benzenesulfonyl)diazomethane,
bis(p-toluenesulfonyl)diazomethane,
bis(xylenesulfonyl)diazomethane,
bis(cyclohexylsulfonyl)diazomethane,
bis(cyclopentylsulfonyl)diazomethane,
bis(n-butylsulfonyl)diazomethane,
bis(isobutylsulfonyl)diazomethane,
bis(sec-butylsulfonyl)diazomethane,
bis(n-propylsulfonyl)diazomethane,
bis(isopropylsulfonyl)diazomethane,
bis(tert-butylsulfonyl)diazomethane,
bis(n-amylsulfonyl)diazomethane,
bis(isoamylsulfonyl)diazomethane,
bis(sec-amylsulfonyl)diazomethane,
bis(tert-amylsulfonyl)diazomethane,
1-cyclohexylsulfonyl-1-(tert-butylsulfonyl)diazomethane,
1-cyclohexylsulfonyl-1-(tert-amylsulfonyl)diazomethane, and
1-tert-amylsulfonyl-1-(tert-butylsulfonyl)diazomethane;
glyoxime derivatives such as
bis-O-(p-toluenesulfonyl)-α-dimethylglyoxime,
bis-O-(p-toluenesulfonyl)-α-diphenylglyoxime, bis-O-(p-toluenesulfonyl)-α-dicyclohexylglyoxime,
bis-O-(p-toluenesulfonyl)-2,3-pentanedioneglyoxime,
bis-O-(p-toluenesulfonyl)-2-methyl-3,4-pentanedioneglyoxime,
bis-O-(n-butanesulfonyl)-α-dimethylglyoxime,
bis-O-(n-butanesulfonyl)-α-diphenylglyoxime,
bis-O-(n-butanesulfonyl)-α-dicyclohexylglyoxime,
bis-O-(n-butanesulfonyl)-2,3-pentanedioneglyoxime,
bis-O-(n-butanesulfonyl)-2-methyl-3,4-pentanedioneglyoxime,
bis-O-(methanesulfonyl)-α-dimethylglyoxime,
bis-O-(trifluoromethanesulfonyl)-α-dimethylglyoxime,
bis-O-(1,1,1-trifluoroethanesulfonyl)-α-dimethylglyoxime,
bis-O-(tert-butanesulfonyl)-α-dimethylglyoxime,
bis-O-(perfluorooctanesulfonyl)-α-dimethylglyoxime,
bis-O-(cyclohexanesulfonyl)-α-dimethylglyoxime,
bis-O-(benzenesulfonyl)-α-dimethylglyoxime,
bis-O-(p-fluorobenzenesulfonyl)-α-dimethylglyoxime,
bis-O-(p-tert-butylbenzenesulfonyl)-α-dimethylglyoxime,
bis-O-(xylenesulfonyl)-α-dimethylglyoxime, and
bis-O-(camphorsulfonyl)-α-dimethylglyoxime;
  bissulfone derivatives such as
bisnaphthylsulfonylmethane, bistrifluoromethylsulfonylmethane, bismethylsulfonylmethane, bisethylsulfonylmethane, bispropylsulfonylmethane, bisisopropylsulfonylmethane, bis-p-toluenesulfonylmethane, and bisbenzenesulfonylmethane;
  β-ketosulfone derivatives such as
2-cyclohexylcarbonyl-2-(p-toluenesulfonyl)propane and
2-isopropylcarbonyl-2-(p-toluenesulfonyl)propane;
  disulfone derivatives such as
diphenyl disulfone derivatives and
dicyclohexyl disulfone derivatives;
  nitrobenzyl sulfonate derivatives such as
2,6-dinitrobenzyl p-toluenesulfonate and
2,4-dinitrobenzyl p-toluenesulfonate;
  sulfonic acid ester derivatives such as
1,2,3-tris(methanesulfonyloxy)benzene,
1,2,3-tris(trifluoromethanesulfonyloxy)benzene, and
1,2,3-tris(p-toluenesulfonyloxy)benzene; and
  sulfonic acid esters of N-hydroxyimides such as
N-hydroxysuccinimide methanesulfonate,
N-hydroxysuccinimide trifluoromethanesulfonate,
N-hydroxysuccinimide ethanesulfonate,
N-hydroxysuccinimide 1-propanesulfonate,
N-hydroxysuccinimide 2-propanesulfonate,
N-hydroxysuccinimide 1-pentanesulfonate,
N-hydroxysuccinimide 1-octanesulfonate,
N-hydroxysuccinimide p-toluenesulfonate,
N-hydroxysuccinimide p-methoxybenzenesulfonate,
N-hydroxysuccinimide 2-chloroethanesulfonate,
N-hydroxysuccinimide benzenesulfonate,
N-hydroxysuccinimide 2,4,6-trimethylbenzenesulfonate,
N-hydroxysuccinimide 1-naphthalenesulfonate,
N-hydroxysuccinimide 2-naphthalenesulfonate,
N-hydroxy-2-phenylsuccinimide methanesulfonate,
N-hydroxymaleimide methanesulfonate,
N-hydroxymaleimide ethanesulfonate,
N-hydroxy-2-phenylmaleimide methanesulfonate,
N-hydroxyglutarimide methanesulfonate,
N-hydroxyglutarimide benzenesulfonate,
N-hydroxyphthalimide methanesulfonate,
N-hydroxyphthalimide benzenesulfonate,
N-hydroxyphthalimide trifluoromethanesulfonate,
N-hydroxyphthalimide p-toluenesulfonate,
N-hydroxynaphthalimide methanesulfonate,
N-hydroxynaphthalimide benzenesulfonate,
N-hydroxy-5-norbornene-2,3-dicarboxylmide methanesulfonate,
N-hydroxy-5-norbornene-2,3-dicarboxylmide trifluoromethane-sulfonate, and
N-hydroxy-5-norbornene-2,3-dicarboxylmide p-toluenesulfonate.

Preferred among these acid generators are onium salts such as triphenylsulfonium trifluoromethanesulfonate,
(p-tert-butoxyphenyl)diphenylsulfonium trifluoromethanesulfonate,
tris(p-tert-butoxyphenyl)sulfonium trifluoromethanesulfonate,
triphenylsulfonium p-toluenesulfonate,
(p-tert-butoxyphenyl)diphenylsulfonium p-toluenesulfonate,
tris(p-tert-butoxyphenyl)sulfonium p-toluenesulfonate,
trinaphthylsulfonium trifluoromethanesulfonate,
cyclohexylmethyl(2-oxocyclohexyl)sulfonium trifluoromethane-sulfonate,
(2-norbornyl)methyl(2-oxocylohexyl)sulfonium trifluoromethanesulfonate, and
1,2'-naphthylcarbonylmethyltetrahydrothiophenium triflate;
diazomethane derivatives such as
bis(benzenesulfonyl)diazomethane,
bis(p-toluenesulfonyl)diazomethane,
bis(cyclohexylsulfonyl)diazomethane,
bis(n-butylsulfonyl)diazomethane,
bis(isobutylsulfonyl)diazomethane,
bis(sec-butylsulfonyl)diazomethane,
bis(n-propylsulfonyl)diazomethane,
bis(isopropylsulfonyl)diazomethane, and
bis(tert-butylsulfonyl)diazomethane;
glyoxime derivatives such as
bis-O-(p-toluenesulfonyl)-α-dimethylglyoxime and
bis-O-(n-butanesulfonyl)-α-dimethylglyoxime;
bissulfone derivatives such as bisnaphthylsulfonylmethane;
and sulfonic acid esters of N-hydroxyimide compounds such as
N-hydroxysuccinimide methanesulfonate,
N-hydroxysuccinimide trifluoromethanesulfonate,
N-hydroxysuccinimide 1-propanesulfonate,
N-hydroxysuccinimide 2-propanesulfonate,
N-hydroxysuccinimide 1-pentanesulfonate,
N-hydroxysuccinimide p-toluenesulfonate,
N-hydroxynaphthalimide methanesulfonate, and
N-hydroxynaphthalimide benzenesulfonate.

Also useful are acid generators of the oxime type described in WO 2004/074242 A2.

These acid generators may be used singly or in combinations of two or more thereof. Onium salts are effective for improving rectangularity, while diazomethane derivatives and glyoxime derivatives are effective for reducing standing waves. The combination of an onium salt with a diazomethane or a glyoxime derivative allows for fine adjustment of the profile.

The acid generator is preferably added in an amount of 0.1 to 50 parts, and especially 0.5 to 40 parts by weight, per 100 parts by weight of the base resin. Less than 0.1 phr of the acid generator may generate a less amount of acid upon exposure, sometimes leading to a poor sensitivity and resolution whereas more than 50 phr of the acid generator may adversely affect the transmittance and resolution of resist. For example, where acid generators (P1a-1) and (P1a-2) are used in combination, they are mixed such that the mixture consists of 1 pbw of (P1a-1) and 0.001 to 1 pbw of (P1a-2).

Dissolution Inhibitor

To the positive resist composition, especially chemically amplified positive resist composition, a dissolution inhibitor or regulator may be added. The dissolution inhibitor is a compound having on the molecule at least two phenolic hydroxyl groups, in which an average of from 0 to 100 mol % of all the hydrogen atoms on the phenolic hydroxyl groups are replaced with acid labile groups or a compound having on the molecule at least one carboxyl group, in which an average of 50 to 100 mol % of all the hydrogen atoms on the carboxyl groups are replaced with acid labile groups, both the compounds having a weight average molecular weight within a range of 100 to 1,000, and preferably 150 to 800.

The degree of substitution of the hydrogen atoms on the phenolic hydroxyl groups with acid labile groups is on average at least 0 mol %, and preferably at least 30 mol %, of all the phenolic hydroxyl groups. The upper limit is 100 mol %, and preferably 80 mol %. The degree of substitution of the hydrogen atoms on the carboxyl groups with acid labile groups is on average at least 50 mol %, and preferably at least 70 mol %, of all the carboxyl groups, with the upper limit being 100 mol %.

Preferable examples of such compounds having two or more phenolic hydroxyl groups or compounds having at least one carboxyl group include those of formulas (D1) to (D14) below.

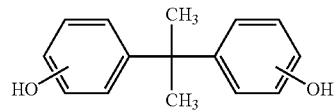
(D1)

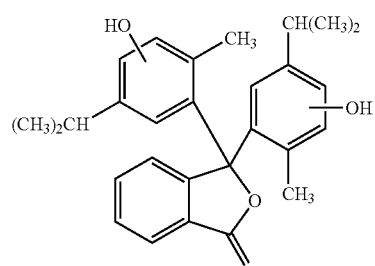
(D2)

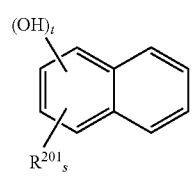
(D3)

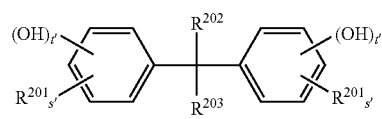
(D4)

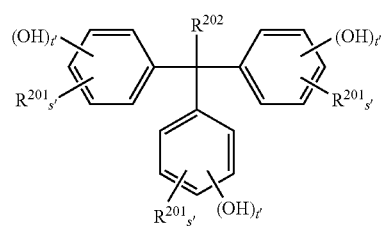
(D5)

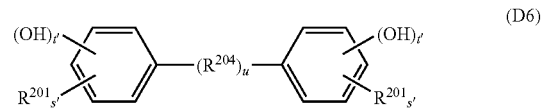
(D6)

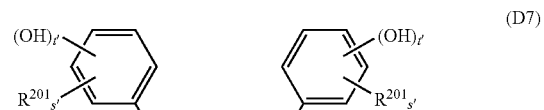
(D7)

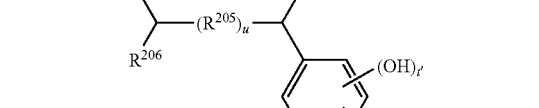
(D8)

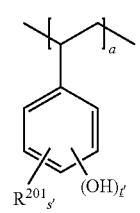
(D9)

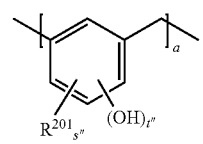
(D10)

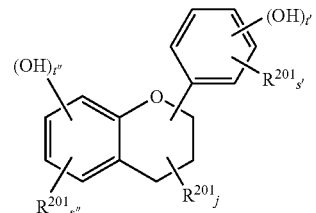
(D11)

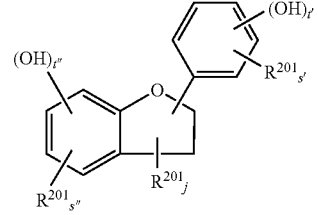
(D12)

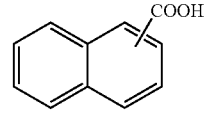
(D13)

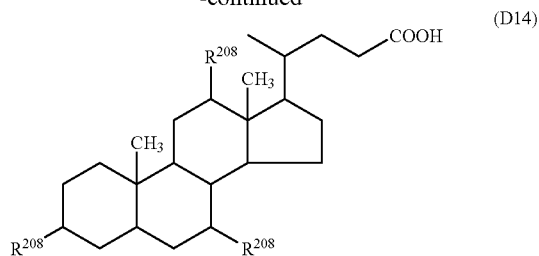

(D14)

In these formulas, $R^{201}$ and $R^{202}$ are each hydrogen or a straight or branched $C_1$-$C_8$ alkyl or alkenyl; $R^{203}$ is hydrogen, a straight or branched $C_1$-$C_8$ alkyl or alkenyl, or —$(R^{207})_h$—COOH; $R^{204}$ is —$(CH_2)_i$— (where i=2 to 10), a $C_6$-$C_{10}$ arylene, carbonyl, sulfonyl, an oxygen atom, or a sulfur atom; $R^{205}$ is a $C_1$-$C_{10}$ alkylene, a $C_6$-$C_{10}$ arylene, carbonyl, sulfonyl, an oxygen atom, or a sulfur atom; $R^{206}$ is hydrogen, a straight or branched $C_1$-$C_8$ alkyl or alkenyl, or a hydroxyl-substituted phenyl or naphthyl; $R^{207}$ is a straight or branched $C_1$-$C_{10}$ alkylene; $R^{208}$ is hydrogen or hydroxyl; the letter j is an integer from 0 to 5; u and h are each 0 or 1; s, t, s', t', s", and t" are each numbers which satisfy s+t=8, s'+t'=5, and s"+t"=4, and are such that each phenyl structure has at least one hydroxyl group; and α is a number such that the compounds of formula (D8) or (D9) have a molecular weight of from 100 to 1,000.

The dissolution inhibitor may be formulated in an amount of 0 to 50 parts, preferably 5 to 50 parts, and more preferably 10 to 30 parts by weight, per 100 parts by weight of the base resin, and may be used singly or as a mixture of two or more thereof. Outside the range, a less amount of the dissolution inhibitor may fail to improve resolution whereas a larger amount may lead to slimming of the patterned film and a decline in resolution.

Basic Compound

The basic compound used herein is preferably a compound capable of suppressing the rate of diffusion when the acid generated by the acid generator diffuses within the resist film. The inclusion of this type of basic compound holds down the rate of acid diffusion within the resist film, resulting in better resolution. In addition, it suppresses changes in sensitivity following exposure, thus reducing substrate and environment dependence, as well as improving the exposure latitude and the pattern profile.

Examples of suitable basic compounds include primary, secondary, and tertiary aliphatic amines, mixed amines, aromatic amines, heterocyclic amines, nitrogen-containing compounds having carboxyl group, nitrogen-containing compounds having sulfonyl group, nitrogen-containing compounds having hydroxyl group, nitrogen-containing compounds having hydroxyphenyl group, nitrogen-containing alcoholic compounds, amide derivatives, and imide derivatives.

Examples of suitable primary aliphatic amines include ammonia, methylamine, ethylamine, n-propylamine, isopropylamine, n-butylamine, iso-butylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, di-iso-propylamine, di-n-butylamine, di-iso-butylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, tri-iso-propylamine, tri-n-butylamine, tri-iso-butylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine.

Examples of suitable aromatic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, and diaminonaphthalene. Examples of suitable heterocyclic amines include pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridone, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable nitrogen-containing compounds having carboxyl group include aminobenzoic acid, indolecarboxylic acid, and amino acid derivatives (e.g., nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable nitrogen-containing compounds having sulfonyl group include 3-pyridinesulfonic acid and pyridinium p-toluenesulfonate. Examples of suitable nitrogen-containing compounds having hydroxyl group, nitrogen-containing compounds having hydroxyphenyl group, and nitrogen-containing alcoholic compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide.

Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

One or more basic compounds of the following general formula (B)-1 may also be added.

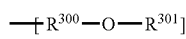

$$N(X)_n(Y)_{3-n} \quad \text{(B)-1}$$

In the formula, n is equal to 1, 2 or 3; side chain Y is independently hydrogen or a straight, branched or cyclic alkyl group of 1 to 20 carbon atoms which may contain an ether or hydroxyl group; and side chain X is independently selected from groups of the following general formulas (X)-1 to (X)-3, and two or three X's may bond together to form a ring with the nitrogen atom to which they are attached.

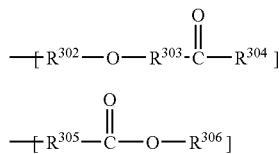

—[R³⁰⁰—O—R³⁰¹]   (X1)

—[R³⁰²—O—R³⁰³-C(=O)—R³⁰⁴]   (X2)

—[R³⁰⁵—C(=O)—O—R³⁰⁶]   (X3)

In the formulas, $R^{300}$, $R^{302}$ and $R^{305}$ are independently straight or branched alkylene groups of 1 to 4 carbon atoms; $R^{301}$ and $R^{304}$ are independently hydrogen, straight, branched or cyclic alkyl groups of 1 to 20 carbon atoms, which may contain at least one hydroxyl, ether, ester group or lactone ring; $R^{303}$ is a single bond or a straight or branched alkylene group of 1 to 4 carbon atoms; and $R^{306}$ is a straight, branched or cyclic alkyl group of 1 to 20 carbon atoms, which may contain at least one hydroxyl, ether, ester group or lactone ring.

Illustrative examples of the compounds of formula (B)-1 include tris(2-methoxymethoxyethyl)amine,
tris{2-(2-methoxyethoxy)ethyl}amine,
tris{2-(2-methoxyethoxymethoxy)ethyl}amine,
tris{2-(1-methoxyethoxy)ethyl}amine,
tris{2-(1-ethoxyethoxy)ethyl}amine,
tris{2-(1-ethoxypropoxy)ethyl}amine,
tris[2-{2-(2-hydroxyethoxy)ethoxy}ethyl]amine,
4,7,13,16,21,24-hexaoxa-1,10-diazabicyclo[8.8.8]hexacosane,
4,7,13,18-tetraoxa-1,10-diazabicyclo[8.5.5]eicosane,
1,4,10,13-tetraoxa-7,16-diazabicyclooctadecane,
1-aza-12-crown-4,1-aza-15-crown-5,1-aza-18-crown-6,
tris(2-formyloxyethyl)amine, tris(2-acetoxyethyl)amine,
tris(2-propionyloxyethyl)amine, tris(2-butyryloxyethyl)amine,
tris(2-isobutyryloxyethyl)amine, tris(2-valeryloxyethyl)amine,
tris(2-pivaloyloxyethyl)amine,
N,N-bis(2-acetoxyethyl)-2-(acetoxyacetoxy)ethylamine,
tris(2-methoxycarbonyloxyethyl)amine,
tris(2-tert-butoxycarbonyloxyethyl)amine,
tris[2-(2-oxopropoxy)ethyl]amine,
tris[2-(methoxycarbonylmethyl)oxyethyl]amine,
tris[2-(tert-butoxycarbonylmethyloxy)ethyl]amine,
tris[2-(cyclohexyloxycarbonylmethyloxy)ethyl]amine,
tris(2-methoxycarbonylethyl)amine,
tris(2-ethoxycarbonylethyl)amine,
N,N-bis(2-hydroxyethyl)-2-(methoxycarbonyl)ethylamine,
N,N-bis(2-acetoxyethyl)-2-(methoxycarbonyl)ethylamine,
N,N-bis(2-hydroxyethyl)-2-(ethoxycarbonyl)ethylamine,
N,N-bis(2-acetoxyethyl)-2-(ethoxycarbonyl)ethylamine,
N,N-bis(2-hydroxyethyl)-2-(2-methoxyethoxycarbonyl)ethylamine,
N,N-bis(2-acetoxyethyl)-2-(2-methoxyethoxycarbonyl)ethylamine,
N,N-bis(2-hydroxyethyl)-2-(2-hydroxyethoxycarbonyl)ethylamine,
N,N-bis(2-acetoxyethyl)-2-(2-acetoxyethoxycarbonyl)ethylamine,
N,N-bis(2-hydroxyethyl)-2-[(methoxycarbonyl)methoxycarbonyl]-ethylamine,
N,N-bis(2-acetoxyethyl)-2-[(methoxycarbonyl)methoxycarbonyl]-ethylamine,
N,N-bis(2-hydroxyethyl)-2-(2-oxopropoxycarbonyl)ethylamine,
N,N-bis(2-acetoxyethyl)-2-(2-oxopropoxycarbonyl)ethylamine,
N,N-bis(2-hydroxyethyl)-2-(tetrahydrofurfuryloxycarbonyl)-ethylamine,
N,N-bis(2-acetoxyethyl)-2-(tetrahydrofurfuryloxycarbonyl)-ethylamine,
N,N-bis(2-hydroxyethyl)-2-[(2-oxotetrahydrofuran-3-yl)oxy-carbonyl]ethylamine,
N,N-bis(2-acetoxyethyl)-2-[(2-oxotetrahydrofuran-3-yl)oxy-carbonyl]ethylamine,
N,N-bis(2-hydroxyethyl)-2-(4-hydroxybutoxycarbonyl)ethylamine,
N,N-bis(2-formyloxyethyl)-2-(4-formyloxybutoxycarbonyl)-ethylamine,
N,N-bis(2-formyloxyethyl)-2-(2-formyloxyethoxycarbonyl)-ethylamine,
N,N-bis(2-methoxyethyl)-2-(methoxycarbonyl)ethylamine,
N-(2-hydroxyethyl)-bis[2-(methoxycarbonyl)ethyl]amine,
N-(2-acetoxyethyl)-bis[2-(methoxycarbonyl)ethyl]amine,
N-(2-hydroxyethyl)-bis[2-(ethoxycarbonyl)ethyl]amine,
N-(2-acetoxyethyl)-bis[2-(ethoxycarbonyl)ethyl]amine,
N-(3-hydroxy-1-propyl)-bis[2-(methoxycarbonyl)ethyl]amine,
N-(3-acetoxy-1-propyl)-bis[2-(methoxycarbonyl)ethyl]amine,
N-(2-methoxyethyl)-bis[2-(methoxycarbonyl)ethyl]amine,
N-butyl-bis[2-(methoxycarbonyl)ethyl]amine,
N-butyl-bis[2-(2-methoxyethoxycarbonyl)ethyl]amine,
N-methyl-bis(2-acetoxyethyl)amine,
N-ethyl-bis(2-acetoxyethyl)amine,
N-methyl-bis(2-pivaloyloxyethyl)amine,
N-ethyl-bis[2-(methoxycarbonyloxy)ethyl]amine,
N-ethyl-bis[2-(tert-butoxycarbonyloxy)ethyl]amine,
tris(methoxycarbonylmethyl)amine, tris(ethoxycarbonylmethyl)amine,
N-butyl-bis(methoxycarbonylmethyl)amine,
N-hexyl-bis(methoxycarbonylmethyl)amine, and
p-(diethylamino)-δ-valerolactone.

Also useful are basic compounds having cyclic structure, represented by the following general formula (B)-2.

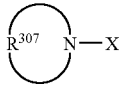
(B)-2

Herein X is as defined above, and $R^{307}$ is a straight or branched alkylene group of 2 to 20 carbon atoms which may contain one or more carbonyl, ether, ester or sulfide groups.

Illustrative examples of the compounds having formula (B)-2 include 1-[2-(methoxymethoxy)ethyl]pyrrolidine,
1-[2-(methoxymethoxy)ethyl]piperidine,
4-[2-(methoxymethoxy)ethyl]morpholine,
1-[2-[(2-methoxyethoxy)methoxy]ethyl]pyrrolidine,
1-[2-[(2-methoxyethoxy)methoxy]ethyl]piperidine,
4-[2-[(2-methoxyethoxy)methoxy]ethyl]morpholine,
2-(1-pyrrolidinyl)ethyl acetate, 2-piperidinoethyl acetate,
2-morpholinoethyl acetate, 2-(1-pyrrolidinyl)ethyl formate,
2-piperidinoethyl propionate,
2-morpholinoethyl acetoxyacetate,
2-(1-pyrrolidinyl)ethyl methoxyacetate,
4-[2-(methoxycarbonyloxy)ethyl]morpholine,
1-[2-(t-butoxycarbonyloxy)ethyl]piperidine,
4-[2-(2-methoxyethoxycarbonyloxy)ethyl]morpholine,
methyl 3-(1-pyrrolidinyl)propionate,
methyl 3-piperidinopropionate, methyl 3-morpholinopropionate,
methyl 3-(thiomorpholino)propionate,
methyl 2-methyl-3-(1-pyrrolidinyl)propionate,
ethyl 3-morpholinopropionate,
methoxycarbonylmethyl 3-piperidinopropionate,
2-hydroxyethyl 3-(1-pyrrolidinyl)propionate,
2-acetoxyethyl 3-morpholinopropionate,
2-oxotetrahydrofuran-3-yl 3-(1-pyrrolidinyl)propionate,
tetrahydrofurfuryl 3-morpholinopropionate,
glycidyl 3-piperidinopropionate,
2-methoxyethyl 3-morpholinopropionate,
2-(2-methoxyethoxy)ethyl 3-(1-pyrrolidinyl)propionate,
butyl 3-morpholinopropionate,
cyclohexyl 3-piperidinopropionate,
α-(1-pyrrolidinyl)methyl-γ-butyrolactone,
β-piperidino-γ-butyrolactone, β-morpholino-δ-valerolactone,
methyl 1-pyrrolidinylacetate, methyl piperidinoacetate,
methyl morpholinoacetate, methyl thiomorpholinoacetate,
ethyl 1-pyrrolidinylacetate, and
2-methoxyethyl morpholinoacetate.

Also, basic compounds having cyano group, represented by the following general formulae (B)-3 to (B)-6 are useful.

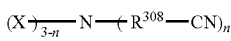
(B)-3

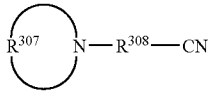
(B)-4

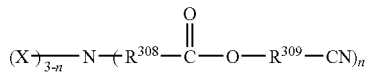
(B)-5

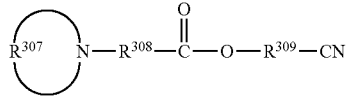
(B)-6

Herein, X, $R^{307}$ and n are as defined above, and $R^{308}$ and $R^{309}$ are each independently a straight or branched alkylene group of 1 to 4 carbon atoms.

Illustrative examples of the basic compounds having cyano group, represented by formulae (B)-3 to (B)-6, include
3-(diethylamino)propiononitrile,
N,N-bis(2-hydroxyethyl)-3-aminopropiononitrile,
N,N-bis(2-acetoxyethyl)-3-aminopropiononitrile,
N,N-bis(2-formyloxyethyl)-3-aminopropiononitrile,
N,N-bis(2-methoxyethyl)-3-aminopropiononitrile,
N,N-bis[2-(methoxymethoxy)ethyl]-3-aminopropiononitrile,
methyl N-(2-cyanoethyl)-N-(2-methoxyethyl)-3-aminopropionate,
methyl N-(2-cyanoethyl)-N-(2-hydroxyethyl)-3-aminopropionate,
methyl N-(2-acetoxyethyl)-N-(2-cyanoethyl)-3-aminopropionate,
N-(2-cyanoethyl)-N-ethyl-3-aminopropiononitrile,
N-(2-cyanoethyl)-N-(2-hydroxyethyl)-3-aminopropiononitrile,
N-(2-acetoxyethyl)-N-(2-cyanoethyl)-3-aminopropiononitrile,
N-(2-cyanoethyl)-N-(2-formyloxyethyl)-3-aminopropiononitrile,
N-(2-cyanoethyl)-N-(2-methoxyethyl)-3-aminopropiononitrile,
N-(2-cyanoethyl)-N-[2-(methoxymethoxy)ethyl]-3-aminopropiono-nitrile,
N-(2-cyanoethyl)-N-(3-hydroxy-1-propyl)-3-aminopropiono-nitrile,
N-(3-acetoxy-1-propyl)-N-(2-cyanoethyl)-3-aminopropiono-nitrile,
N-(2-cyanoethyl)-N-(3-formyloxy-1-propyl)-3-aminopropiono-nitrile,
N-(2-cyanoethyl)-N-tetrahydrofurfuryl-3-aminopropiononitrile,
N,N-bis(2-cyanoethyl)-3-aminopropiononitrile,
diethylaminoacetonitrile,
N,N-bis(2-hydroxyethyl)aminoacetonitrile,
N,N-bis(2-acetoxyethyl)aminoacetonitrile,
N,N-bis(2-formyloxyethyl)aminoacetonitrile,
N,N-bis(2-methoxyethyl)aminoacetonitrile,
N,N-bis[2-(methoxymethoxy)ethyl]aminoacetonitrile,
methyl N-cyanomethyl-N-(2-methoxyethyl)-3-aminopropionate,
methyl N-cyanomethyl-N-(2-hydroxyethyl)-3-aminopropionate,
methyl N-(2-acetoxyethyl)-N-cyanomethyl-3-aminopropionate,
N-cyanomethyl-N-(2-hydroxyethyl)aminoacetonitrile,
N-(2-acetoxyethyl)-N-(cyanomethyl)aminoacetonitrile,
N-cyanomethyl-N-(2-formyloxyethyl)aminoacetonitrile,
N-cyanomethyl-N-(2-methoxyethyl)aminoacetonitrile,
N-cyanomethyl-N-[2-(methoxymethoxy)ethyl]aminoaceto-nitrile, N-cyanomethyl-N-(3-hydroxy-1-propyl)aminoacetonitrile,
N-(3-acetoxy-1-propyl)-N-(cyanomethyl)aminoacetonitrile,
N-cyanomethyl-N-(3-formyloxy-1-propyl)aminoacetonitrile,
N,N-bis(cyanomethyl)aminoacetonitrile,
1-pyrrolidinepropiononitrile, 1-piperidinepropiononitrile,
4-morpholinepropiononitrile, 1-pyrrolidineacetonitrile,
1-piperidineacetonitrile, 4-morpholineacetonitrile,
cyanomethyl 3-diethylaminopropionate,
cyanomethyl N,N-bis(2-hydroxyethyl)-3-aminopropionate,
cyanomethyl N,N-bis(2-acetoxyethyl)-3-aminopropionate,
cyanomethyl N,N-bis(2-formyloxyethyl)-3-aminopropionate,
cyanomethyl N,N-bis(2-methoxyethyl)-3-aminopropionate,
cyanomethyl N,N-bis[2-(methoxymethoxy)ethyl]-3-aminopropionate,
2-cyanoethyl 3-diethylaminopropionate,
2-cyanoethyl N,N-bis(2-hydroxyethyl)-3-aminopropionate,
2-cyanoethyl N,N-bis(2-acetoxyethyl)-3-aminopropionate,
2-cyanoethyl N,N-bis(2-formyloxyethyl)-3-aminopropionate,
2-cyanoethyl N,N-bis(2-methoxyethyl)-3-aminopropionate,
2-cyanoethyl N,N-bis[2-(methoxymethoxy)ethyl]-3-aminopropionate,
cyanomethyl 1-pyrrolidinepropionate,
cyanomethyl 1-piperidinepropionate,
cyanomethyl 4-morpholinepropionate,
2-cyanoethyl 1-pyrrolidinepropionate,
2-cyanoethyl 1-piperidinepropionate, and
2-cyanoethyl 4-morpholinepropionate.

The basic compound is preferably formulated in an amount of 0.001 to 2 parts, and especially 0.01 to 1 part by weight, per 100 parts by weight of the base resin. Less than 0.001 phr of the basic compound achieves no or little addition effect whereas more than 2 phr would result in too low a sensitivity.

Other Components

Also, a polymer comprising recurring units having amino and fluoroalkyl groups may be added. This polymer orients or localizes at the resist surface after coating, preventing the resist pattern as developed from slimming and improving rectangularity. If a dot pattern as developed undergoes slimming or thickness reduction, image reversal may become unsuccessful. For preventing pattern slimming, the addition of the following polymer is effective.

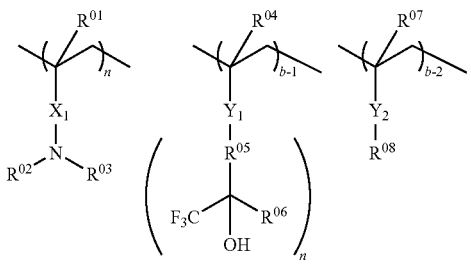

Herein $R^{01}$, $R^{04}$, and $R^{07}$ are each independently hydrogen or methyl. $X_1$ and $Y_2$ are each independently a single bond, —O—$R^{09}$—, —C(=O)—O—$R^{09}$—, —C(=O)—NH—$R^{09}$—, a straight or branched $C_1$-$C_4$ alkylene, or phenylene group, wherein $R^{09}$ is a straight, branched or cyclic $C_1$-$C_{10}$ alkylene group which may contain an ester (—COO—) or ether (—O—) group. The subscript n is 1 or 2. In case of n=1, $Y_1$ is a single bond, —O—$R^{09}$—, —C(=O)—O—$R^{09}$—, —C(=O)—NH—$R^{09}$—, a straight or branched $C_1$-$C_4$ alkylene, or phenylene group, wherein $R^{09}$ is as defined above. In case of n=2, $Y_1$ is —O—$R^{101}$=, —C(=O)—O—$R^{101}$=, —C(=O)—NH—$R^{101}$=, a straight or branched $C_1$-$C_4$ alkylene group with one hydrogen atom eliminated, or a phenylene group with one hydrogen atom eliminated, wherein $R^{101}$ is a straight, branched or cyclic $C_1$-$C_{10}$ alkylene group with one hydrogen atom eliminated which may contain an ester or ether group. $R^{02}$ and $R^{03}$ are each independently hydrogen, a straight, branched or cyclic $C_1$-$C_{20}$ alkyl or $C_2$-$C_{20}$ alkenyl group which may contain a hydroxy, ether, ester, cyano, amino group, double bond or halogen atom, or a $C_6$-$C_{11}$ aryl group, or $R^{02}$ and $R^{03}$ may bond together to form a ring of 3 to 20 carbon atoms with the nitrogen atom to which they are attached. $R^{05}$ is a straight, branched or cyclic $C_1$-$C_{12}$ alkylene group. $R^{06}$ is hydrogen, fluorine, methyl, trifluoromethyl or difluoromethyl, or $R^{06}$ and $R^{05}$ may bond together to form an alicyclic ring of 2 to 12 carbon atoms with the carbon atom to which they are attached, which ring may contain an ether group, fluorinated alkylene group or trifluoromethyl group. $R^{08}$ is a straight, branched or cyclic $C_1$-$C_{20}$ alkyl group which has at least one fluorine atom substituted thereon and which may contain an ether, ester or sulfonamide group. The subscripts (a), (b-1), and (b-2) are numbers in the range: $0<a<1.0$, $0\leq(b-1)<1.0$, $0\leq(b-2)<1.0$, $0<(b-1)+(b-2)<1.0$, and $0.5\leq a+(b-1)+(b-2)\leq 1.0$.

In the positive resist composition, a compound having a group =C—COOH in the molecule may be blended. Exemplary, non-limiting compounds having a carboxyl group include one or more compounds selected from Groups I and II below. Including this compound improves the post-exposure delay (PED) stability of the resist and ameliorates edge roughness on nitride film substrates.

Group I:

Compounds of general formulas (A1) to (A10) below in which some or all of the hydrogen atoms on the phenolic hydroxyl groups have been replaced by —$R^{401}$—COOH (wherein $R^{401}$ is a straight or branched alkylene of 1 to 10 carbon atoms), and in which the molar ratio C/(C+D) of phenolic hydroxyl groups (C) to =C—COOH groups (D) in the molecule is from 0.1 to 1.0.

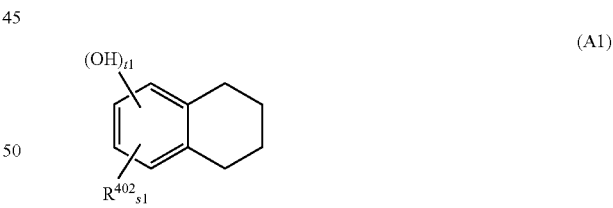

(A1)

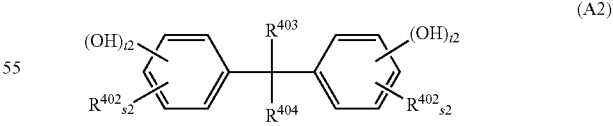

(A2)

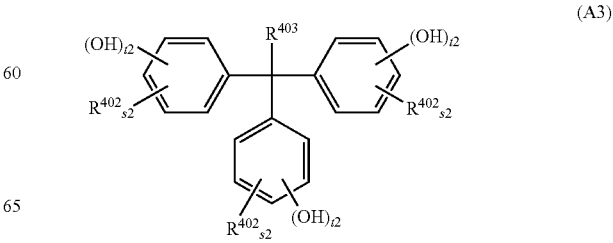

(A3)

-continued

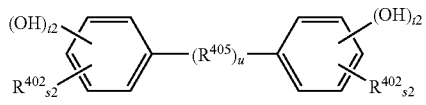
(A4)

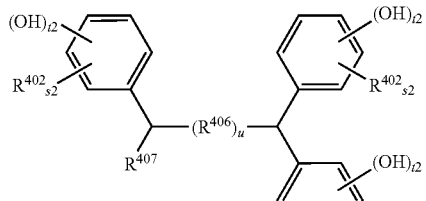
(A5)

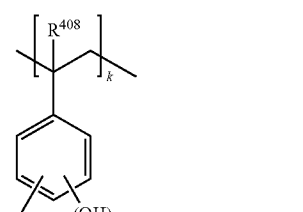
(A6)

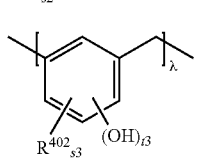
(A7)

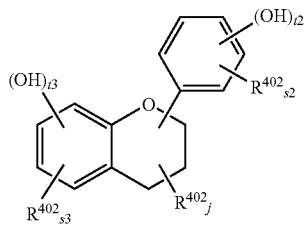
(A8)

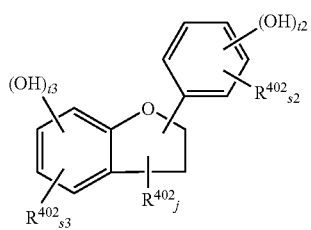
(A9)

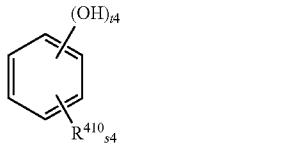
(A10)

In these formulas, $R^{408}$ is hydrogen or methyl; $R^{402}$ and $R^{403}$ are each hydrogen or a straight or branched $C_1$-$C_8$ alkyl or alkenyl; $R^{404}$ is hydrogen, a straight or branched $C_1$-$C_8$ alkyl or alkenyl, or a —$(R^{409})_h$—COOR' group (R' being hydrogen or —$R^{409}$—COOH); $R^{405}$ is —$(CH_2)_i$— (wherein i is 2 to 10), a $C_6$-$C_{10}$ arylene, carbonyl, sulfonyl, an oxygen atom, or a sulfur atom; $R^{406}$ is a $C_1$-$C_{10}$ alkylene, a $C_6$-$C_{10}$ arylene, carbonyl, sulfonyl, an oxygen atom, or a sulfur atom; $R^{407}$ is hydrogen, a straight or branched $C_1$-$C_8$ alkyl or alkenyl, or a hydroxyl-substituted phenyl or naphthyl; $R^{409}$ is a straight or branched $C_1$-$C_{10}$ alkyl or alkenyl or a —$R^{431}$— COOH group; $R^{410}$ is hydrogen, a straight or branched $C_1$-$C_8$ alkyl or alkenyl, or a —$R^{411}$—COOH group; $R^{411}$ is a straight or branched $C_1$-$C_{10}$ alkylene; h is an integer of 1 to 4, j is an integer from 0 to 3; s1, t1, s2, t2, s3, t3, s4, and t4 are each numbers which satisfy s1+t1=8, s2+t2=5, s3+t3=4, and s4+t4=6, and are such that each phenyl structure has at least one hydroxyl group; u is an integer of 1 to 4; κ is a number such that the compound of formula (A6) may have a weight average molecular weight of 1,000 to 5,000; and λ is a number such that the compound of formula (A7) may have a weight average molecular weight of 1,000 to 10,000.

Group II:

Compounds of general formulas (A11) to (A15) below.

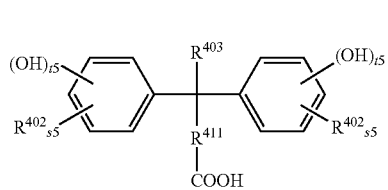
(A11)

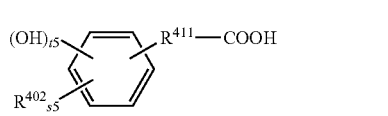
(A12)

(A13)

(A14)

(A15)

In these formulas, $R^{402}$, $R^{403}$, and $R^{411}$ are as defined above; $R^{412}$ is hydrogen or hydroxyl; s5 and t5 are numbers which satisfy s5≧0, t5≧0, and s5+t5=5; and h' is 0 or 1.

Illustrative, non-limiting examples of the compound having a carboxyl group include compounds of the general formulas AI-1 to AI-14 and AII-1 to AII-10 below.

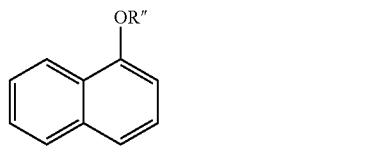
(AI-1)

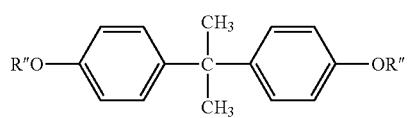 (AI-2)
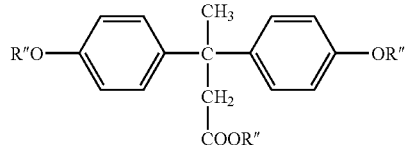 (AI-3)
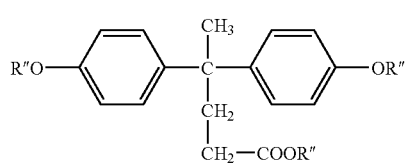 (AI-4)
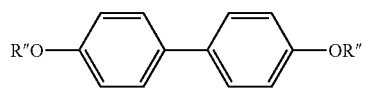 (AI-5)
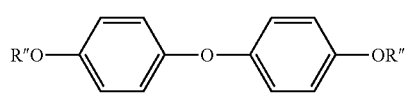 (AI-6)
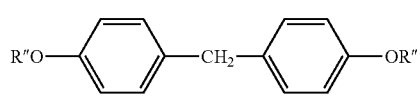 (AI-7)
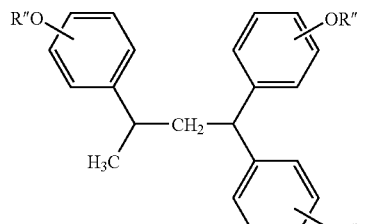 (AI-8)
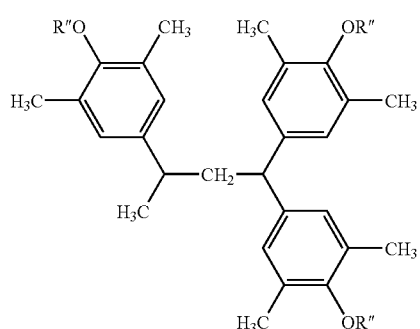 (AI-9)
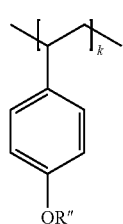 (AI-10)
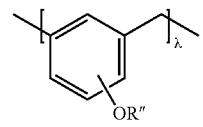 (AI-11)
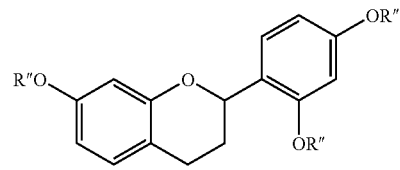 (AI-12)
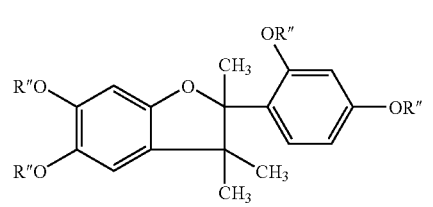 (AI-13)
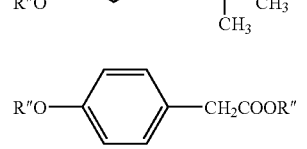 (AI-14)
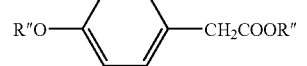
In the above formulas, R″ is hydrogen or a —CH$_2$COOH group such that the —CH$_2$COOH group accounts for 10 to 100 mol % of R″ in each compound, κ and λ are as defined above.
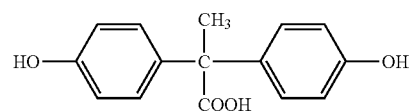 (AII-1)
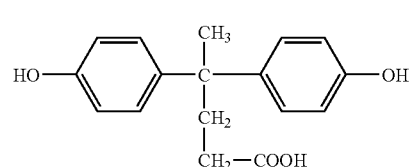 (AII-2)
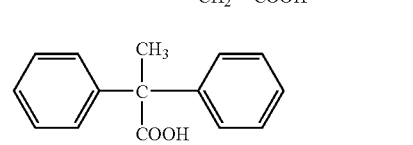 (AII-3)
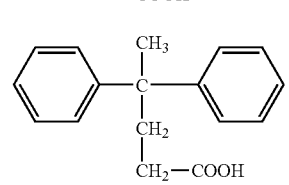 (AII-4)
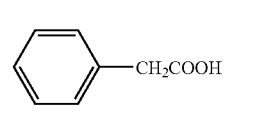 (AII-5)
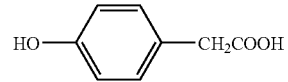 (AII-6)

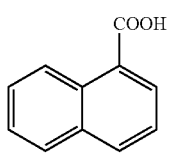
(AII-7)

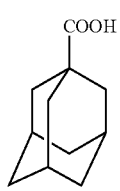
(AII-8)

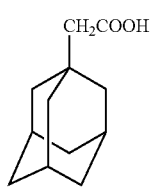
(AII-9)

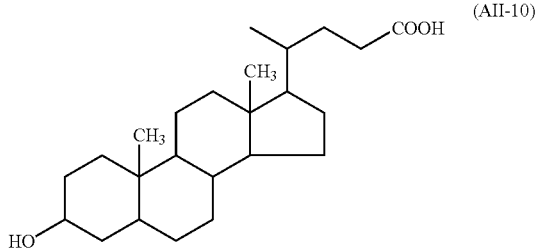
(AII-10)

The compound is added in an amount ranging from 0 to 5 parts, preferably 0.1 to 5 parts, more preferably 0.1 to 3 parts, further preferably 0.1 to 2 parts by weight, per 100 parts by weight of the base resin. More than 5 phr of the compound may reduce the resolution of the resist composition.

The positive resist composition used herein may further include a surfactant for improving the coating characteristics.

Illustrative, non-limiting, examples of the surfactant include nonionic surfactants, for example, polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenol ether and polyoxyethylene nonylphenol ether, polyoxyethylene polyoxypropylene block copolymers, sorbitan fatty acid esters such as sorbitan monolaurate, sorbitan monopalmitate, and sorbitan monostearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorochemical surfactants such as EFTOP EF301, EF303 and EF352 (Tohkem Products Co., Ltd.), Megaface F171, F172 and F173 (Dai-Nippon Ink & Chemicals, Inc.), Fluorad FC-430, FC-431 and FC-4430 (Sumitomo 3M Co., Ltd.), Asahiguard AG710, Surflon S-381, S-382, SC101, SC102, SC103, SC104, SC105, SC106, Surfynol E1004, KH-10, KH-20, KH-30 and KH-40 (Asahi Glass Co., Ltd.); organosiloxane polymers KP-341, X-70-092 and X-70-093 (Shin-Etsu Chemical Co., Ltd.), acrylic acid or methacrylic acid Polyflow No. 75 and No. 95 (Kyoeisha Ushi Kagaku Kogyo Co., Ltd.). Inter alia, FC-430, FC-4430, Surflon S-381, Surfynol E1004, KH-20 and KH-30 are preferred. These surfactants may be used alone or in admixture.

To the positive resist composition, the surfactant is added in an amount of up to 2 parts, preferably up to 1 part by weight, per 100 parts by weight of the base resin.

Reversal Film-Forming Composition

The reversal film used herein should preferably have a dissolution rate of 0.02 nm/sec to 2 nm/sec, and more preferably 0.05 nm/sec to 1 nm/sec in the alkaline developer used in the reversal step of the process. If the dissolution rate is slower than 0.02 nm/sec, the reversal film is not dissolved down to the top level of the first resist pattern, failing in pattern reversal or if possible, resulting in the reversed pattern having a top-bulged surface layer. If the dissolution rate is faster than 2 nm/sec, undesirably a less portion of the reversal film may be left or the reversed pattern may have an increased hole size.

In particular, in order that a surface layer of the reversal film is adequately dissolved during development to form a trench pattern, the reversal film is tailored to have an alkaline dissolution rate of 0.05 nm/sec to 1 nm/sec. Outside the range, a faster dissolution rate may lead to substantial slimming of the film during development whereas at a slower dissolution rate, the film surface may not be dissolved, failing to configure a trench pattern. For the purpose of tailoring to an appropriate dissolution rate, units providing an alkaline dissolution rate of at least 1 nm/sec and units providing an alkaline dissolution rate of up to 0.05 nm/sec are copolymerized. Optimizing the copolymerization ratio leads to a material having an optimum dissolution rate.

The reversal film used in the pattern forming process and having a dissolution rate of 0.02 nm/sec to 2 nm/sec in the alkaline developer is preferably formed from compositions comprising polymers having phenolic hydroxyl, α-trifluoromethylhydroxyl or carboxyl groups as the base polymer. The polymers having phenolic hydroxyl, α-trifluoromethylhydroxyl and carboxyl groups include, but are not limited to, cresol novolac resins, phenol oligomers, bisphenol oligomers, bisphenol novolac resins, bisnaphthol oligomers, bisnaphthol novolac resins, calix-arenes, calyx-resorcinols, polyhydroxystyrene, polyhydroxyvinylnaphthalene, polyhydroxyindene and copolymers thereof, carboxystyrene polymers, carboxyvinylnaphthalene and copolymers thereof, α-trifluoromethylhydroxy-containing styrene polymers and copolymers, methacrylic acid and carboxyl-containing (meth)acrylate polymers and copolymers, α-trifluoromethylhydroxy-containing (meth)acrylate polymers and copolymers.

Since most polymers consisting of recurring units having phenolic hydroxyl, α-trifluoromethylhydroxyl and carboxyl groups have an alkaline dissolution rate of at least 1 nm/sec, they are copolymerized with units providing an alkaline dissolution rate of up to 0.05 nm. Examples of suitable units providing an alkaline dissolution rate of up to 0.05 nm include those in which the hydrogen atom of phenolic hydroxyl, α-trifluoromethylhydroxyl or carboxyl groups is replaced by a $C_1$-$C_{20}$ alkyl, $C_3$-$C_{20}$ alkenyl, $C_6$-$C_{20}$ aryl or acid labile group. Also included are styrene, indene, indole, chromone, coumarone, acenaphthylene, norbornadiene, norbornene, vinylnaphthalene, vinylanthracene, vinylcarbazole, vinyl ether derivatives, lactone-containing (meth)acrylates, and hydroxy-containing (meth)acrylates.

More specifically, reactants from which the polymer for use in the reversal film is prepared should have alkali soluble groups such as phenolic hydroxyl, α-trifluoromethylhydroxyl and carboxyl groups. Partial protection of alkali soluble groups or combination thereof with substantially alkali insoluble groups is sometimes necessary to tailor the alkaline dissolution rate.

Suitable polymers having a phenolic hydroxyl group include those novolac resins obtained by reaction of phenol, o-cresol, m-cresol, p-cresol, 2,3-dimethylphenol, 2,5-dimethylphenol, 3,4-dimethylphenol, 3,5-dimethylphenol, 2,4-dimethylphenol, 2,6-dimethylphenol, 2,3,5-trimethylphenol, 3,4,5-trimethylphenol, 2-t-butylphenol, 3-t-butylphenol, 4-t-butylphenol, resorcinol, 2-methylresorcinol, 4-methylresorcinol, 5-methylresorcinol, catechol, 4-t-butylcatechol, 2-methoxyphenol, 3-methoxyphenol, 2-propylphenol, 3-propylphenol, 4-propylphenol, 2-isopropylphenol, 3-isopropylphenol, 4-isopropylphenol, 2-methoxy-5-methylphenol, 2-t-butyl-5-methylphenol, pyrogallol, thymol, isothymol, or the like, in the presence of aldehydes. Polymers of polymerizable olefin compounds having a phenolic hydroxyl group include polymers of hydroxystyrene, hydroxyvinylnaphthalene, hydroxyvinylanthracene, hydroxyindene, hydroxyacenaphthylene, and the monomers shown below.

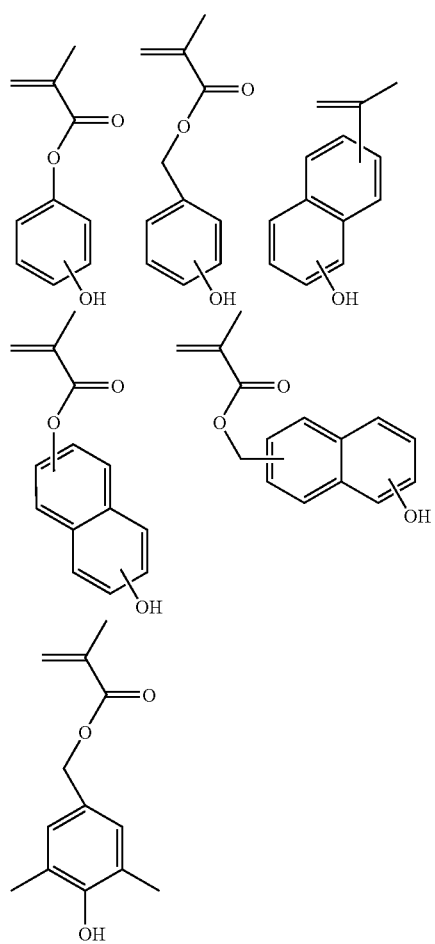

Polymers of monomers from which carboxyl-bearing recurring units are derived may also be used as the material for forming the reversal film, with examples of the monomers being shown below.

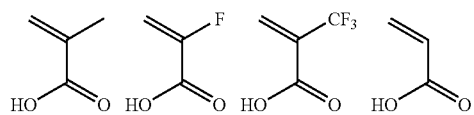

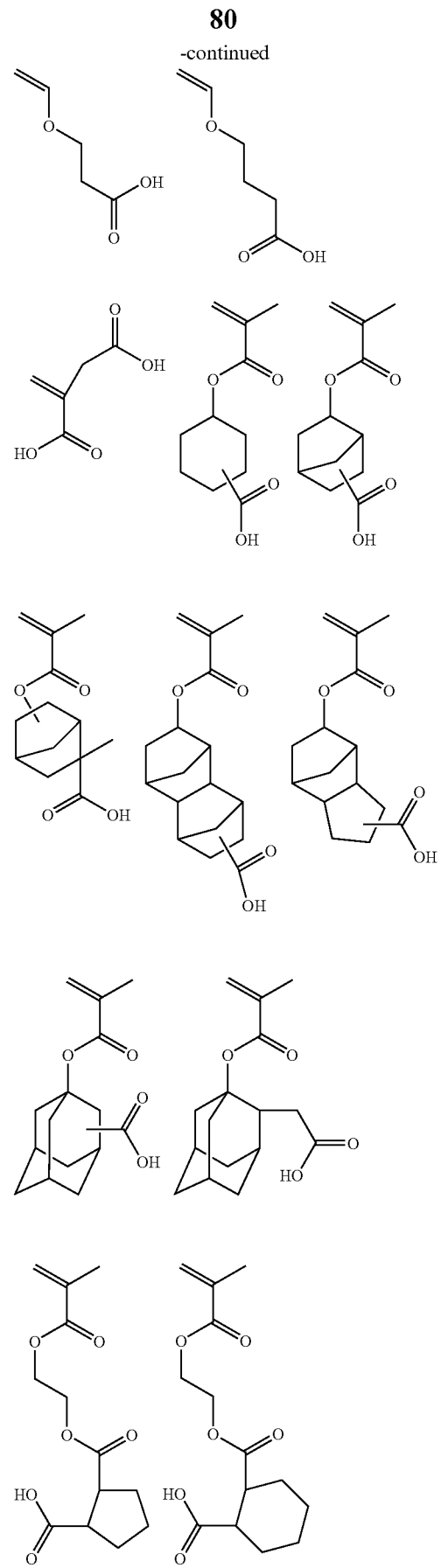

-continued

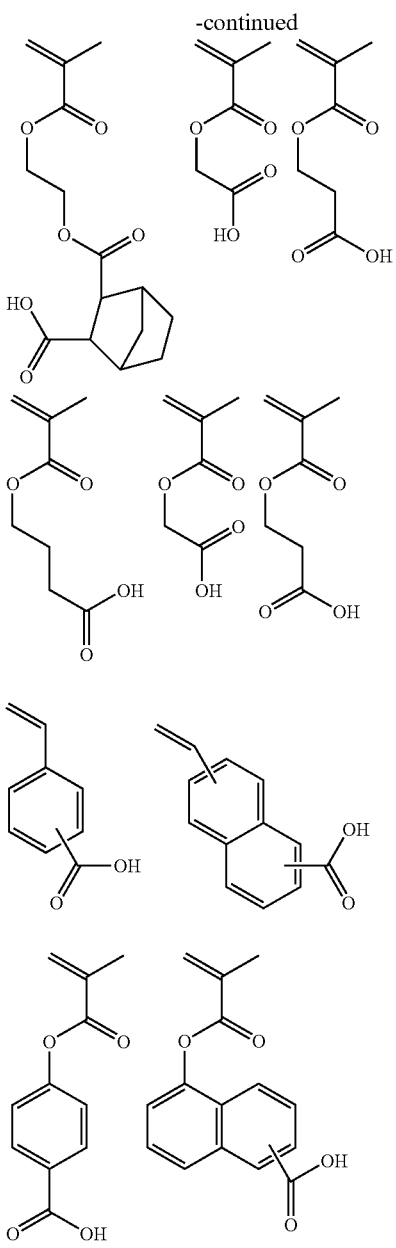

For partial protection of phenolic hydroxyl or carboxyl groups for the purpose of tailoring the alkaline dissolution rate, the hydrogen atom of the hydroxyl group or hydroxyl moiety of the carboxyl group is preferably replaced by a $C_1$-$C_{20}$ alkyl, $C_2$-$C_{20}$ alkenyl, $C_6$-$C_{20}$ aryl, acetyl, pivaloyl or acid labile group. The acid labile group used herein may be the same as described above.

For the purpose of tailoring the alkaline dissolution rate, substantially alkali insoluble recurring units may also be copolymerized. Examples of the substantially alkali insoluble recurring units include recurring units derived from alkyl or aryl (meth)acrylates, hydroxyl or lactone-bearing (meth)acrylates, styrene, vinylnaphthalene, vinylanthracene, vinylpyrene, vinylcarbazole, indene, acenaphthylene, norbornenes, norbornadienes, tricyclodecenes, and tetracyclododecenes.

The preferred base polymers from which the reversal film is formed are polymers comprising aromatic group-bearing hydrocarbons.

The base polymer should preferably have a weight average molecular weight (Mw) of 1,000 to 200,000, and more preferably 1,500 to 100,000, as measured by GPC versus polystyrene standards. Also it should preferably have a dispersity (Mw/Mn) of 1.0 to 7.0, and more preferably 1.02 to 5.0.

In addition to the base polymer described above, the reversal film-forming composition may comprise a scarcely alkali soluble material for pattern reversal, an alkali soluble surfactant for enhancing a surface alkali dissolution rate, an alkali soluble etching resistance improver, a basic quencher, a solvent and the like.

Examples of the scarcely alkali soluble material for pattern reversal include fullerenes having phenol group or malonic acid substituted thereon and oligomeric phenol compounds. These materials have a high carbon density and the function of improving etching resistance as well. Pattern reversal materials may be used alone or in a blend of two or more.

Examples of suitable materials include the phenolic compounds described in JP-A 2006-259249, JP-A 2006-259482, JP-A 2006-285095, and JP-A 2006-293298, the bisnaphthol compounds described in JP-A 2007-199653, and fluorene compounds having a phenol group, including 4,4'-(9H-fluoren-9-ylidene)bisphenol, 2,2'-dimethyl-4,4'-(9H-fluoren-9-ylidene)bisphenol, 2,2'-diallyl-4,4'-(9H-fluoren-9-ylidene)bisphenol, 2,2'-difluoro-4,4'-(9H-fluoren-9-ylidene)bisphenol, 2,2'-diphenyl-4,4'-(9H-fluoren-9-ylidene)bisphenol, 2,2'-dimethoxy-4,4'-(9H-fluoren-9-ylidene)bisphenol, tetrahydrospirobiindene compounds, 2,3,2',3'-tetrahydro-(1,1')-spirobiindene-6,6'-diol, 3,3,3',3'-tetramethyl-2,3,2',3'-tetrahydro-(1,1')-spirobiindene-6,6'-diol, 3,3,3',3',4,4'-hexamethyl-2,3,2',3'-tetrahydro-(1,1')-spirobiindene-6,6'-diol, 2,3,2',3'-tetrahydro-(1,1')-spirobiindene-5,5'-diol, 5,5'-dimethyl-3,3,3',3'-tetramethyl-2,3,2',3'-tetrahydro-(1,1')-spirobiindene-6,6'-diol, tritylphenol, etc. These materials may be used as the alkali soluble etching resistance improver.

The above material is preferably added in an amount of 0 to 200 parts, and more preferably 0 to 100 parts by weight per 100 parts by weight of the base polymer. When added, the amount of the material is at least 1 phr, and more preferably at least 5 phr.

Enhancing the alkali solubility of only a surface layer of the pattern reversal film is advantageous for allowing for smooth dissolution of the pattern reversal film building up over the positive resist pattern which has been altered to be alkali soluble, and for enhancing the dimensional control of a trench pattern or hole pattern converted from the positive pattern. To enhance the surface alkali solubility, an alkali soluble surfactant, especially fluorochemical surfactant may be added. The preferred fluorochemical surfactants are those comprising either one or both of recurring units (s-1) and (s-2) represented by the general formula (3).

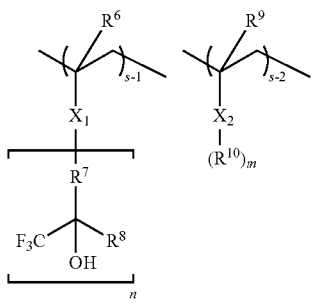
(3)

Herein, $R^6$ and $R^9$ are each independently hydrogen or methyl. The letter n is equal to 1 or 2. In case of n=1, $X_1$ is a phenylene group, —O—, —C(=O)—O—$R^{12}$—, or —C(=O)—NH—$R^{12}$— wherein $R^{12}$ is a single bond or a straight or branched $C_1$-$C_4$ alkylene group which may have an ester or ether group. In case of n=2, $X_1$ is a phenylene group with one hydrogen atom eliminated (represented by —$C_6H_3$—), or —C(=O)—O—$R^{81}$= or —C(=O)—NH—$R^{81}$= wherein $R^{81}$ is a straight, branched or cyclic $C_1$-$C_{10}$ alkylene group with one hydrogen atom eliminated, which may have an ester or ether group. $R^7$ is a single bond or a straight, branched or cyclic $C_1$-$C_{12}$ alkylene group. $R^8$ is hydrogen, fluorine, methyl, trifluoromethyl or difluoromethyl, or $R^8$ and $R^7$ may bond together to form a ring of 3 to 10 carbon atoms (exclusive of aromatic ring) with the carbon atom to which they are attached, which ring may have an ether group, fluorinated alkylene group or trifluoromethyl group. $X_2$ is a phenylene group, —O—, —C(=O)—O—$R^{11}$—, or —C(=O)—NH—$R^{11}$— wherein $R^{11}$ is a single bond or a straight or branched $C_1$-$C_4$ alkylene group which may have an ester or ether group. $R^{10}$ is a fluorine atom or a straight, branched or cyclic $C_1$-$C_{20}$ alkyl group, which may be substituted with at least one fluorine atom and which may have an ether, ester or sulfonamide group. The letter m is an integer of 1 to 5 when $X_2$ is phenylene, and m is 1 when $X_2$ is otherwise.

Examples of the monomers from which units (s-1) are derived are illustrated below.

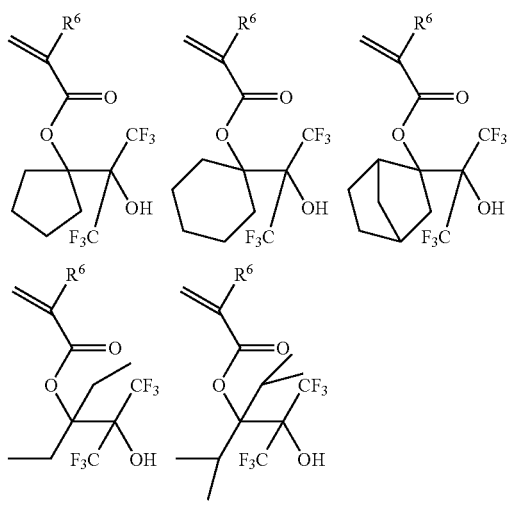

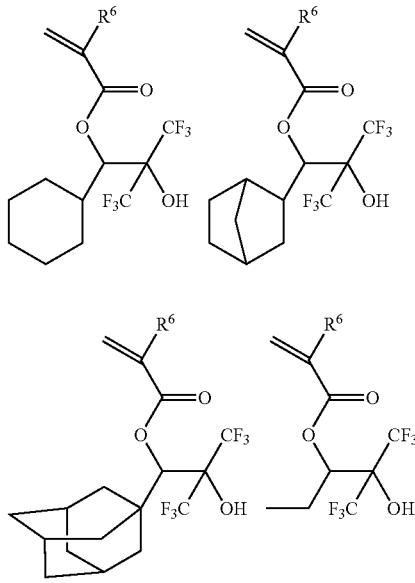

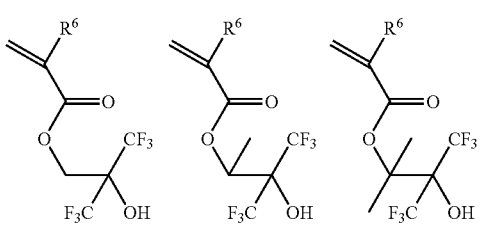

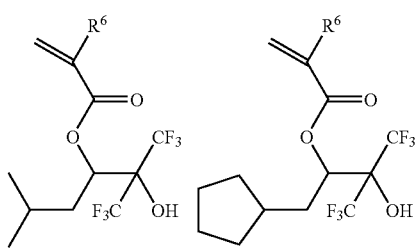

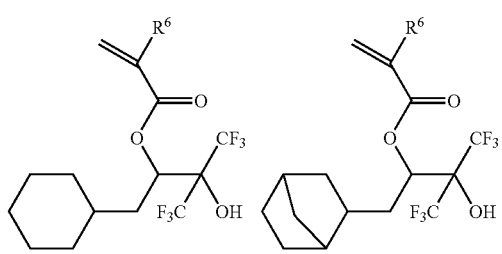

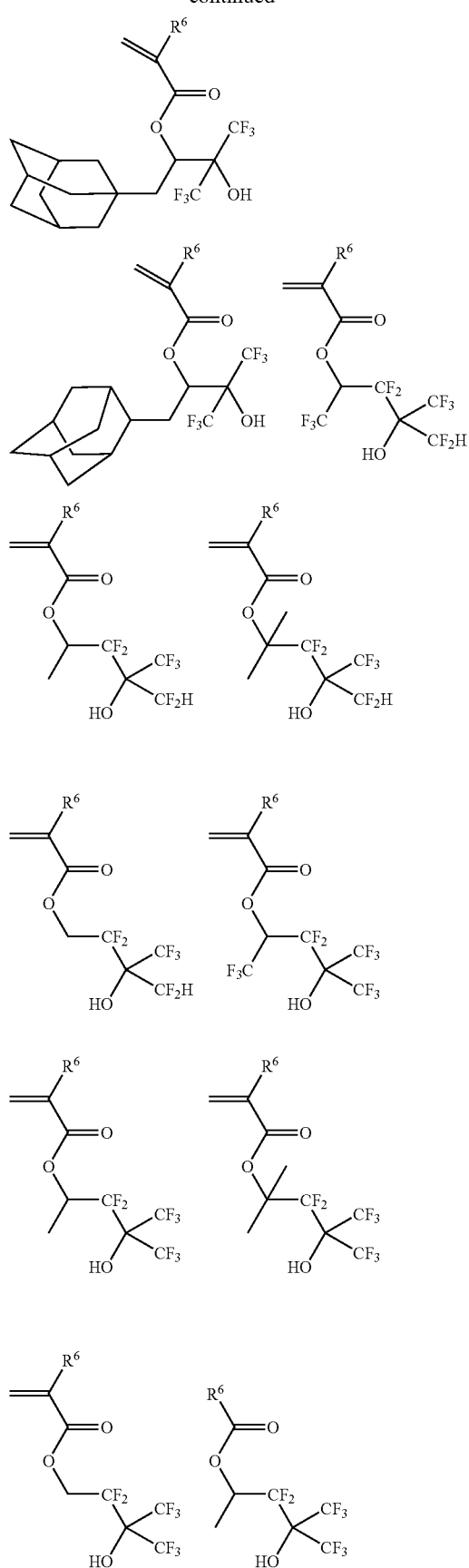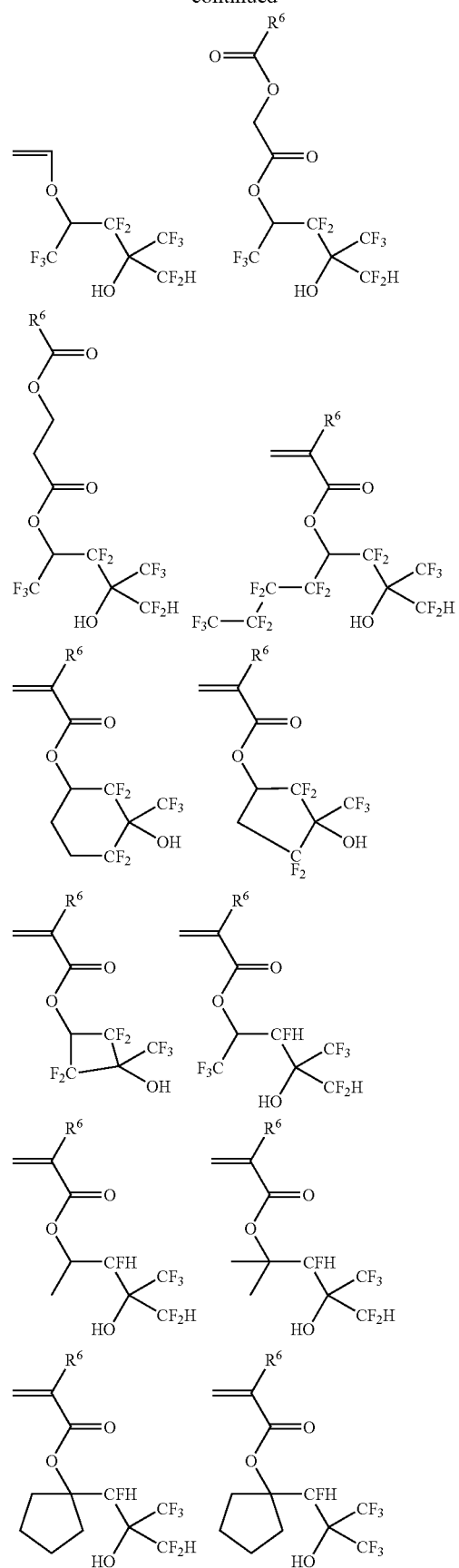

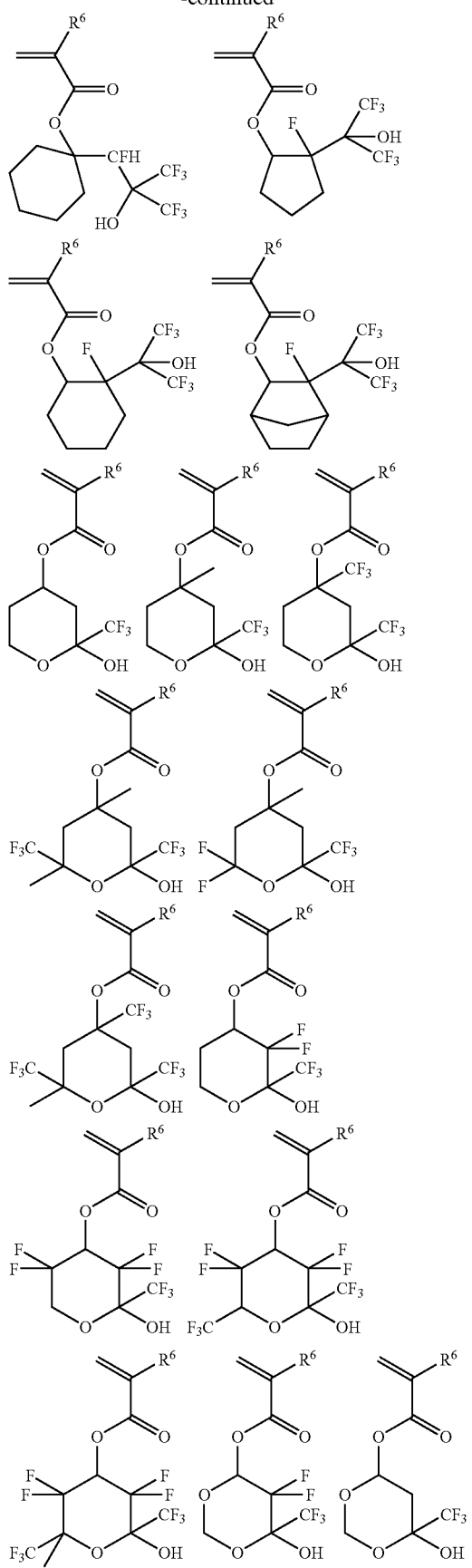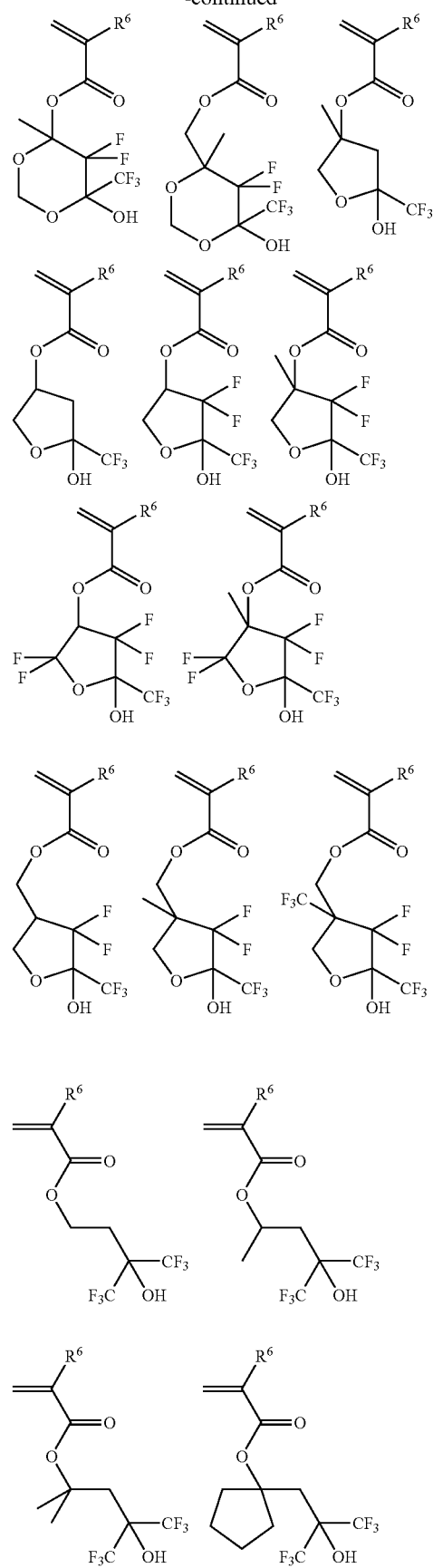

-continued
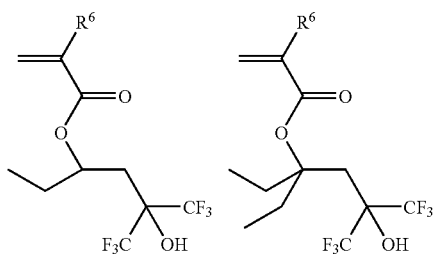
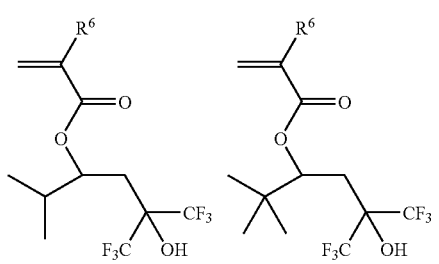
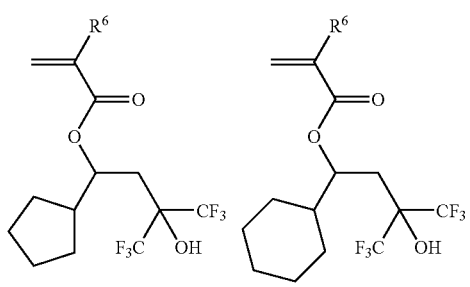
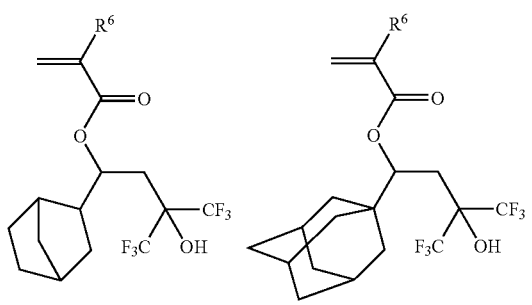
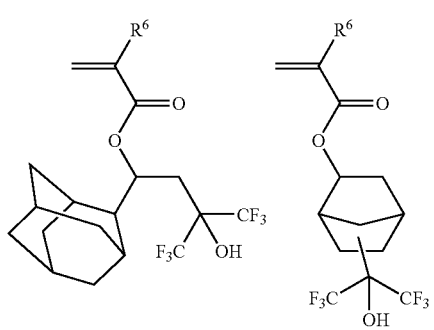
-continued
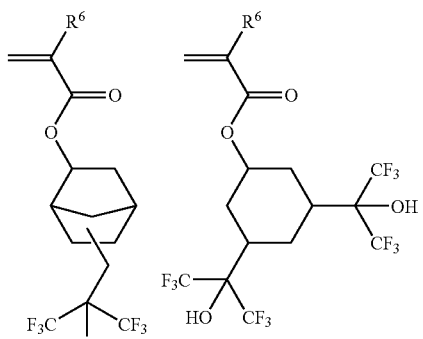
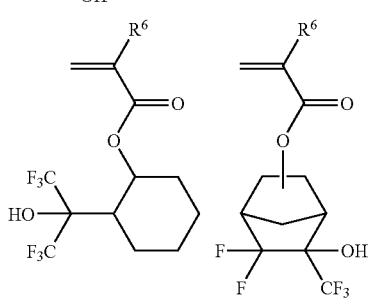
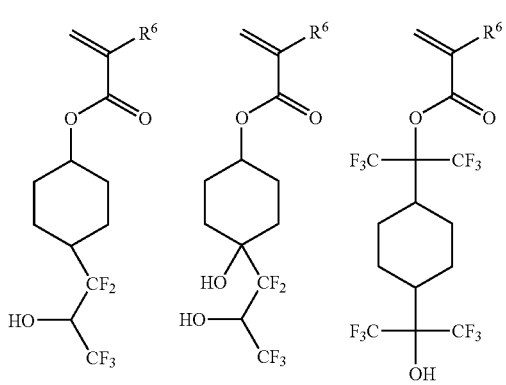
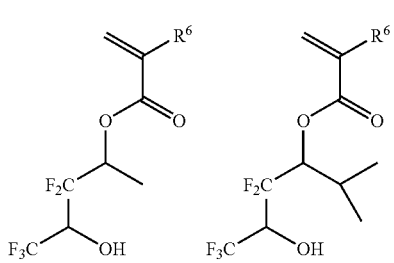
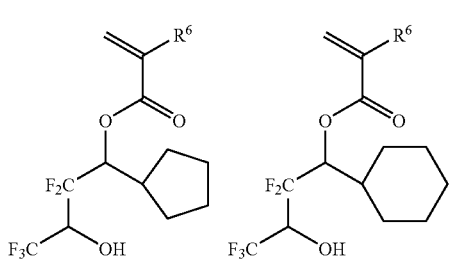

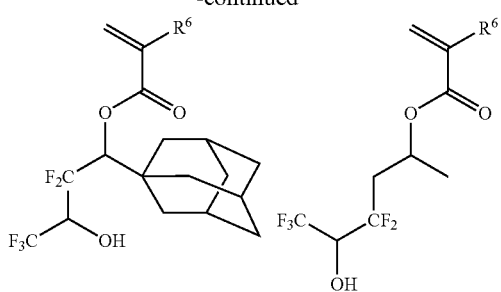
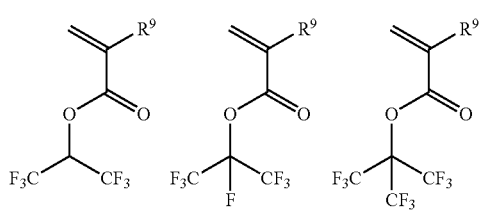
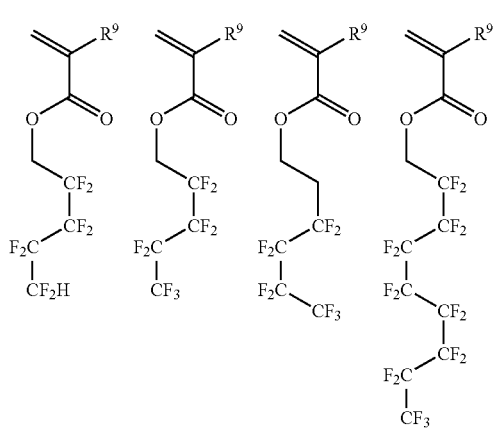
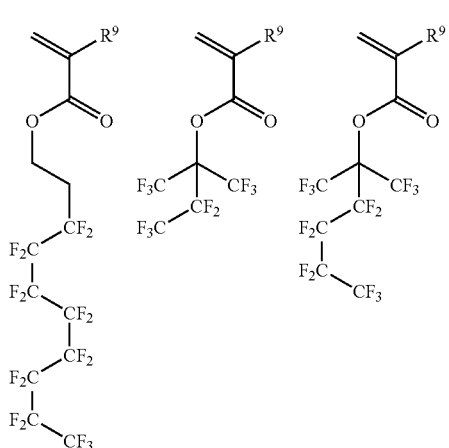
Herein R⁶ is as defined above.
Examples of the monomers from which recurring units (s-2) of formula (3) are derived are illustrated below while many recurring units (s-2) are units having a fluorinated alkyl group.
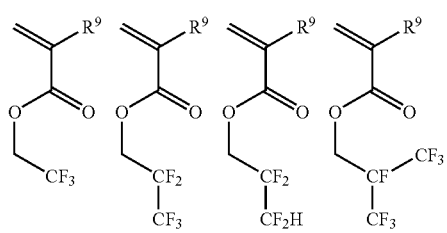

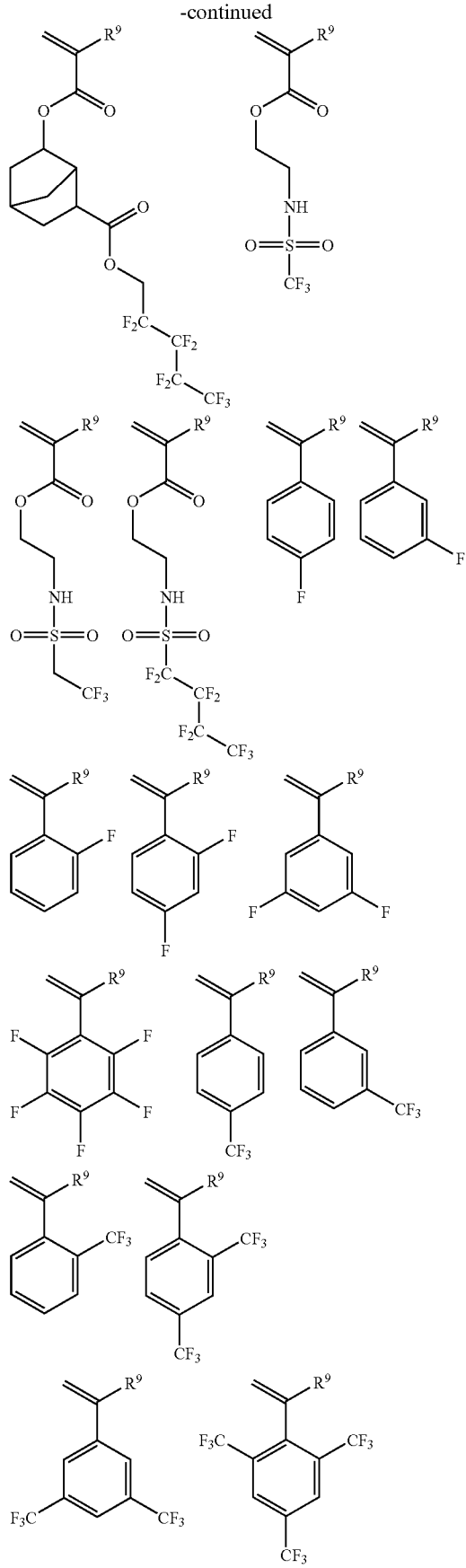
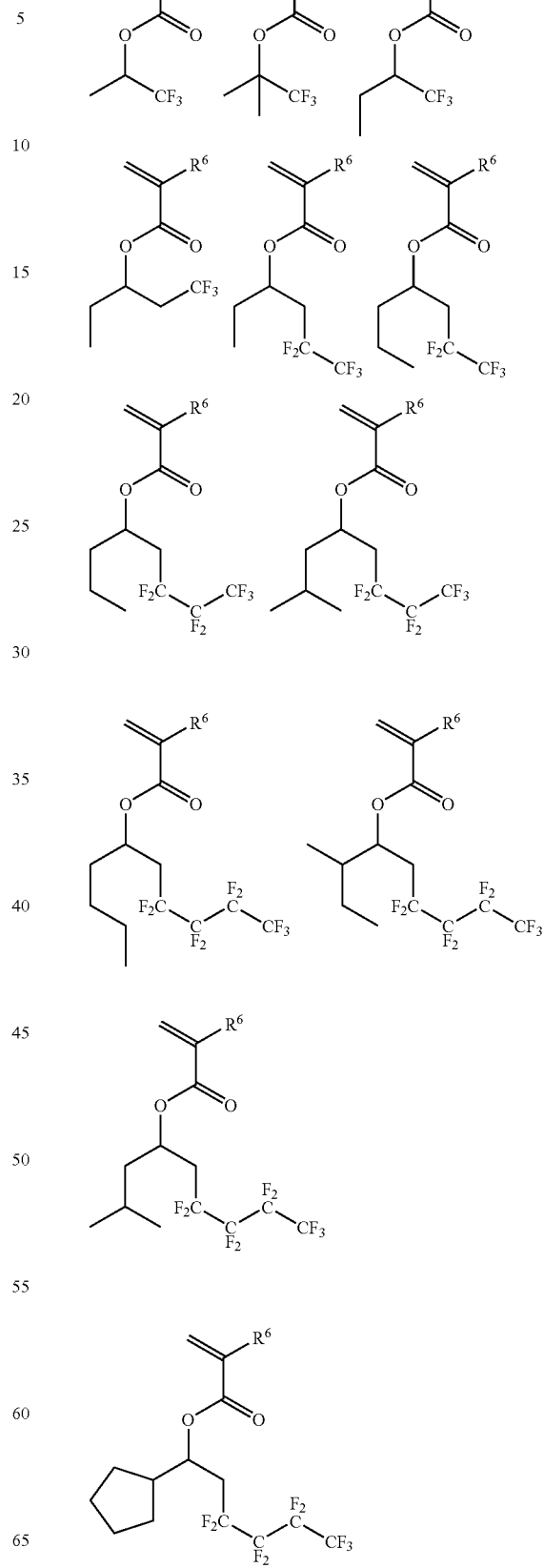

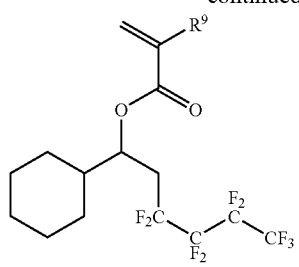
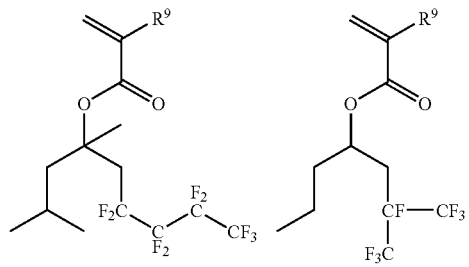
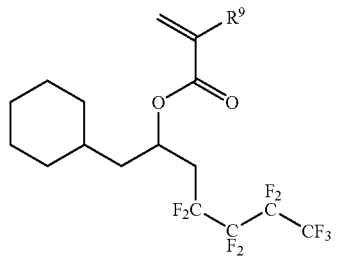
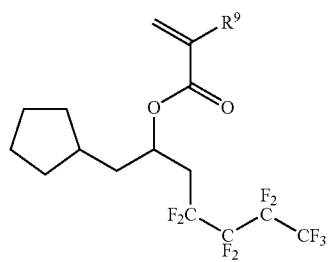
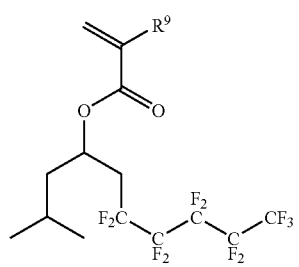
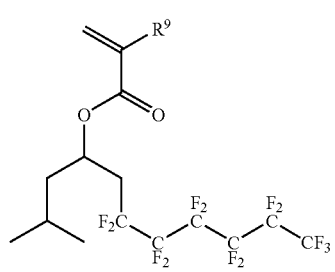
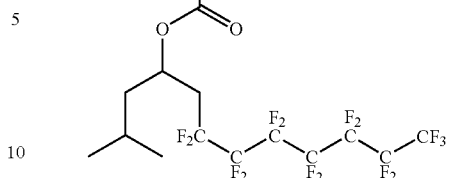
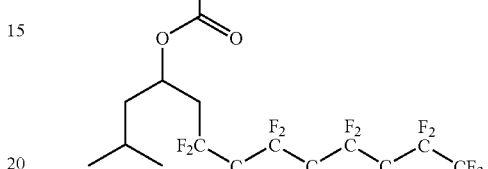
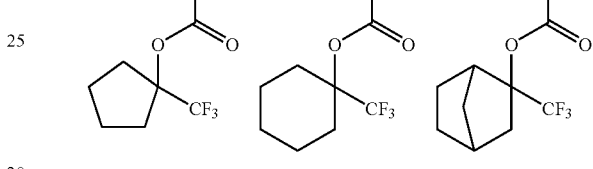
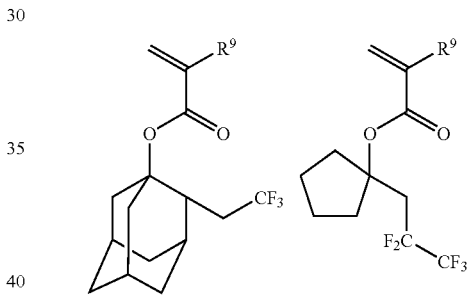
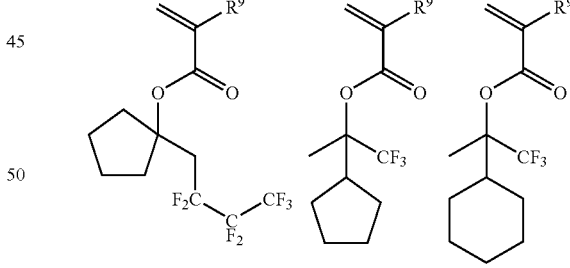
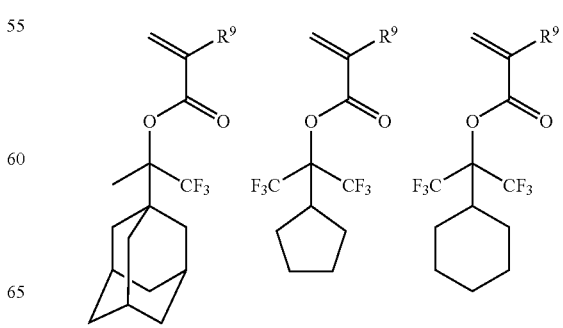

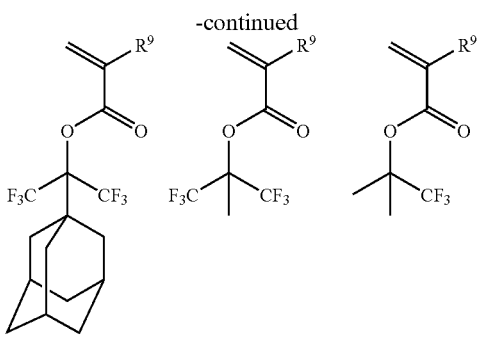

Herein $R^9$ is as defined above.

These recurring units (s-1) and (s-2) may be copolymerized with the above-described alkali soluble recurring units having a phenol or carboxyl group or substantially alkali insoluble recurring units (s-3). In these copolymers, the proportion of recurring units (s-1) and (s-2) is $0 \leq (s-1) \leq 1$, $0 \leq (s-2) \leq 1$, and $0 < (s-1)+(s-2) \leq 1$, preferably $0.1 \leq (s-1)+(s-2) \leq 1$, and more preferably $0.2 < (s-1)+(s-2) \leq 1$. Understandably, in the case of $(s-1)+(s-2)<1$, the balance consists of recurring units (s-3) described just above.

This alkali soluble surfactant should preferably have a weight average molecular weight (Mw) of 1,000 to 100,000 and more preferably 2,000 to 50,000.

The alkali soluble surfactant is preferably added in an amount of 0 to 50 parts, and more preferably 0 to 20 parts by weight per 100 parts by weight of the base polymer. Too much amounts of the surfactant may cause excessive thickness decrease or detract from etching resistance. When added, at least 1 phr of the surfactant is preferred.

The basic quencher used herein may be any of the same basic compounds as described in conjunction with the positive resist composition. Specifically, a basic compound may be added to the pattern reversal film used in the pattern forming process of the invention for preventing acid diffusion from the resist pattern as developed. Particularly when an acid labile group-substituted phenolic compound or carboxyl-containing compound is used as the component of the pattern reversal film, there arises the problem that the alkali dissolution rate increases due to diffusion of acid from the resist pattern and deprotection reaction, leading to the reversed pattern of a larger size or substantial thickness decrease. This problem is effectively overcome by adding a basic compound. Understandably the basic compounds added to the resist composition and the pattern reversal film composition may be the same or different.

The basic compound or basic quencher is preferably added in an amount of 0 to 10 parts, and more preferably 0 to 5 parts by weight per 100 parts by weight of the base polymer. When added, at least 0.1 phr of the quencher is preferred.

In the pattern reversal film-forming composition used in the pattern forming process of the invention, the organic solvent used may be selected from those used in the positive resist composition, but preferably from alcohols of 3 to 10 carbon atoms and ethers of 8 to 12 carbon atoms which are favorable in preventing mixing with the positive resist coating (i.e., resist pattern). Illustrative examples of the $C_3$-$C_{10}$ alcohols include n-propyl alcohol, isopropyl alcohol, 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-diethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol.

Examples of the $C_8$-$C_{12}$ ethers include di-n-butyl ether, diisobutyl ether, di-sec-butyl ether, di-n-pentyl ether, diisopentyl ether, di-sec-pentyl ether, di-t-amyl ether, and di-n-hexyl ether. These solvents may be used alone or in admixture of two or more.

The amount of the organic solvent used is preferably 200 to 3,000 parts, and more preferably 400 to 2,000 parts by weight per 100 parts by weight of the base polymer.

Process

Now referring to the drawings, the pattern forming process of the invention is illustrated. First, the positive resist composition is coated on a substrate to form a resist film thereon. As shown in FIG. 1A, a resist film 30 of a positive resist composition is formed on a processable substrate 20 disposed on a substrate 10 directly or via an intermediate intervening layer (not shown). The resist film preferably has a thickness of 10 to 1,000 nm and more preferably 20 to 500 nm. Prior to exposure, the resist film is heated or prebaked, preferably at a temperature of 60 to 180° C., especially 70 to 150° C. for a time of 10 to 300 seconds, especially 15 to 200 seconds.

The substrate 10 used herein is generally a silicon substrate. The processable substrate 20 used herein includes $SiO_2$, SiN, SiON, SiOC, p-Si, α-Si, TiN, WSi, BPSG, SOG, Cr, CrO, CrON, MoSi, low dielectric film, and etch stopper film. The intermediate intervening layer includes hard masks of $SiO_2$, SiN, SiON, p-Si, an undercoat in the form of carbon film, a silicon-containing intermediate film, and an organic antireflective coating.

This is followed by exposure. For the exposure, preference is given to high-energy radiation having a wavelength of 140 to 250 nm, and especially ArF excimer laser radiation of 193 nm. The exposure may be done either in air or in a dry atmosphere with a nitrogen stream, or by immersion lithography in water. The ArF immersion lithography uses deionized water or liquids having a refractive index of at least 1 and highly transparent to the exposure wavelength such as alkanes as the immersion solvent. The immersion lithography involves prebaking a resist film and exposing the resist film to light through a projection lens, with water introduced between the resist film and the projection lens. Since this allows lenses to be designed to a NA of 1.0 or higher, formation of finer feature size patterns is possible. The immersion lithography is important for the ArF lithography to survive to the 45-nm node. In the case of immersion lithography, deionized water rinsing (or post-soaking) may be carried out after exposure for removing water droplets left on the resist film, or a protective film may be applied onto the resist film after pre-baking for preventing any dissolution from the resist film and improving water slip on the film surface.

The resist protective film used in the immersion lithography is preferably formed from a solution of a polymer having 1,1,1,3,3,3-hexafluoro-2-propanol residues which is insoluble in water, but soluble in an alkaline developer liquid, in a solvent selected from alcohols of at least 4 carbon atoms, ethers of 8 to 12 carbon atoms, and mixtures thereof. The protective coating composition used herein may comprise a base resin comprising predominant recurring units (P-1) such as recurring units having 1,1,1,3,3,3-hexafluoro-2-propanol residues or a base resin comprising the predominant recurring units (P-1) and recurring units (P-2) having a fluoroalkyl group copolymerized therewith. Examples of recurring units (P-1) include those derived from the monomers exemplified above for units (s-1), and examples of recurring units (P-2) include those derived from the monomers exemplified above for units (s-2). The proportion of these recurring units (P-1) and (P-2) is 0<(P-1)≦1.0, 0≦(P-2)<1.0, and 0.3≦(P-1)+(P-2)≦1.0. The base resin has a weight average molecular weight (Mw) of 1,000 to 100,000, and preferably 2,000 to 50,000. When a base resin free of recurring units (P-2) is used, it is preferred to incorporate an amine compound in the protective coating composition. The amine compound used herein may be selected from those described above in conjunction with the basic compound. The amine compound is preferably used in an amount of 0.01 to 10 parts, and more preferably 0.02 to 8 parts by weight per 100 parts by weight of the base resin.

After formation of the photoresist film, deionized water rinsing (or post-soaking) may be carried out for extracting the acid generator and the like from the film surface or washing away particles, or after exposure, rinsing (or post-soaking) may be carried out for removing water droplets left on the resist film.

Exposure is preferably carried out so as to provide an exposure dose of about 1 to 200 mJ/cm$^2$, more preferably about 10 to 100 mJ/cm$^2$. This is followed by baking on a hot plate at 60 to 150° C. for 1 to 5 minutes, preferably at 80 to 120° C. for 1 to 3 minutes (post-exposure baking=PEB).

Figure 1B:
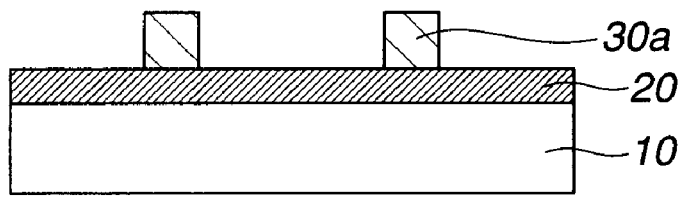
FIG. 1B shows that the resist film is exposed and developed.

Thereafter the resist film is developed with a developer in the form of an aqueous alkaline solution, for example, an aqueous solution of 0.1 to 5 wt %, preferably 2 to 3 wt % tetramethylammonium hydroxide (TMAH) for 0.1 to 3 minutes, preferably 0.5 to 2 minutes by conventional techniques such as dip, puddle or spray techniques. In this way, a desired resist pattern 30a is formed on the substrate as shown in FIG. 1B.

As to the pattern, a dot pattern having a half-pitch size of 38×38 nm to 100×100 nm, and especially 40×40 nm to 80×80 nm may be formed. Since the size of a dot pattern depends on the lens NA of an exposure tool, use of an NA 1.35 exposure tool leads to formation of dots having a half-pitch of 38 nm as the minimum size. The dot pattern may have longitudinal and transverse axes of equal or different lengths. The method of forming a dot pattern is not particularly limited. A typical method of forming a dot pattern is by exposing the resist film to high-energy radiation so as to form a first line pattern, then exposing so as to form a second line pattern perpendicular to the first line pattern, and developing. With this method, holes having the finest half-pitch can be formed.

Figure 2A:
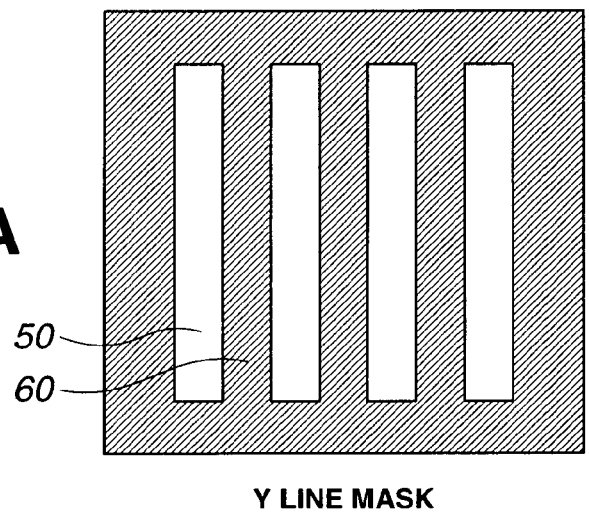
FIG. 2A is a plan view of a Y-line double dipole mask.
Figure 2B:
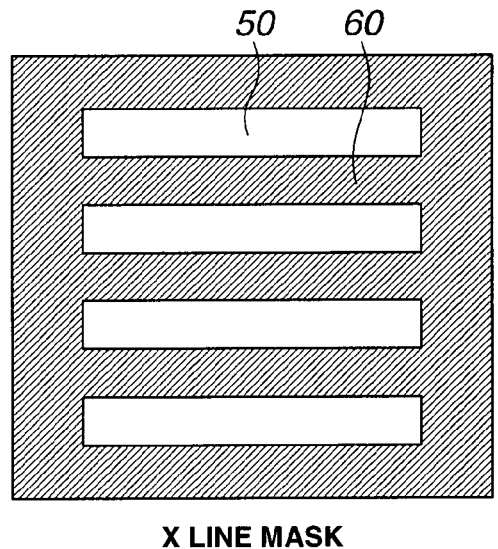
FIG. 2B is a plan view of a X-line double dipole mask.
Figure 2C:
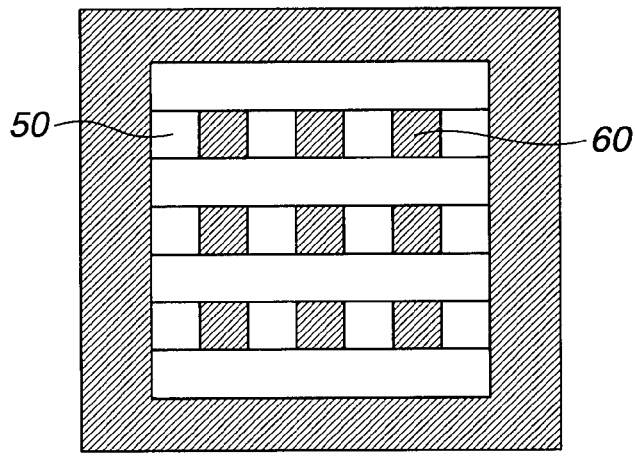
FIG. 2C shows an exposure region where exposure is made through overlapped Y and X-line masks.

One exemplary method as shown in FIG. 2 involves exposure of Y lines (FIG. 2A), subsequent exposure of X lines (FIG. 2B), PEB, and development, forming a dot pattern (FIG. 2C). This is the double dipole illumination method described previously. In the figures, white areas 50 are exposed regions and grey areas 60 are light-shielded regions.

Figure 3:
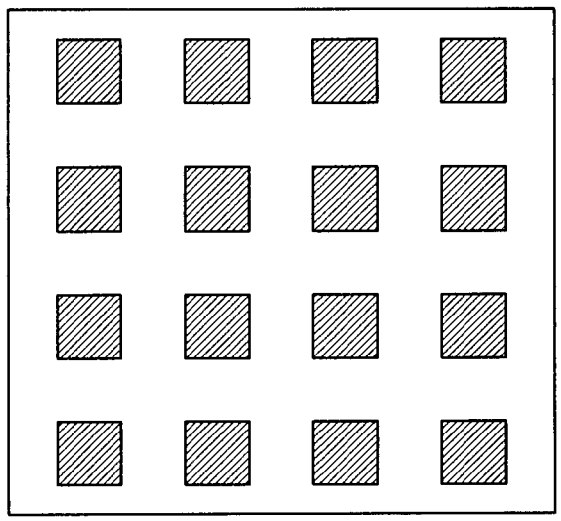
FIG. 3 is a plan view of a dot pattern mask.
Figure 4A:
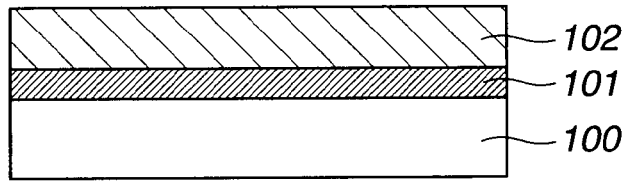
FIG. 4A shows formation of a photoresist film.
Figure 4B:
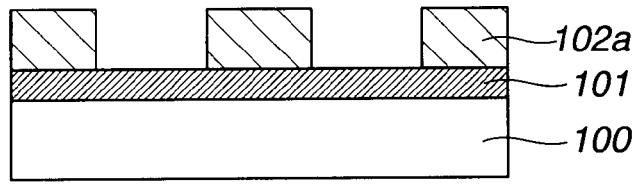
FIG. 4B shows exposure and development of the photoresist film.
Figure 4C:
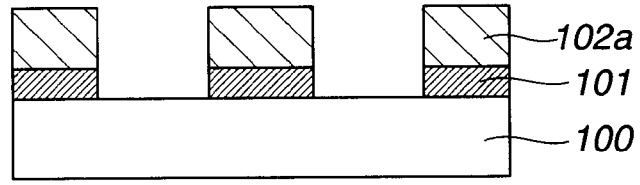
FIG. 4C shows etching of a processable substrate.
Figure 5A:
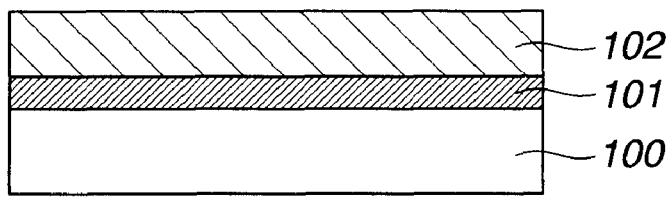
FIG. 5A shows formation of a photoresist film.
Figure 5B:
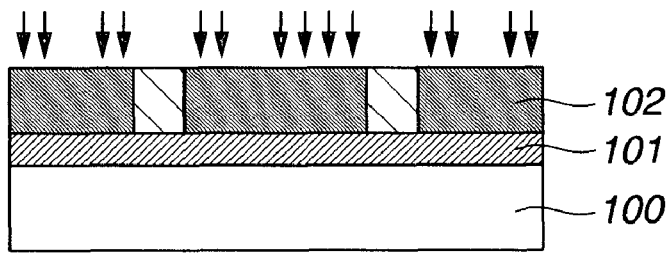
FIG. 5B shows exposure and heating of the photoresist film.
Figure 5C:
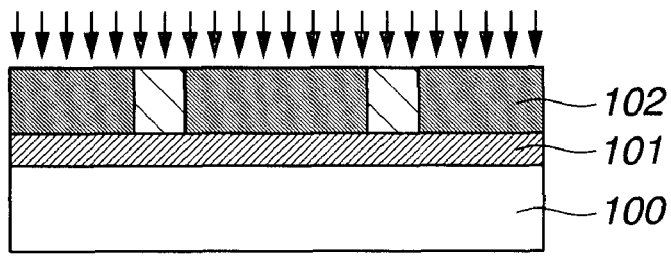
FIG. 5C shows flood exposure.
Figure 5D:
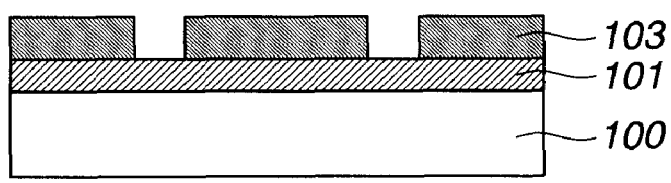
FIG. 5D shows pattern reversal by development.
Figure 5E:
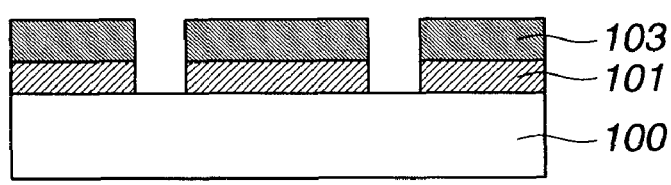
FIG. 5E shows etching of a processable substrate.
Figure 6A:
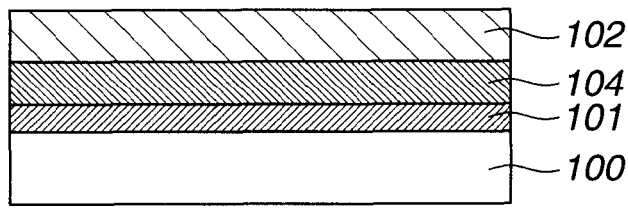
FIG. 6A shows formation of a photoresist film.
Figure 6B:
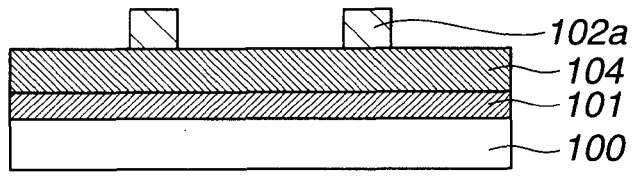
FIG. 6B shows exposure and development of the photoresist film.
Figure 6C:
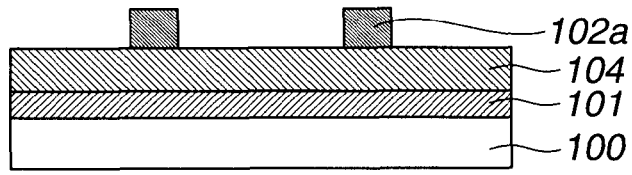
FIG. 6C shows crosslinking of the photoresist film.
Figure 6D:
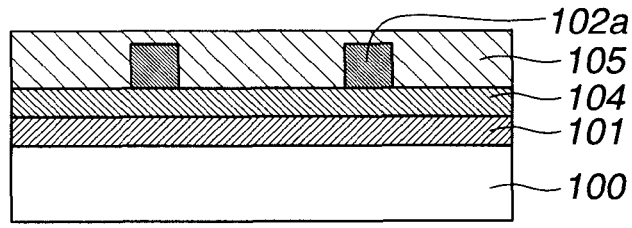
FIG. 6D shows coating of a SOG film.
Figure 6E:
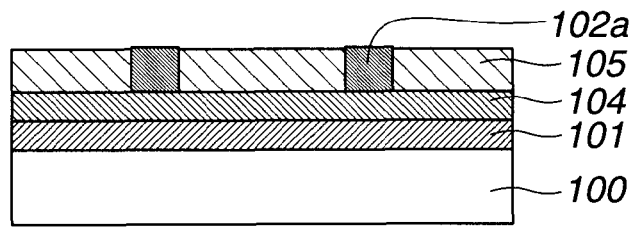
FIG. 6E shows light etching with CMP or CF gas.
Figure 6F:
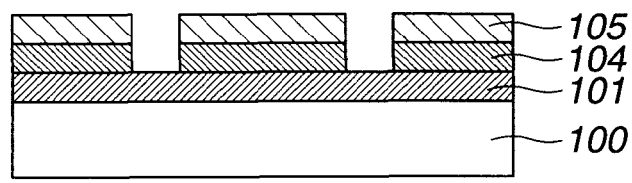
FIG. 6F shows pattern reversal by oxygen/hydrogen gas etching.
Figure 6G:
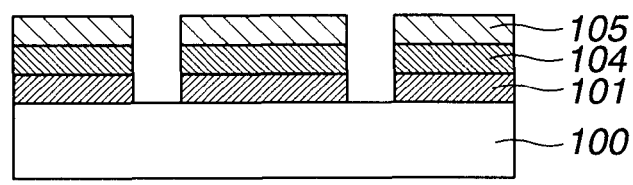
FIG. 6G shows etching of a processable substrate.
Figure 7:
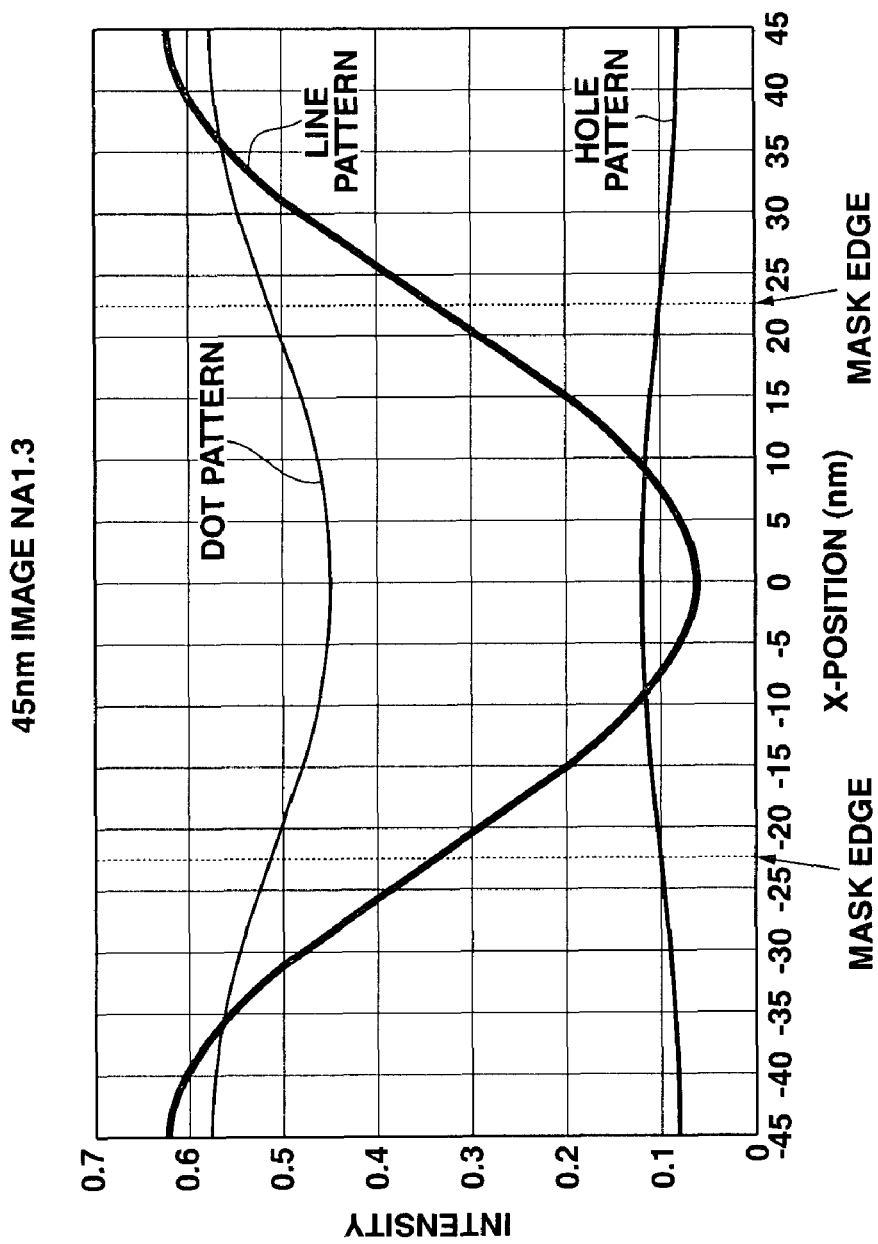
FIG. 7 is a diagram showing the optical contrasts of hole, dot and line patterns with 90 nm pitch and 45 nm size when illuminated through a lens with NA 1.3.

Alternatively, a hole pattern can be formed by using a mask as shown in FIG. 3, forming a dot pattern through a single exposure step, and reversing the pattern. This embodiment is disadvantageous in that holes having a pitch as fine as the dot formation by double exposure steps cannot be formed, but has the merit of convenience that a dot pattern can be formed by single exposure.

Figure 1C:
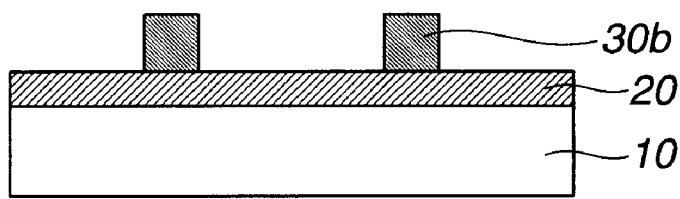
FIG. 1C shows that the resist pattern is deprotected and crosslinked under the action of acid and heat.

Next, the resist pattern is treated to eliminate acid labile groups in the polymer (base resin) in the pattern and to crosslink the polymer, forming a crosslinked pattern 30b (FIG. 1C). To induce elimination of acid labile groups and crosslinking on the polymer in the resist pattern, acid and heat are necessary. In practice, once an acid is generated, heat is applied to effect elimination of acid labile groups and crosslinking at the same time. The acid may be generated by a suitable method such as flood exposure of the wafer (pattern) as developed for decomposing the photoacid generator. The flood exposure uses an exposure wavelength of 180 to 400 nm and an exposure dose of 10 mJ/cm$^2$ to 1 J/cm$^2$. Radiation with a wavelength of less than 180 nm, specifically irradiation of excimer lasers or excimer lamps of 172 nm, 146 nm and 122 nm is undesirable because not only the generation of acid from photoacid generator, but also photo-induced crosslinking reaction are accelerated, leading to a decrease of alkaline dissolution rate due to excessive crosslinking. For the flood exposure, use is preferably made of an ArF excimer laser with a wavelength longer than 193 nm, a KrCl excimer lamp of 222 nm, a KrF excimer laser of 248 nm, a low-pressure mercury lamp centering at 254 nm, a XeCl excimer lamp of 308 nm, and i-line of 365 nm. In an alternative embodiment wherein a thermal acid generator in the form of an ammonium salt is added to the positive resist composition, the acid can be generated by heating. In this embodiment, acid generation and crosslinking reaction take place simultaneously. Preferred heating conditions include a temperature of 150 to 400° C., especially 160 to 300° C. and a time of 10 to 300 seconds. As a result, a crosslinked resist pattern which is insoluble in the solvent of the reversal film-forming composition is yielded.

In the alternative embodiment, the ammonium salt as the thermal acid generator may be added in an amount of 0 to 15, and especially 0 to 10 parts by weight per 100 parts by weight of the base resin. When used, at least 0.1 phr of the ammonium salt is preferred.

Suitable ammonium salts serving as the thermal acid generator include compounds of the formula (P1a-2).

(P1a-2)

Herein K$^-$ is a sulfonate having at least one fluorine substituted at α-position, or perfluoroalkylimidate or perfluoroalkylmethidate. R$^{101d}$, R$^{101e}$, R$^{101f}$, and R$^{101g}$ are each independently hydrogen, a straight, branched or cyclic alkyl, alkenyl, oxoalkyl or oxoalkenyl group of 1 to 12 carbon atoms, an aryl group of 6 to 20 carbon atoms, or an aralkyl or aryloxoalkyl group of 7 to 12 carbon atoms, in which some or all hydrogen atoms may be substituted by alkoxy groups. Alternatively, R$^{101d}$ and R$^{101e}$, or R$^{101d}$, R$^{101e}$ and R$^{101f}$ may bond together to form a ring with the nitrogen atom to which they are attached, and each of R$^{101e}$ and R$^{101f}$ or each of R$^{101d}$, R$^{101e}$ and R$^{101f}$ is a C$_3$-C$_{10}$ alkylene group or a hetero-aromatic ring having incorporated therein the nitrogen atom when they form a ring.

Examples of K$^-$ include perfluoroalkanesulfonates such as triflate and nonaflate, imidates such as bis(trifluoromethylsulfonyl)imide, bis(perfluoroethylsulfonyl)imide, and bis(perfluorobutylsulfonyl)imide, methidates such as tris(trifluoromethylsulfonyl)methide and tris(perfluoroethylsulfonyl)methide, and sulfonates having fluorine substituted at α-position, represented by the formula (K-1), and sulfonates having fluorine substituted at α-position, represented by the formula (K-2).

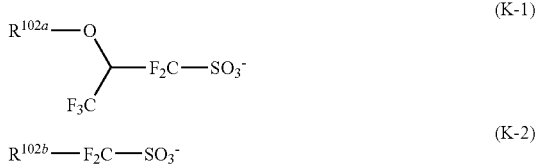

In formula (K-1), $R^{102a}$ is hydrogen, a straight, branched or cyclic $C_1$-$C_{20}$ alkyl or acyl group, $C_2$-$C_{20}$ alkenyl group or $C_6$-$C_{20}$ aryl or aryloxy group, which may have an ether, ester, carbonyl group or lactone ring and in which some or all hydrogen atoms may be substituted by fluorine atoms. In formula (K-2), $R^{102b}$ is hydrogen, a straight, branched or cyclic $C_1$-$C_{20}$ alkyl group, $C_2$-$C_{20}$ alkenyl group or $C_6$-$C_{20}$ aryl group.

Figure 1D:
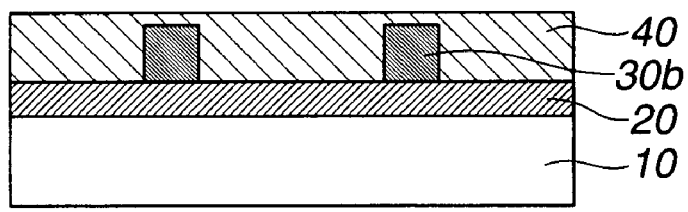
FIG. 1D shows that a pattern reversal film is coated.

Next, as shown in FIG. 1D, the reversal film-forming composition is built up until it covers the crosslinked resist pattern 30b, forming a reversal film 40. Preferably the thickness of the reversal film 40 is equal to the height of the resist pattern 30b or ±30 nm.

Figure 1E:
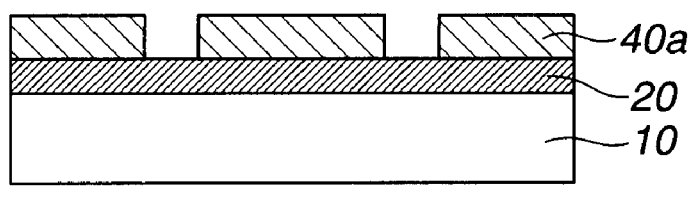
FIG. 1E shows that the pattern reversal film is developed for positive/negative reversal.

Next, the alkaline developer liquid is applied to dissolve a surface layer of the reversal film 40 until the crosslinked resist pattern 30b is exposed. From this point of time downward, the crosslinked resist pattern 30b is selectively dissolved since the dissolution rate in the alkaline developer of the crosslinked resist pattern 30b is substantially higher than that of the reversal film 40. Eventually, the crosslinked resist pattern 30b is dissolved away, yielding the reversal film 40 provided with a reversal pattern 40a which is a negative of the crosslinked resist pattern 30b as shown in FIG. 1E. If the resist pattern is a dot pattern, the resulting reversal pattern is a hole pattern.

Figure 1F:
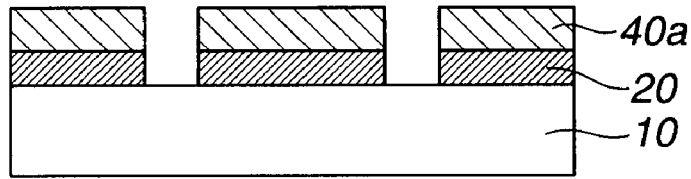
FIG. 1F shows that the processable substrate is etched using the positive/negative reversal pattern.

Furthermore, as shown in FIG. 1F, using the reversal pattern 40a as a mask, the intermediate intervening layer of hard mask or the like (if any) is etched, and the processable substrate 20 further etched. For etching of the intermediate intervening layer of hard mask or the like, dry etching with fluorocarbon or halogen gases may be used. For etching of the processable substrate, the etching gas and conditions may be properly chosen so as to establish an etching selectivity relative to the hard mask, and specifically, dry etching with fluorocarbon, halogen, oxygen, hydrogen or similar gases may be used. Thereafter, the crosslinked resist film and second resist film are removed. Removal of these films may be carried out after etching of the intermediate intervening layer of hard mask or the like. It is noted that removal of the crosslinked resist film may be achieved by dry etching with oxygen or radicals and removal of the second resist film may be achieved as previously described, or using strippers such as amines, sulfuric acid/aqueous hydrogen peroxide or organic solvents.

Example

Examples of the invention are given below by way of illustration and not by way of limitation. The abbreviations used herein are GPC for gel permeation chromatography, Mw for weight average molecular weight, Mn for number average molecular weight, Mw/Mn for molecular weight distribution or dispersity, NMR for nuclear magnetic resonance, PAG for photoacid generator, and TAG for thermal acid generator. For all polymers, Mw and Mn are determined by GPC versus polystyrene standards.

Synthesis Examples

Polymers for use in reversal film-forming compositions were prepared by combining various monomers, effecting copolymerization reaction in tetrahydrofuran medium, crystallization in methanol, repeatedly washing with hexane, isolation, and drying. The resulting polymers (Polymers 1 to 13 and Comparative Polymers 1 to 2) had the composition shown below. Notably, a phenol group on a monomer was substituted by an acetoxy group, which was converted back to a phenol group by alkaline hydrolysis after polymerization. The composition of each polymer was analyzed by $^1$H-NMR, and the Mw and Mw/Mn determined by GPC.

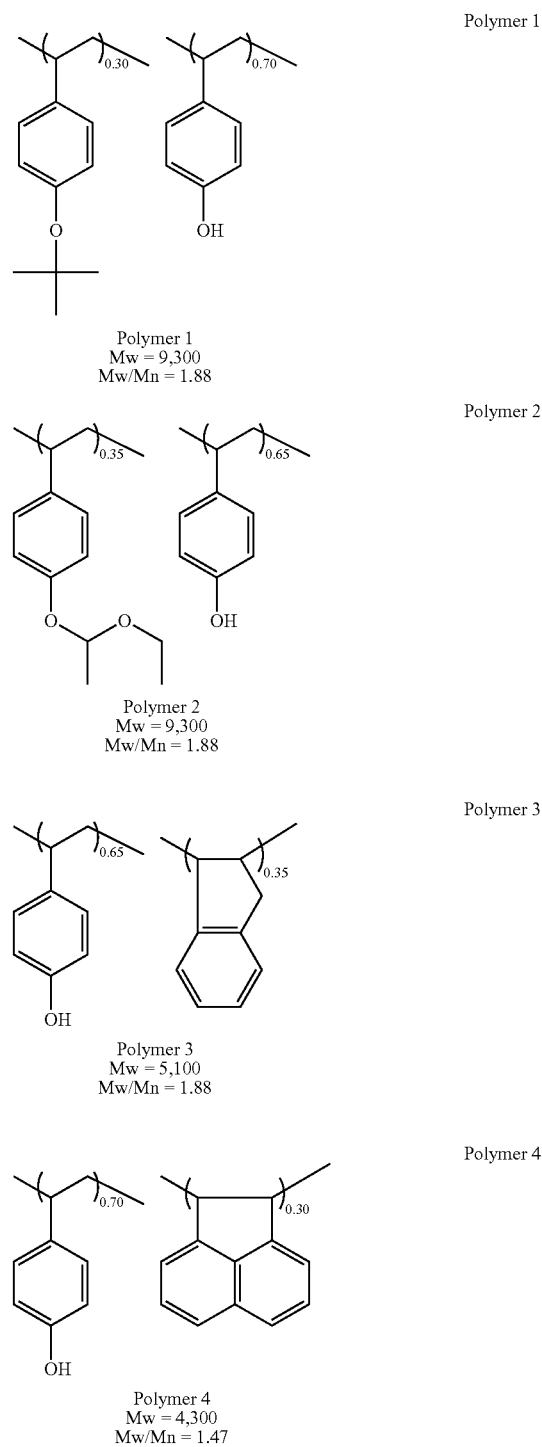

-continued
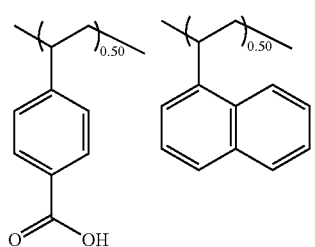
Polymer 5
Mw = 9,300
Mw/Mn = 1.88
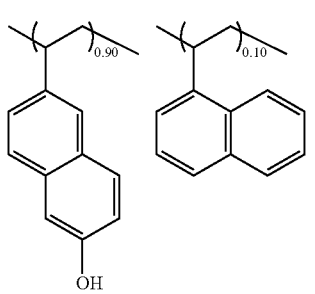
Polymer 6
Mw = 9,300
Mw/Mn = 1.88
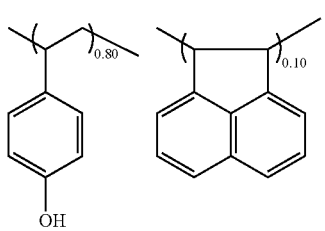
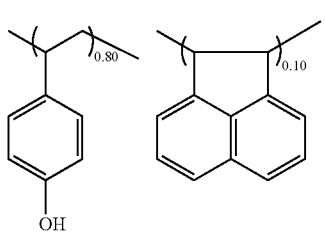
Polymer 7
Mw = 5,100
Mw/Mn = 1.65
-continued
Polymer 5
Polymer 6
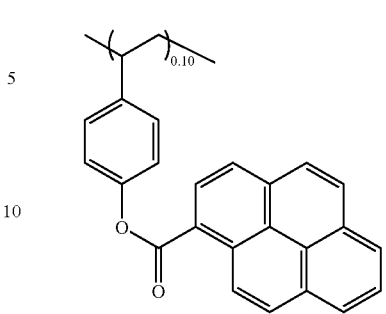
Polymer 8
Mw = 5,200
Mw/Mn = 1.65
Polymer 7
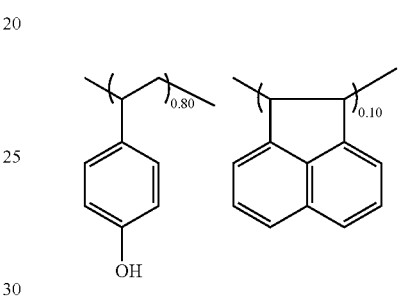
Polymer 8
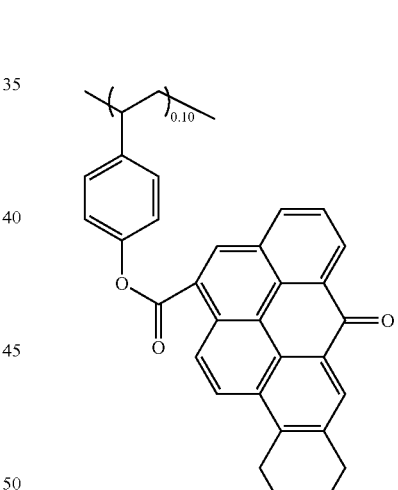
Polymer 9
Mw = 5,100
Mw/Mn = 1.64
Polymer 9
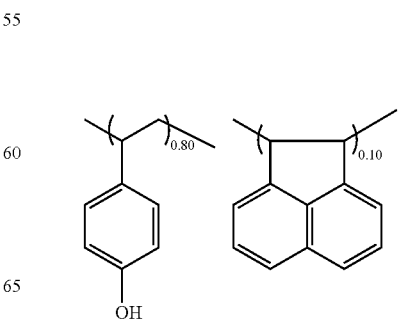
Polymer 10

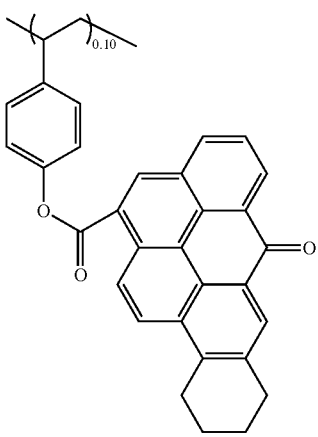

Polymer 10
Mw = 7,100
Mw/Mn = 1.85

Polymer 11: a novolac resin of m-tert-butylphenol and 1-naphthol in a molar ratio of 6:4, with Mw 8,600 and Mw/Mn 4.8

Polymer 12: a novolac resin of 4,4'-(9H-fluoren-9-ylidene)-bisphenol, with Mw 7,900 and Mw/Mn 5.1

Polymer 13: a novolac resin of (9H-fluorene-9-ylidene)-bis-naphthol, with Mw 1,600 and Mw/Mn 3.8

Reversal film-forming compositions were prepared by combining Polymers 1 to 13 defined above, Comparative Polymers 1 and 2 shown below, alkali-soluble surfactants for enhancing a surface alkaline dissolution rate, alkali-soluble etching resistance improvers, basic quenchers, and solvents in accordance with the formulation of Table 1. To the solvent, 100 ppm of a fluorochemical surfactant FC-4430 (3M-Sumitomo Co., Ltd.) was added. The reversal film-forming compositions were coated onto HMDS-primed 8-inch silicon substrates and baked at 110° C. for 60 seconds to form pattern reversal films of 60 nm thick. The films were developed with a developer in the form of a 2.38 wt % tetramethylammonium hydroxide (TMAH) aqueous solution for 30 seconds. A film thickness reduction by development was determined, from which a dissolution rate (in nm/s) was computed.

Alkali-soluble surfactant 1

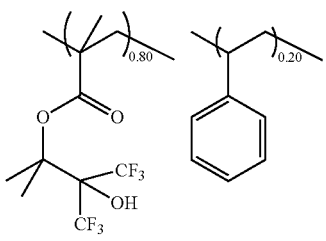

Mw 8,300,
Mw/Mn 1.80

Alkali-soluble surfactant 2

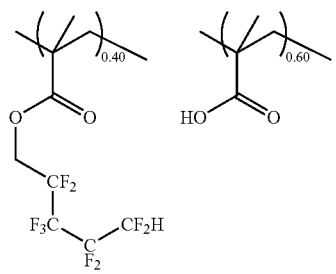

Mw 9,700,
Mw/Mn 1.79

Alkali-soluble surfactant 3

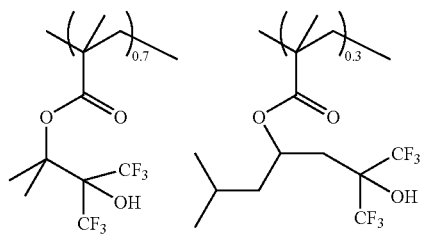

Mw 8,200,
Mw/Mn 1.76

Etching improver 1

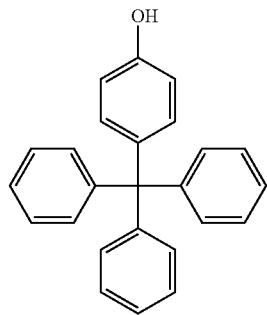

Etching improver 2

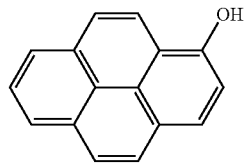

Etching improver 3

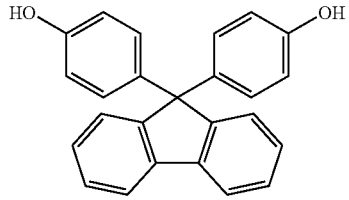

Etching improver 4

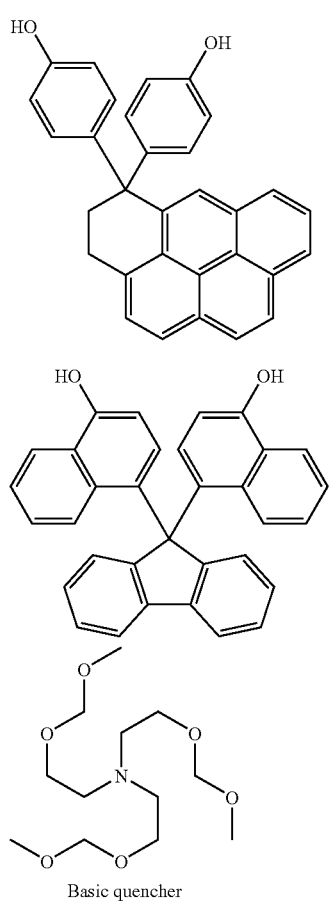

Etching improver 5

Basic quencher

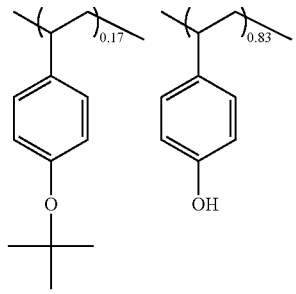

Comparative Polymer 1
Mw = 9,100
Mw/Mn = 1.74

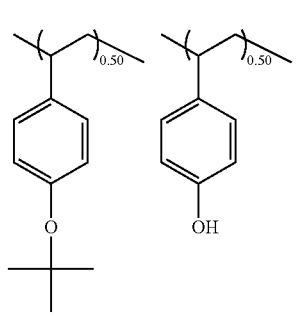

Comparative Polymer 2
Mw = 9,900
Mw/Mn = 1.89

TABLE 1

| Reversal film | Polymer (pbw) | Additive (pbw) | Solvent (pbw) | Dissolution rate (nm/s) |
|---|---|---|---|---|
| RF1 | Polymer 1 (100) | Basic quencher (2.0) | PGMEA (3,000) | 0.2 |
| RF2 | Polymer 2 (100) | Basic quencher (2.0) | EL (3,200) | 0.3 |
| RF3 | Polymer 3 (100) | — | PGMEA/PGME (2,500/500) | 0.2 |
| RF4 | Polymer 4 (100) | — | PGMEA/2-heptanone (2,500/500) | 0.16 |
| RF5 | Polymer 5 (100) | — | PGMEA (3,000) | 0.4 |
| RF6 | Polymer 6 (100) | — | PGMEA (3,000) | 0.5 |
| RF7 | Polymer 11 (100) | — | PGMEA (3,000) | 0.3 |
| RF8 | Polymer 1 (94) | Alkali-soluble surfactant 1 (6.0) | PGMEA (3,000) | 0.35 |
| RF9 | Polymer 1 (95) | Alkali-soluble surfactant 2 (5.0) | PGMEA (3,000) | 0.48 |
| RF10 | Polymer 1 (70) | Etching improver 1 (30) | PGMEA/cyclohexanone (1,000/2,000) | 0.18 |
| RF11 | Polymer 1 (70) | Etching improver 2 (30) | PGMEA (3,000) | 0.28 |
| RF12 | Polymer 1 (70) | Etching improver 3 (30) | PGMEA (3,000) | 0.22 |
| RF13 | Polymer 1 (70) | Etching improver 4 (30) | PGMEA (3,000) | 0.17 |
| RF14 | Polymer 2-1 (95) | Alkali-soluble surfactant 3 (5.0) | PGMEA (3,000) | 0.45 |
| RF15 | Polymer 2-1 (80) | Etching improver 5 (20) | PGMEA (3,000) | 0.15 |

TABLE 1-continued

| Reversal film | Polymer (pbw) | Additive (pbw) | Solvent (pbw) | Dissolution rate (nm/s) |
|---|---|---|---|---|
| RF16 | Polymer 7 (100) | — | PGMEA (3,000) | 0.21 |
| RF17 | Polymer 8 (100) | — | PGMEA (3,000) | 0.22 |
| RF18 | Polymer 9 (100) | — | PGMEA (3,000) | 0.26 |
| RF19 | Polymer 10 (100) | — | PGMEA (3,000) | 0.23 |
| RF20 | Polymer 12 (100) | — | PGMEA (3,000) | 0.3 |
| RF21 | Polymer 13 (100) | — | PGMEA (3,000) | 0.21 |
| RF22 | Comparative Polymer 1 (70) | — | PGMEA (3,000) | 2.4 |
| RF23 | Comparative Polymer 2 (70) | — | PGMEA (3,000) | 0.0001 |

PGMEA: propylene glycol monomethyl ether acetate
EL: ethyl lactate
PGME: propylene glycol monomethyl ether Preparation of Positive Resist Composition and Alkali-Soluble Protective Coating Composition Resist solutions and protective coating solutions were prepared by dissolving polymers (Resist polymer and Protective film polymer) and components in solvents in accordance with the formulation of Tables 2 and 4, and filtering through a filter with a pore size of 0.2 μm. The components in Table 2 are identified below.

Acid Generator: PAG1 of the Following Structural Formula

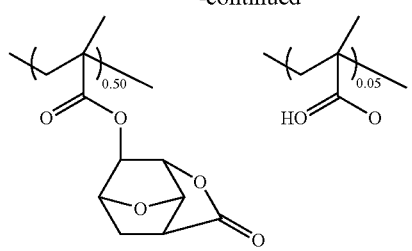

PAG1

Resist Polymer 1

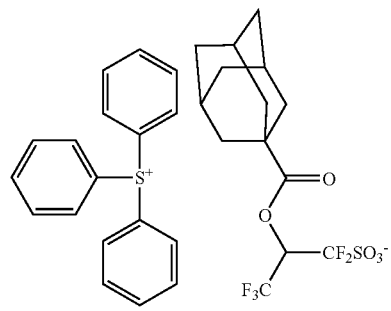

-continued

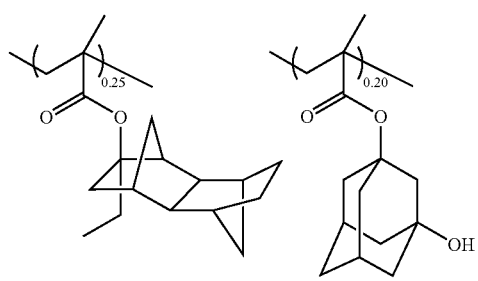

Resist Polymer 1
Mw = 8,310
Mw/Mn = 1.73

Resist Polymer 2

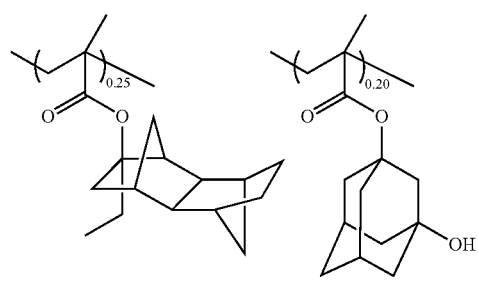

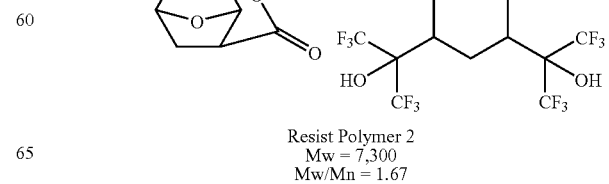

Resist Polymer 2
Mw = 7,300
Mw/Mn = 1.67

Resist Polymer 3
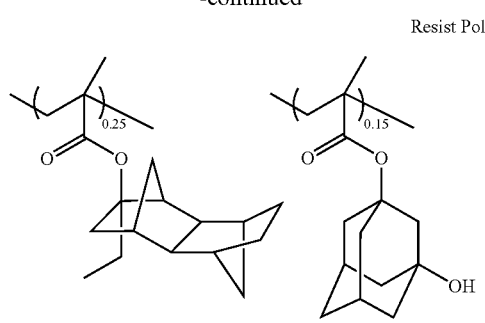
Resist Polymer 3
Mw = 7,300
Mw/Mn = 1.67
Resist Polymer 4
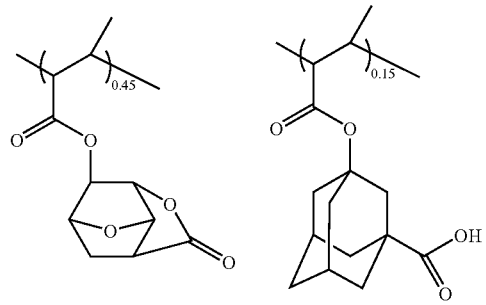
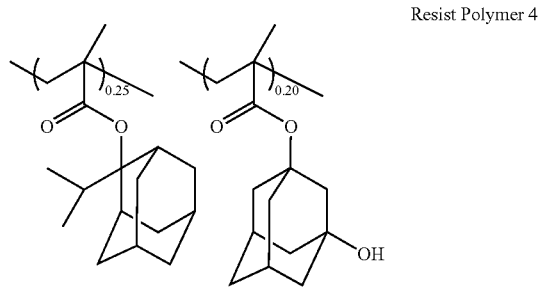
Resist Polymer 4
Mw = 6,600
Mw/Mn = 1.83
Resist Polymer 5
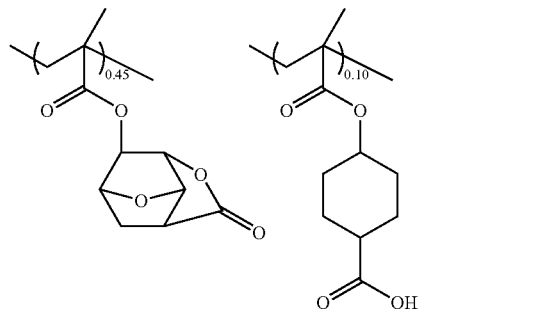
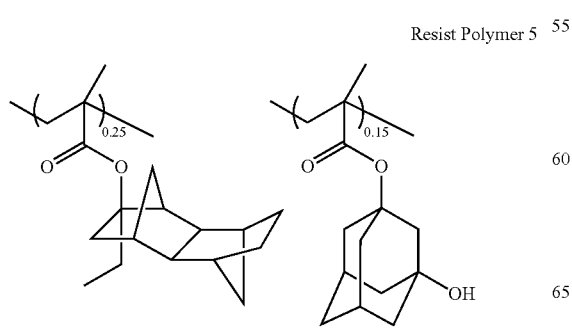
Resist Polymer 5
Mw = 7,100
Mw/Mn = 1.73
Resist Polymer 6
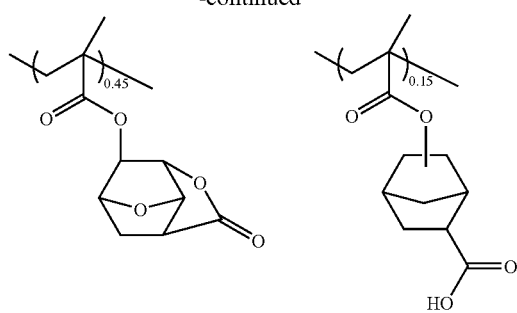
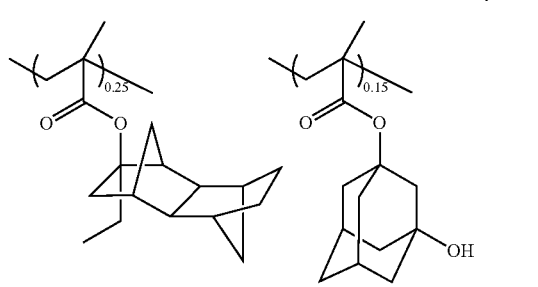
Resist Polymer 6
Mw = 7,500
Mw/Mn = 1.85
Resist Polymer 7
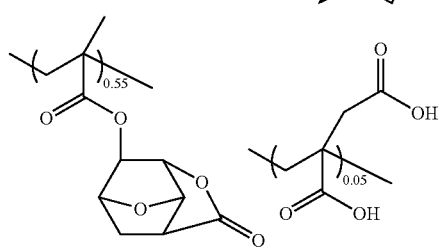
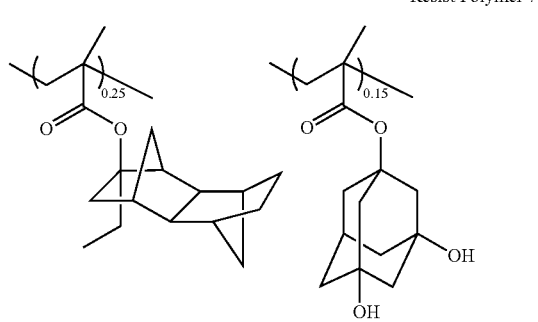
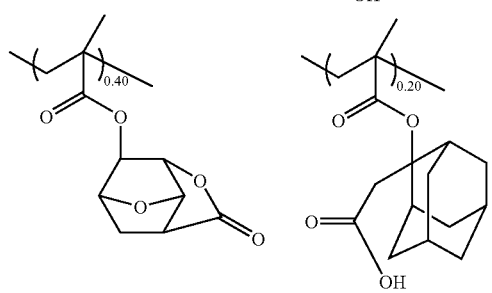
Resist Polymer 7
Mw = 7,300
Mw/Mn = 1.67

Resist Polymer 8
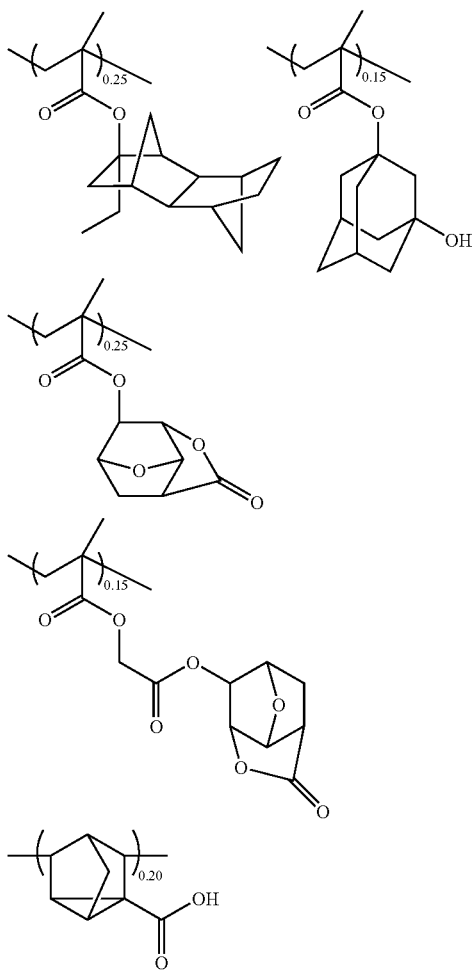
Resist Polymer 8
Mw = 6,800
Mw/Mn = 1.79
Resist Polymer 9
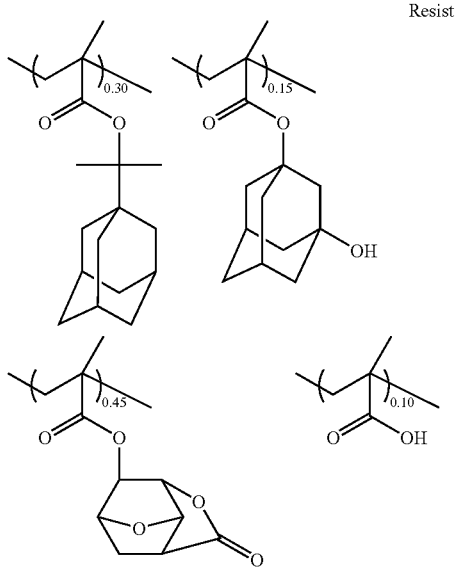
Resist Polymer 9
Mw = 7,500
Mw/Mn = 1.86
Comparative Resist Polymer 1
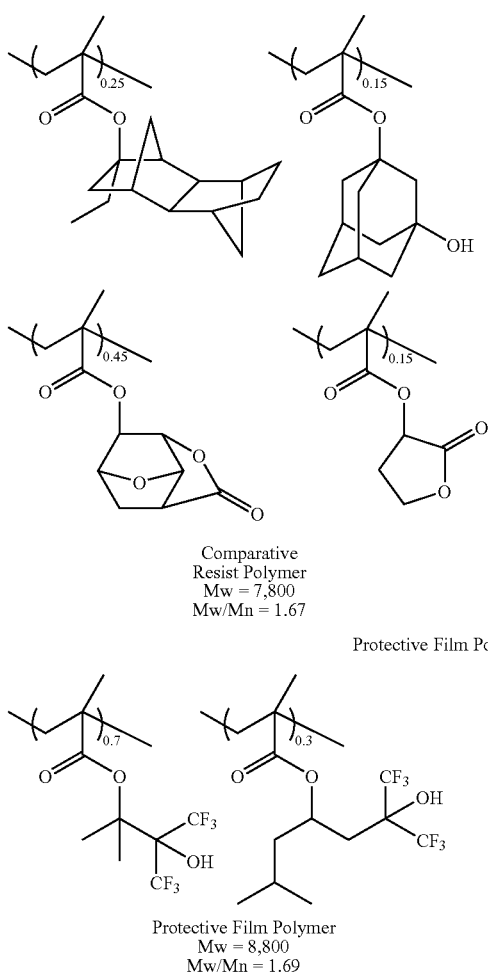
Comparative
Resist Polymer
Mw = 7,800
Mw/Mn = 1.67
Protective Film Polymer
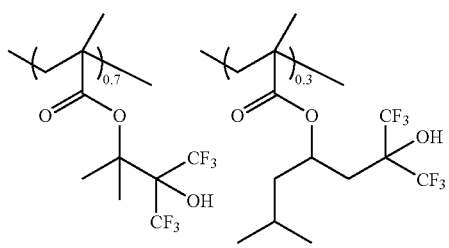
Protective Film Polymer
Mw = 8,800
Mw/Mn = 1.69
Basic compounds: Quenchers 1 and 2 of the following structural formulae
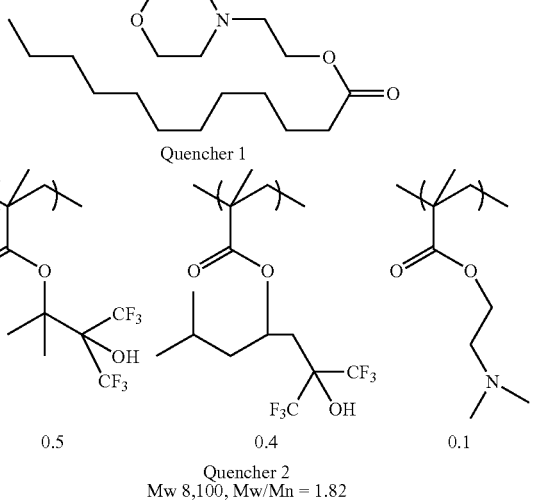
Quencher 2
Mw 8,100, Mw/Mn = 1.82

Acid generator: TAG1 of the following structural formula

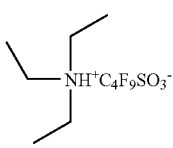

TAG1

Organic solvent: PGMEA (propylene glycol monomethyl ether acetate)

Solvent and Alkali Dissolution Rate after High-Temperature Baking

Resist compositions were prepared in accordance with the formulation of Table 2. On a substrate (silicon wafer) having an antireflective coating (ARC-29A, Nissan Chemical Industries, Ltd.) of 90 nm thick, each of the resist compositions was spin coated and baked on a hot plate at 110° C. for 60 seconds to form a resist film of 150 nm thick.

The films of Resists 1 and 2 were exposed on the wafer front surface by means of an ArF scanner S-305B (Nikon Corp., NA 0.68, σ0.85, normal illumination) through an open frame at a dose of 50 mJ/cm$^2$, and baked at 200° C. for 60 seconds. The films of Resists 3 to 12 and Comparative Resist 1 were baked at 200° C. for 60 seconds without exposure.

On the resist film after 200° C./60 sec baking, a solvent was statically dispensed for 30 seconds. Thereafter, the sample was rotated at 2000 rpm for 30 seconds for spinning off the solvent and baked at 100° C. for 60 seconds for drying off the solvent. A change of film thickness from the 200° C. baked film was determined using a film thickness gauge.

Separately, the resist film after 200° C./60 sec baking was examined for alkaline dissolution rate. Using a resist development analyzer RDA-790 (Lithotec Japan Co., Ltd.), an alkaline dissolution rate of the film in 2.38 wt % TMAH aqueous solution was measured. The results are shown in Table 3.

ArF Lithography Patterning

On a substrate (silicon wafer) having an antireflective coating (ARC-29A, Nissan Chemical Industries, Ltd.) of 90 nm thick, each of the resist compositions shown in Table 2 was spin coated, then baked on a hot plate at 110° C. for 60 seconds to form a resist film having a thickness of 120 nm. In Examples 1 to 26, 29 and Comparative Examples 1 to 4, a protective coating composition TC-1 shown in Table 4 was spin coated on the resist film and baked at 90° C. for 60 seconds to form a protective film of 50 nm thick. In Example 27 or 28, a protective coating composition TC-2 or TC-3 shown in Table 4 was spin coated on the resist film and baked at 90° C. for 60 seconds to form a protective film of 50 nm thick.

Using an ArF excimer laser immersion lithography scanner XT-1700i (ASML Holding NV, NA 1.20, σ0.96/0.8, 20° c-quad illumination, X-Y polarized illumination, 6% half-tone phase shift mask), first immersion exposure of a 50-nm 1:1 line-and-space pattern in X direction was performed in a first zone, and second immersion exposure of a 50-nm 1:1 line-and-space pattern in Y direction was performed in a second zone different from the first zone. Immediately after the exposure, the sample was baked at 100° C. for 60 seconds and developed with a 2.38 wt % TMAH aqueous solution for 30 seconds, yielding a dot pattern of 50 nm size. The dot pattern resulting from double exposures of orthogonal X and Y direction lines and subsequent PEB and development was then exposed to radiation from an ArF excimer laser in a dose of 30 mJ/cm$^2$ to generate an acid, and then baked at 200° C. for 60 seconds to facilitate deprotection of acid labile groups and crosslinking. The dot patterns resulting from Resists 3 to 11 were baked at 200° C. for 60 seconds to cause the thermal acid generator to generate an acid and to facilitate deprotection of acid labile groups and crosslinking. On cross-sectional observation of the film, the dot pattern was found to have a height of 60 nm.

On the dot pattern, each of the pattern reversal film-forming compositions of Examples 1 to 34 and Comparative Examples 1 to 5 was coated to a thickness of 60 nm and developed with a 2.38 wt % TMAH aqueous solution for 30 seconds. In Comparative Example 3, using an ArF excimer laser immersion lithography scanner XT-1700i (ASML Holding NV, NA 1.20, σ0.96/0.8, 20° c-quad illumination, X-Y polarized illumination, 6% half-tone phase shift mask), exposure of a 50-nm 1:1 hole pattern was followed by PEB and development. Under TDSEM S-9380 (Hitachi Ltd.), the sample was observed whether or not the dot pattern was converted to a hole pattern.

TABLE 2

|  | Polymer (pbw) | Acid generator (pbw) | Basic compound (pbw) | Organic solvent (pbw) |
|---|---|---|---|---|
| Resist 1 | Resist Polymer 1 (100) | PAG1 (14.0) | Quencher 1 (1.20) | PGMEA (2,000) |
| Resist 2 | Resist Polymer 2 (100) | PAG1 (14.0) | Quencher 1 (1.20) | PGMEA (2,000) |
| Resist 3 | Resist Polymer 1 (100) | PAG1 (14.0) TAG1 (0.5) | Quencher 1 (1.20) | PGMEA (2,000) |
| Resist 4 | Resist Polymer 2 (100) | PAG1 (14.0) TAG1 (0.5) | Quencher 1 (1.20) | PGMEA (2,000) |
| Resist 5 | Resist Polymer 3 (100) | PAG1 (14.0) TAG1 (0.5) | Quencher 1 (1.20) | PGMEA (2,000) |
| Resist 6 | Resist Polymer 4 (100) | PAG1 (14.0) TAG1 (0.5) | Quencher 1 (1.20) | PGMEA (2,000) |
| Resist 7 | Resist Polymer 5 (100) | PAG1 (14.0) TAG1 (0.5) | Quencher 1 (1.20) | PGMEA (2,000) |
| Resist 8 | Resist Polymer 6 (100) | PAG1 (14.0) TAG1 (0.5) | Quencher 1 (1.20) | PGMEA (2,000) |
| Resist 9 | Resist Polymer 7 (100) | PAG1 (14.0) TAG1 (0.5) | Quencher 1 (1.20) | PGMEA (2,000) |
| Resist 10 | Resist Polymer 8 (100) | PAG1 (14.0) | Quencher 1 (1.20) | PGMEA (2,000) |
| Resist 11 | Resist Polymer 9 (100) | PAG1 (14.0) | Quencher 1 (1.20) | PGMEA (2,000) |
| Resist 12 | Resist Polymer 1 (100) | PAG1 (14.0) TAG1 (0.5) | Quencher 1 (0.8) Quencher 2 (4.0) | PGMEA (2,000) |
| Comparative Resist 1 | Comparative Resist Polymer 1 (100) | PAG1 (14.0) TAG1 (0.5) | Quencher 1 (1.20) | PGMEA (2,000) |

TABLE 3

| | Solvent | Thickness reduction by solvent (nm) | Alkali dissolution rate (nm/s) |
|---|---|---|---|
| Resist 1 | PGMEA | 0.5 | 170 |
| Resist 2 | PGMEA | 1.5 | 153 |
| Resist 3 | PGMEA | 0.6 | 180 |
| Resist 3 | EL | 1.2 | |
| Resist 3 | PGMEA/EL (85/15) | 0.7 | |
| Resist 3 | PGMEA/PGME (85/15) | 1.3 | |
| Resist 3 | PGMEA/Cyclohexanone (85/15) | 0.4 | |
| Resist 3 | 2-heptanone | 0.8 | |
| Resist 4 | PGMEA | 1.8 | 162 |
| Resist 5 | PGMEA | 0.2 | 140 |
| Resist 6 | PGMEA | 0.6 | 132 |
| Resist 7 | PGMEA | 0.3 | 144 |
| Resist 8 | PGMEA | 0.6 | 280 |
| Resist 9 | PGMEA | 0.8 | 148 |
| Resist 10 | PGMEA | 0.7 | 126 |
| Resist 11 | PGMEA | 0.6 | 177 |
| Resist 12 | PGMEA | 0.8 | 175 |
| Comparative Resist 1 | PGMEA | 53 | 40 |
| Comparative Resist 1, 172 nm irradiated | PGMEA | 5 | 3 |

TABLE 4

| | Polymer (pbw) | Additive (pbw) | Organic solvent (pbw) |
|---|---|---|---|
| TC1 | Protective Film Polymer (100) | — | diisoamyl ether (2700) 2-methyl-1-butanol (270) |
| TC2 | Protective Film Polymer (100) | Quencher 1 (0.3) | diisoamyl ether (2700) 2-methyl-1-butanol (270) |
| TC3 | Protective Film Polymer (100) | tri-n-octylamine (0.3) | diisoamyl ether (2700) 2-methyl-1-butanol (270) |

TABLE 5

Conversion from dot pattern to hole pattern

| | Resist | Reversal film | Hole size after reversal |
|---|---|---|---|
| Example 1 | Resist 1 | RF1 | 51 nm |
| Example 2 | Resist 2 | RF1 | 55 nm |
| Example 3 | Resist 3 | RF1 | 51 nm |
| Example 4 | Resist 4 | RF1 | 51 nm |
| Example 5 | Resist 4 | RF2 | 54 nm |
| Example 6 | Resist 4 | RF3 | 51 nm |
| Example 7 | Resist 4 | RF4 | 52 nm |
| Example 8 | Resist 4 | RF5 | 55 nm |
| Example 9 | Resist 4 | RF6 | 56 nm |
| Example 10 | Resist 4 | RF7 | 52 nm |
| Example 11 | Resist 4 | RF8 | 51 nm |
| Example 12 | Resist 4 | RF9 | 51 nm |
| Example 13 | Resist 4 | RF10 | 51 nm |
| Example 14 | Resist 4 | RF11 | 54 nm |
| Example 15 | Resist 4 | RF12 | 52 nm |
| Example 16 | Resist 4 | RF13 | 50 nm |
| Example 17 | Resist 4 | RF14 | 51 nm |
| Example 18 | Resist 4 | RF15 | 52 nm |
| Example 19 | Resist 4 | RF16 | 52 nm |
| Example 20 | Resist 5 | RF1 | 51 nm |
| Example 21 | Resist 6 | RF1 | 52 nm |
| Example 22 | Resist 7 | RF1 | 52 nm |
| Example 23 | Resist 8 | RF1 | 53 nm |
| Example 24 | Resist 9 | RF1 | 51 nm |
| Example 25 | Resist 10 | RF1 | 51 nm |
| Example 26 | Resist 11 | RF1 | 51 nm |
| Example 27 | Resist 1 | RF1 | 50 nm |
| Example 28 | Resist 1 | RF1 | 50 nm |
| Example 29 | Resist 12 | RF1 | 51 nm |
| Example 30 | Resist 4 | RF17 | 51 nm |
| Example 31 | Resist 4 | RF18 | 51 nm |
| Example 32 | Resist 4 | RF19 | 51 nm |
| Example 33 | Resist 4 | RF20 | 51 nm |
| Example 34 | Resist 4 | RF21 | 50 nm |
| Comparative Example 1 | Resist 4 | RF22 | 79 nm |
| Comparative Example 2 | Resist 4 | RF23 | No holes opened |
| Comparative Example 3 | Resist 4 | — | No holes opened |
| Comparative Example 4 | Comparative Resist 1 | RF1 | No holes opened |
| Comparative Example 5 | Comparative Resist 1 + 172 nm irradiation | RF1 | No holes opened |

As seen from the results of Table 5, in the pattern forming process of Examples 1 to 34, the dot pattern was converted into a hole pattern with a size change within 10%. In Comparative Example 1 wherein the pattern reversal film has too high an alkali dissolution rate, holes had a larger size. In Comparative Example 2 wherein the pattern reversal film has too low an alkali dissolution rate, no holes were opened.

On exposure by the standard technique, no holes of 50 nm were opened (Comparative Example 3). In Comparative Example 4, when the pattern reversal film-forming composition was coated on the comparative resist, the resist pattern was dissolved in the solvent of the composition so that mixing occurred, failing to open a hole pattern.

Dry Etching Resistance Test

In the dry etching resistance test, the pattern reversal film-forming compositions in Table 1 or the resist compositions in Table 2 as a comparative example were each spin coated on a silicon substrate and baked at 110° C. for 60 seconds to form a film of 100 nm thick. Next, an etching test was carried out on the film to evaluate dry etching resistance. The results are shown in Table 6.

$CHF_3/CF_4$ Gas Etching Test

These films were examined by a test of etching with $CHF_3$/$CF_4$ gas using a dry etching instrument TE-8500P by Tokyo Electron, Ltd. A difference in thickness of the polymer film before and after the etching test was determined. The etching conditions are shown below.

| | | |
|---|---|---|
| Chamber pressure | 40.0 | Pa |
| RF power | 1,000 | W |
| Gap | 9 | mm |
| $CHF_3$ gas flow rate | 30 | ml/min |
| $CF_4$ gas flow rate | 30 | ml/min |
| Ar gas flow rate | 100 | ml/min |
| Time | 10 | sec |

TABLE 6

| | Reversal film or resist film | Thickness reduction by CHF$_3$/CF$_4$ gas etching (nm) |
|---|---|---|
| Example 35 | RF1 | 9.2 |
| Example 36 | RF2 | 9.8 |
| Example 37 | RF3 | 8.2 |
| Example 38 | RF4 | 8.0 |
| Example 39 | RF5 | 8.8 |
| Example 40 | RF6 | 8.2 |
| Example 41 | RF7 | 9.0 |
| Example 42 | RF8 | 9.4 |
| Example 43 | RF9 | 9.5 |
| Example 44 | RF10 | 8.2 |
| Example 45 | RF11 | 9.0 |
| Example 46 | RF12 | 9.0 |
| Example 47 | RF13 | 8.8 |
| Example 48 | RF14 | 9.4 |
| Example 49 | RF15 | 8.2 |
| Example 50 | RF16 | 9.2 |
| Example 51 | RF17 | 9.0 |
| Example 52 | RF18 | 8.8 |
| Example 53 | RF19 | 9.2 |
| Example 54 | RF20 | 8.8 |
| Example 55 | RF21 | 8.0 |
| Comparative Example 6 | Resist 1 | 14 |
| Comparative Example 7 | Resist 2 | 15 |

As seen from Table 6, the pattern reversal films of these examples experience less thickness reductions than the resist films, indicating higher etching resistance.

While the invention has been described with reference to a preferred embodiment, it will be understood by those skilled in the art that various changes may be made and equivalents may be substituted for elements thereof without departing from the scope of the invention. Therefore, it is intended that the invention not be limited to the particular embodiment disclosed as the best mode contemplated for carrying out this invention, but that the invention will include all embodiments falling within the scope of the appended claims.

Japanese Patent Application Nos. 2007-247114 and 2008-027132 are incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A process for forming a pattern by way of positive/negative reversal, comprising the steps of:
   coating a chemically amplified positive resist composition onto a processable substrate, said resist composition comprising a resin comprising recurring units having acid labile groups which are eliminatable with acid, the resin turning to be soluble in an alkaline developer as a result of elimination of the acid labile groups, a photoacid generator capable of generating an acid upon exposure to high-energy radiation and optionally, a thermal acid generator capable of generating an acid upon heating, and an organic solvent, prebaking the resist composition to remove the solvent to form a resist film,
   exposing the resist film to high-energy radiation in a pattern of exposed and unexposed areas, post-exposure heating for causing the acid generated by the acid generator upon exposure to act on the acid labile groups on the resin whereby the acid labile groups on the resin in the exposed area undergo elimination reaction, and developing the exposed resist film with an alkaline developer to form a positive pattern,
   exposing to radiation or heating the positive pattern so that acid or heat acts to eliminate the acid labile groups on the resin in the positive pattern for thereby improving the alkali solubility of the resin, and to induce crosslinking in the resin to such an extent that the resin does not lose solubility in an alkaline wet etchant, for thereby endowing the positive pattern with resistance to an organic solvent to be used in a reversal film-forming composition,
   coating a reversal film-forming composition thereon to form a reversal film, and
   applying an alkaline wet etchant thereto for dissolving away the crosslinked positive pattern.

2. The process of claim 1 wherein
   in the step of exposing to radiation or heating the positive pattern for endowing the positive pattern with resistance to an organic solvent to be used in a reversal film-forming composition,
   the crosslinked positive pattern has a dissolution rate in the alkaline wet etchant corresponding to an etching rate in excess of 2 nm/sec when etched with a 2.38 wt % aqueous solution of tetramethylammonium hydroxide (TMAH),
   the reversal film-forming composition comprises an organic solvent selected from propylene glycol monomethyl ether acetate, cyclohexanone, ethyl lactate, propylene glycol monomethyl ether, heptanone, and a mixture of two or more of the foregoing, and
   the resistance of the crosslinked positive pattern to the organic solvent used in the reversal film-forming composition is such that the crosslinked positive pattern experiences a thickness reduction of not more than 10 nm when the pattern is kept in contact with the organic solvent for 30 seconds.

3. The process of claim 1 wherein the step of exposing to radiation or heating the positive pattern includes heat treatment at a higher temperature than in both the prebaking and post-exposure heating steps.

4. The process of claim 1 wherein the reversal film formed from the reversal film-forming composition is selectively etchable relative to metallic silicon and silicon oxide.

5. The process of claim 1 wherein the reversal film-forming composition comprises a resin comprising monomeric units of aromatic or alicyclic structure.

6. The process of claim 1, further comprising between the step of coating a reversal film-forming composition to form a reversal film and the step of applying an alkaline wet etchant for dissolving away the crosslinked positive pattern, the step of removing a portion of the reversal film overlying the crosslinked positive pattern.

7. The process of claim 6 wherein the step of removing a portion of the reversal film overlying the crosslinked positive pattern includes wet etching.

8. The process of claim 7 wherein in the step of applying an alkaline wet etchant to the reversal film, the reversal film is dissolvable therein, but has a slower dissolution rate than the crosslinked positive pattern, and
   the wet etching in the step of removing a portion of the reversal film overlying the crosslinked positive pattern uses an alkaline wet etchant, so that the step of removing a portion of the reversal film overlying the crosslinked positive pattern and the step of applying an alkaline wet etchant for dissolving away the crosslinked positive pattern are simultaneously carried out.

9. The process of claim 8 wherein said reversal film has a dissolution rate of 0.02 nm/sec to 2 nm/sec when etched with a 2.38 wt % aqueous solution of tetramethylammonium hydroxide (TMAH).

10. The process of claim 3 wherein the chemically amplified positive resist composition comprises a component capable of generating an acid in response to the heat in the step of exposing to radiation or heating the positive pattern.

11. The process of claim 10 wherein the component capable of generating an acid in response to the heat is the thermal acid generator added separately from the photoacid generator.

12. The process of claim 11 wherein said thermal acid generator has the general formula (P1a-2):

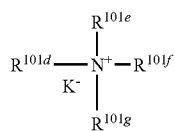

(P1a-2)

wherein K⁻ is a sulfonate having at least one α-position fluorinated, perfluoroalkylimidate or perfluoroalkylmethidate, $R^{101d}$, $R^{101e}$, $R^{101f}$, and $R^{101g}$ are each independently hydrogen, a straight, branched or cyclic alkyl, alkenyl, oxoalkyl or oxoalkenyl group of 1 to 12 carbon atoms, an aryl group of 6 to 20 carbon atoms, or an aralkyl or aryloxoalkyl group of 7 to 12 carbon atoms, in which some or all hydrogen atoms may be substituted by alkoxy groups, or $R^{101d}$ and $R^{101e}$, or $R^{101d}$, $R^{101e}$ and $R^{101f}$ may bond together to form a ring with the nitrogen atom to which they are attached, and each of $R^{101d}$ and $R^{101e}$, or $R^{101d}$, $R^{101e}$ and $R^{101f}$ is an alkylene group of 3 to 10 carbon atoms or a group forming a hetero-aromatic ring having the nitrogen atom therein when they form a ring.

13. The process of claim 1 wherein in said chemically amplified positive resist composition, the resin comprises recurring units having an electrophilicity structure and recurring units having an acid labile group which is eliminatable with acid.

14. The process of claim 1 wherein in said chemically amplified positive resist composition, the resin comprises recurring units having a lactone ring and recurring units having an acid labile group which is eliminatable with acid.

15. The process of claim 14 wherein
in said chemically amplified positive resist composition, the resin comprises recurring units having a 7-oxanorbornane ring and recurring units having an acid labile group which is eliminatable with acid, and
the step of exposing to radiation or heating the positive pattern includes acid generation in and heat application to the positive pattern whereby elimination of acid labile groups and crosslinking of the resin simultaneously take place.

16. The process of claim 15 wherein the recurring units having a 7-oxanorbornane ring are recurring units (a) having the general formula (1):

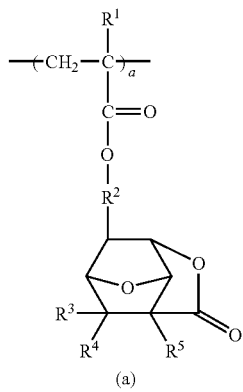

(1)

wherein $R^1$ is hydrogen or methyl, $R^2$ is a single bond or a straight, branched or cyclic $C_1$-$C_6$ alkylene group which may have an ether or ester group, and which has a primary or secondary carbon atom through which it is linked to the ester group in the formula, $R^3$, $R^4$, and $R^5$ are each independently hydrogen or a straight, branched or cyclic $C_1$-$C_6$ alkyl group, and "a" is a number in the range: 0<a<1.0.

17. The process of claim 14 wherein the recurring units having an acid labile group which is eliminatable with acid are recurring units (b) having the general formula (b):

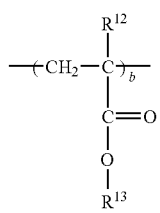

(b)

wherein $R^{12}$ is hydrogen or methyl, $R^{13}$ is an acid labile group, and b is a number in the range: 0<b≦0.8.

18. The process of claim 17 wherein the acid labile group of $R^{13}$ is an acid labile group of alicyclic structure which is eliminatable with acid.

19. The process of claim 1 wherein the positive pattern comprises a dot pattern, and the pattern resulting from positive/negative reversal comprises a hole pattern.

20. A process for forming a pattern by way of positive/negative reversal, comprising the steps of:
coating a chemically amplified positive resist composition onto a processable substrate, said resist composition comprising a resin comprising recurring units having acid labile groups which are eliminatable with acid, a photoacid generator capable of generating an acid upon exposure to high-energy radiation and a solvent, and heat drying to form a resist film,
coating a protective film-forming composition onto the resist film, and heating to remove the solvent to form a protective film,
exposing the resist film to high-energy radiation in a pattern of exposed and unexposed areas from a projection lens, while water or a transparent liquid having a refractive index of at least 1 intervenes between the resist film and the projection lens, post-exposure heating for causing the acid generated by the acid generator upon exposure to act on the acid labile groups on the resin whereby the acid labile groups on the resin in the exposed area undergo elimination reaction, and developing the exposed resist film with an alkaline developer to form a positive pattern, treating the positive pattern so as to eliminate the acid labile groups on the resin in the positive pattern resulting from the previous step, and to induce crosslinking in the resin to such an extent that the resin does not lose solubility in an alkaline wet etchant, for thereby endowing the positive pattern with resistance to an organic solvent to be used in a reversal film-forming composition, coating a reversal film-forming composition thereon to form a reversal film, and applying an alkaline wet etchant thereto for dissolving away the positive pattern.

21. The process of claim 20 wherein said protective film-forming composition is based on a copolymer comprising amino-containing recurring units.

22. The process of claim 20 wherein said protective film-forming composition further comprises an amine compound.

\* \* \* \* \*